United States Patent
Inoue et al.

(10) Patent No.: US 9,641,155 B2
(45) Date of Patent: May 2, 2017

(54) DUPLEXER

(71) Applicant: TAIYO YUDEN CO., LTD., Tokyo (JP)

(72) Inventors: Shogo Inoue, Tokyo (JP); Hiroshi Nakamura, Tokyo (JP)

(73) Assignee: TAIYO YUDEN CO., LTD., Tokyo (JP)

(*) Notice: Subject to any disclaimer, the term of this patent is extended or adjusted under 35 U.S.C. 154(b) by 227 days.

(21) Appl. No.: 14/565,093

(22) Filed: Dec. 9, 2014

(65) Prior Publication Data

US 2015/0084716 A1 Mar. 26, 2015

Related U.S. Application Data

(62) Division of application No. 13/344,265, filed on Jan. 5, 2012, now Pat. No. 9,136,823.

(30) Foreign Application Priority Data

Jan. 19, 2011 (JP) ................. 2011-009297

(51) Int. Cl.
*H03H 9/72* (2006.01)
*H03H 9/70* (2006.01)
(Continued)

(52) U.S. Cl.
CPC ............ *H03H 9/725* (2013.01); *H03H 9/706* (2013.01); *H03H 9/0023* (2013.01);
(Continued)

(58) Field of Classification Search
CPC ...... H03H 9/706; H03H 9/725; H03H 9/0023; H03H 9/0071; H03H 9/0085;
(Continued)

(56) References Cited

U.S. PATENT DOCUMENTS 6,891,449 B2 * 5/2005 Takayama ............ H03H 9/6483
310/313 B
2001/0054941 A1 12/2001 Shibata et al.
(Continued)

FOREIGN PATENT DOCUMENTS

CN 1744433 A 3/2006
EP 1940022 A2 7/2008
(Continued)

OTHER PUBLICATIONS

Chinese Office Action dated Apr. 1, 2014, in a counterpart Chinese patent application No. 201210018279.7. (Cited in the parent U.S. Appl. No. 13/344,265.).
(Continued)

*Primary Examiner* — Robert Pascal
*Assistant Examiner* — Jorge Salazar, Jr.
(74) *Attorney, Agent, or Firm* — Chen Yoshimura LLP

(57) ABSTRACT

A duplexer includes a reception filter that is connected between a reception terminal and an antenna terminal and includes one or a plurality of series resonators that are acoustic wave resonators, and a transmission filter that is connected between a transmission terminal and the antenna terminal and includes one or a plurality of acoustic wave resonators, a resonance frequency of a first series resonator that is one of the one or the plurality of series resonators and is closest to the antenna terminal in the reception filter being higher than an upper limit frequency of a reception band of the reception filter.

15 Claims, 47 Drawing Sheets

(51) Int. Cl.
- *H03H 9/00* (2006.01)
- *H03H 9/02* (2006.01)
- *H03H 9/54* (2006.01)
- *H03H 9/58* (2006.01)
- *H03H 9/64* (2006.01)

(52) U.S. Cl.
CPC ......... *H03H 9/0071* (2013.01); *H03H 9/0085* (2013.01); *H03H 9/02669* (2013.01); *H03H 9/542* (2013.01); *H03H 9/585* (2013.01); *H03H 9/644* (2013.01); *H03H 9/6436* (2013.01); *H03H 9/6483* (2013.01); *H03H 9/6489* (2013.01)

(58) Field of Classification Search
CPC .... H03H 9/02669; H03H 9/542; H03H 9/585; H03H 9/6436; H03H 9/644; H03H 9/6483; H03H 9/6489
USPC ................................ 333/133, 187, 193–196
See application file for complete search history.

(56) References Cited

U.S. PATENT DOCUMENTS

| | | |
|---|---|---|
| 2003/0006859 A1 | 1/2003 | Taniguchi |
| 2004/0130411 A1 | 7/2004 | Beaudin et al. |
| 2004/0155730 A1 | 8/2004 | Iwamoto et al. |
| 2006/0028298 A1* | 2/2006 | Nakamura ........... H03H 9/0038 333/133 |
| 2006/0044079 A1 | 3/2006 | Nishizawa et al. |
| 2008/0055021 A1* | 3/2008 | Ueda ...................... H03H 9/562 333/189 |
| 2008/0150652 A1 | 6/2008 | Itou |
| 2009/0002096 A1 | 1/2009 | Nakamura et al. |
| 2010/0188166 A1 | 7/2010 | Hara et al. |
| 2011/0095845 A1 | 4/2011 | Fujiwara et al. |
| 2013/0154763 A1 | 6/2013 | Takamine |

FOREIGN PATENT DOCUMENTS

| | | |
|---|---|---|
| JP | 5-167388 A | 7/1993 |
| JP | 9-205343 A | 8/1997 |
| JP | 10-209807 A | 8/1998 |
| JP | H10-303698 A | 11/1998 |
| JP | 2002-237738 A | 8/2002 |
| JP | 2002-330054 A | 11/2002 |
| JP | 2003-249842 A | 9/2003 |
| JP | 2003-332884 A | 11/2003 |
| JP | 2006-74202 A | 3/2006 |
| JP | 2008-160562 A | 7/2008 |
| JP | 2010-21914 A | 1/2010 |
| JP | 2010-177770 A | 8/2010 |
| WO | 2009/147787 A1 | 12/2009 |
| WO | 2010/137648 A1 | 12/2010 |
| WO | 2012/032832 A1 | 3/2012 |

OTHER PUBLICATIONS

Japanese Office Action dated Mar. 24, 2015, in a counterpart Japanese patent application No. 2014-153174.
Japanese Office Action dated Jul. 14, 2015, in a counterpart Japanese patent application No. 2014-153174.

* cited by examiner

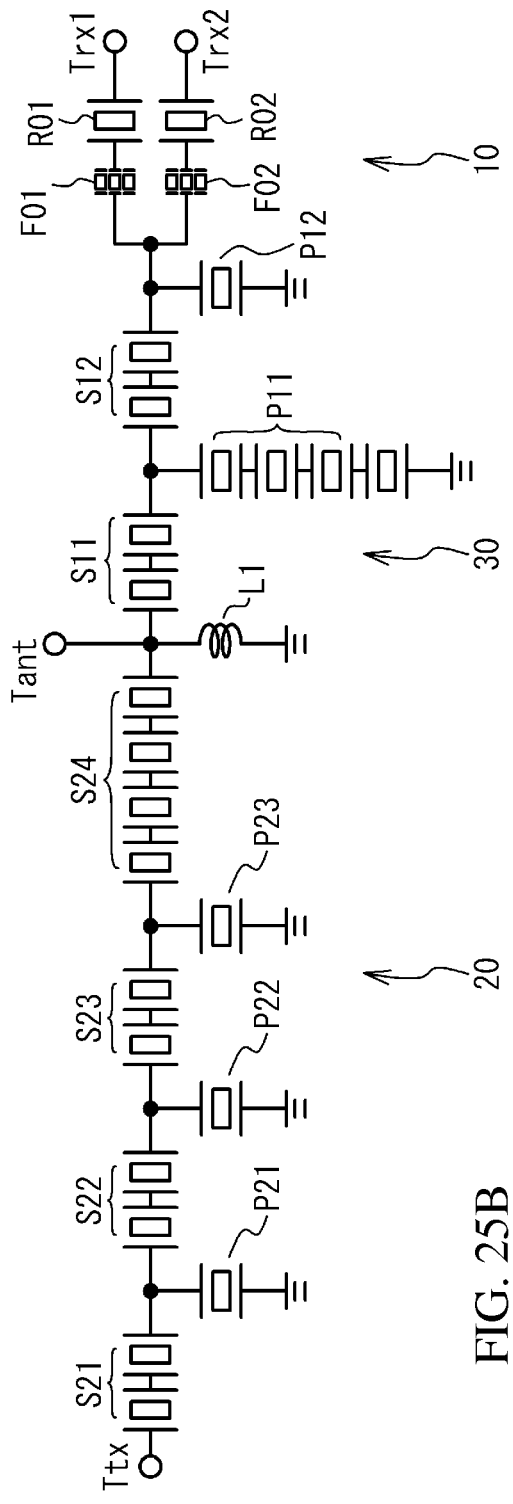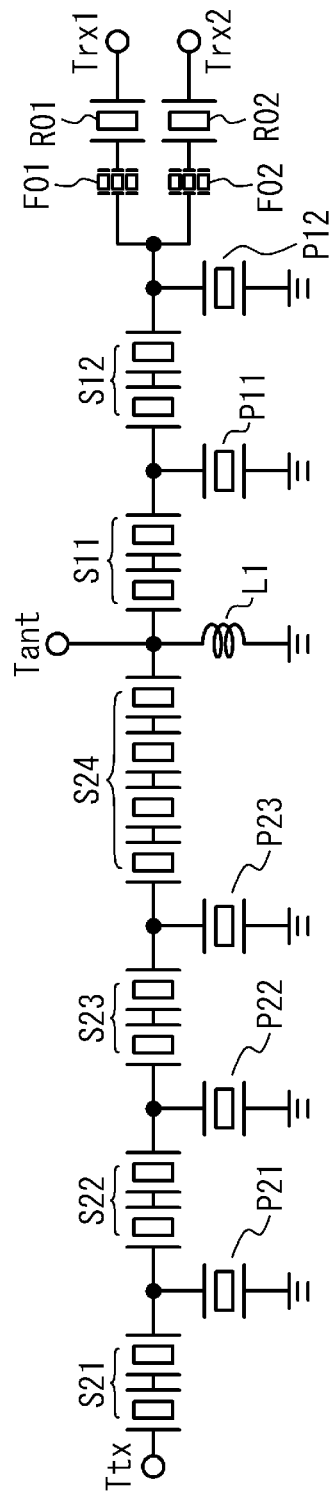
FIG. 25A
FIG. 25B

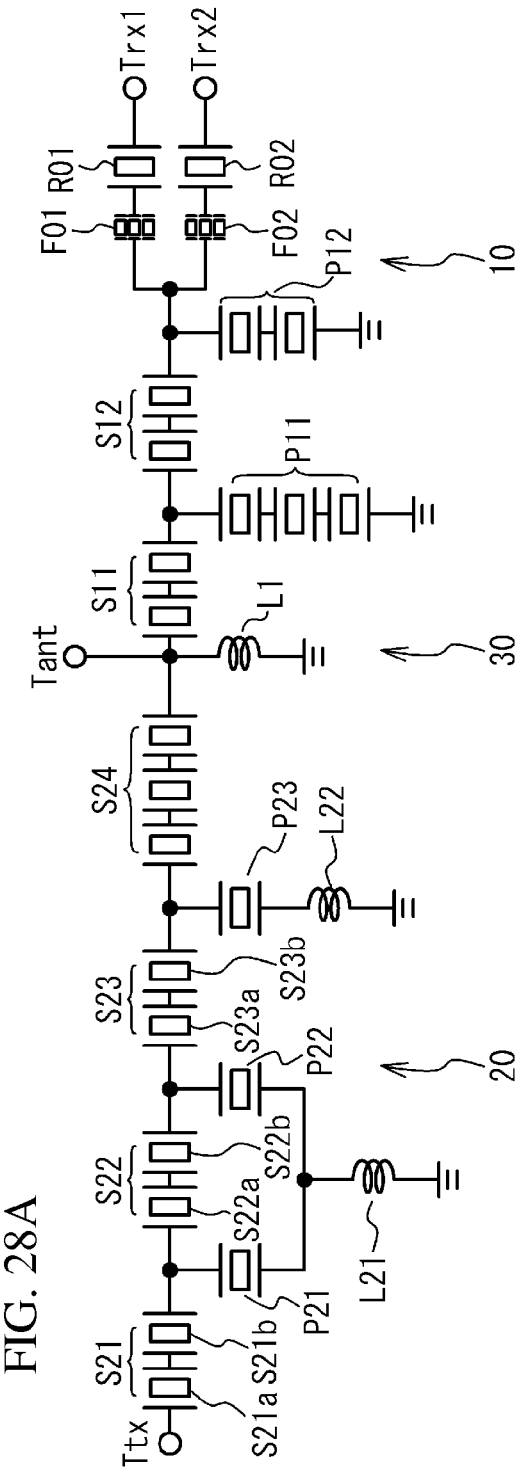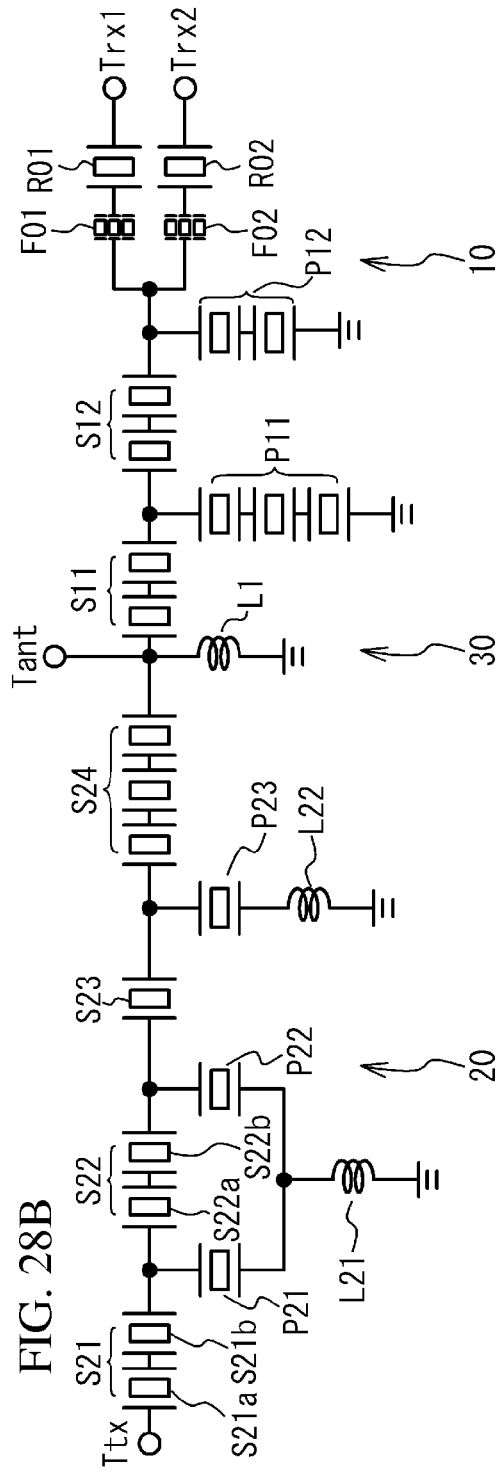
FIG. 28A
FIG. 28B

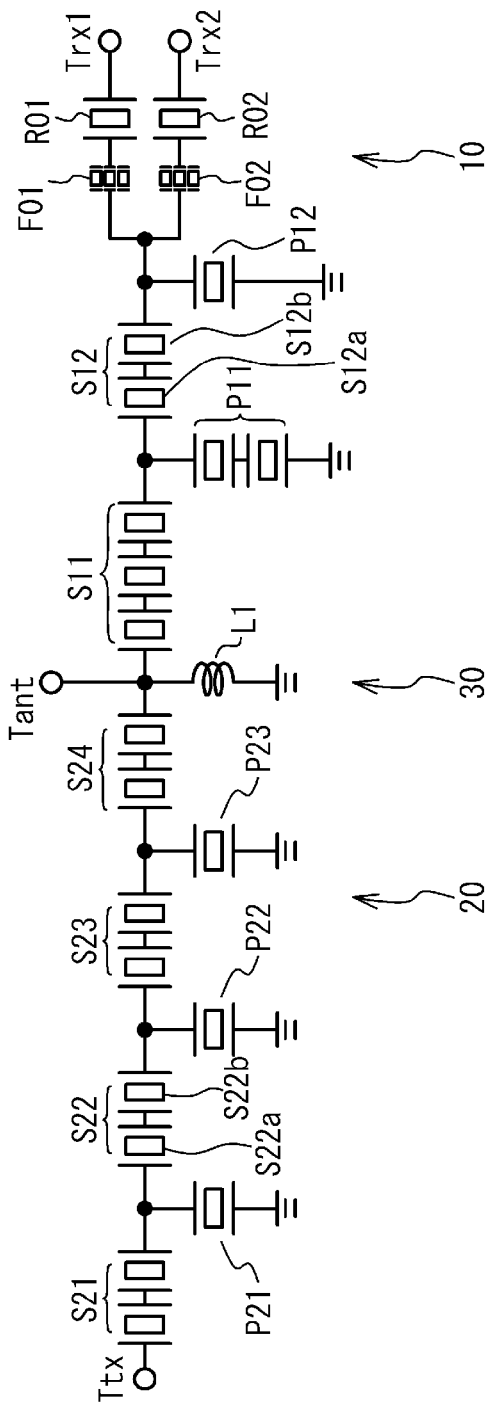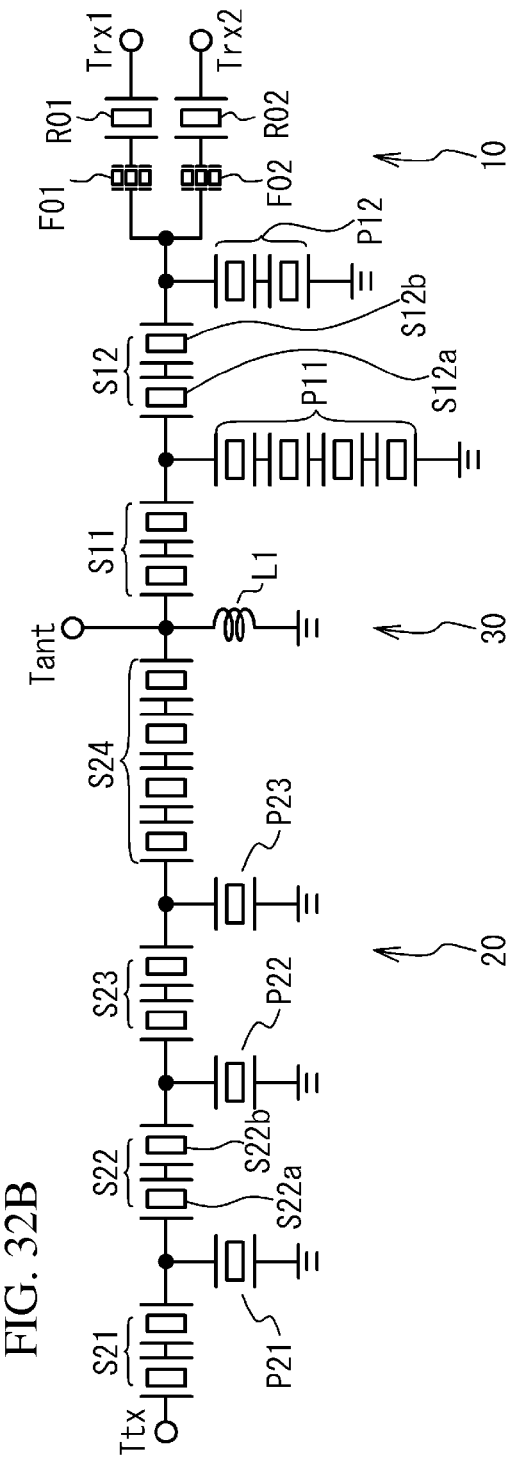

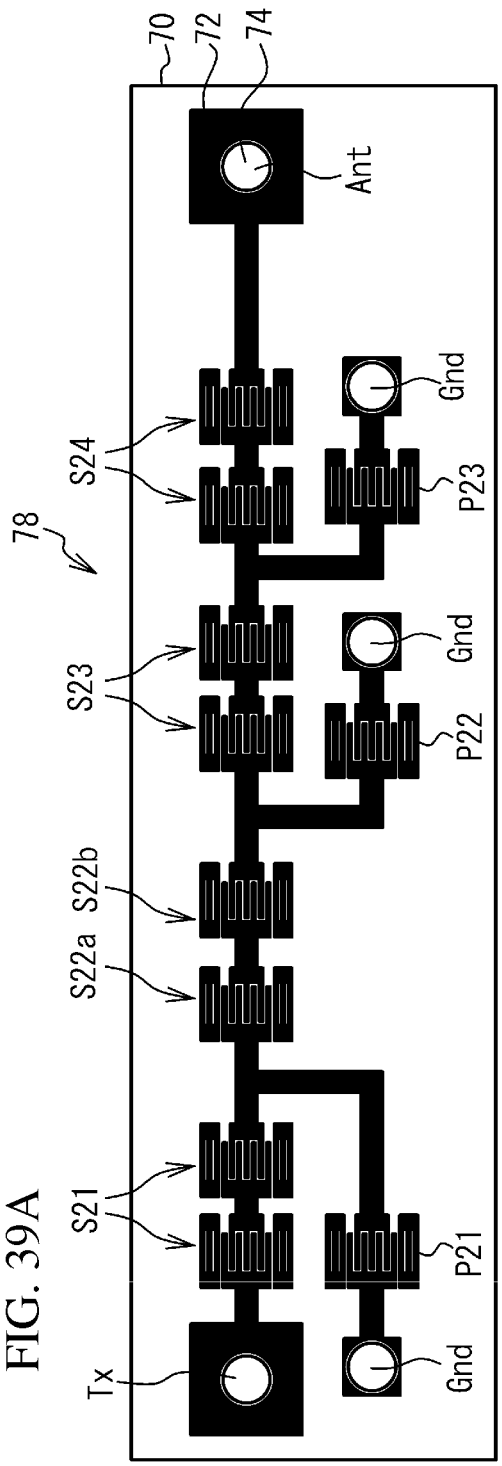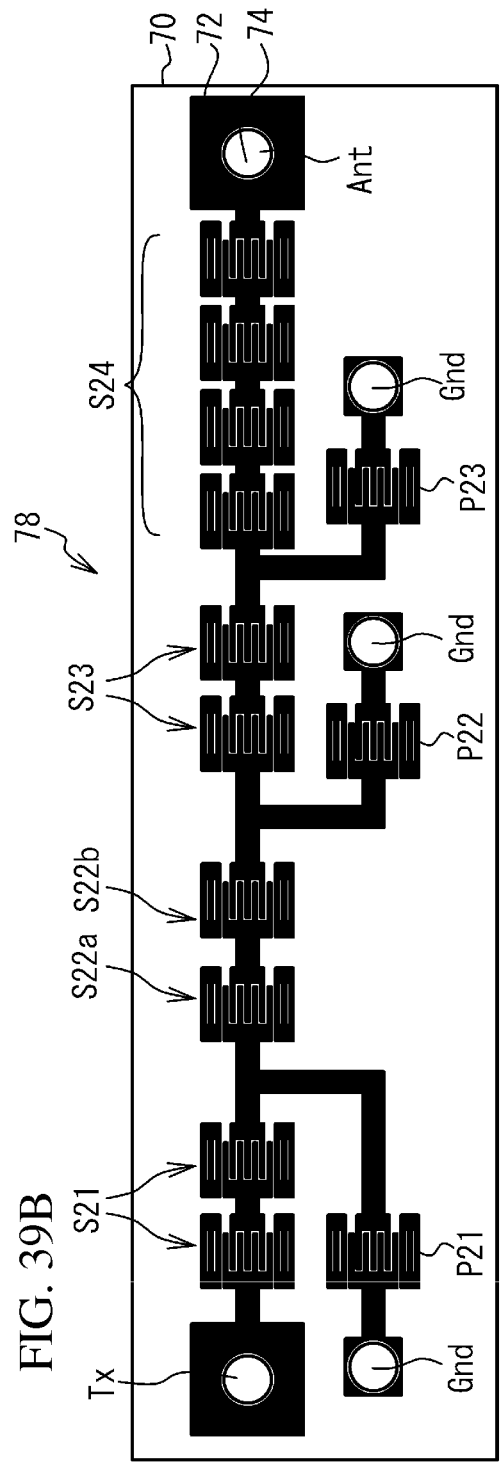

DUPLEXER

CROSS-REFERENCE TO RELATED APPLICATION

This application is a divisional of a pending application, U.S. Ser. No. 13/344,265 filed on Jan. 5, 2012, which is hereby incorporated by reference in its entirety. The parent application is based upon and claims the benefit of priority of the prior Japanese Patent Application No. 2011-009297, filed on Jan. 19, 2011, the entire contents of which are incorporated herein by reference.

FIELD

A certain aspect of the present invention relates to duplexers. Another aspect of the present invention relates to a duplexer having a reception filter and a transmission filter.

BACKGROUND

A mobile communication terminal of frequency division duplex (FDD) type uses a duplexer that simultaneously performs transmission and reception via a single antenna. The duplexer is equipped with a reception filter and a transmission filter. These filters are formed by acoustic wave resonators, for example. The acoustic wave resonators may be surface acoustic wave resonators, boundary acoustic wave resonators, or piezoelectric thin-film resonators. The piezoelectric thin-film resonators are also called film bulk acoustic resonators.

Japanese Patent Application Publication Nos. 2003-332884 and 2006-74202 describe a configuration directed to improving the power durability in which an acoustic wave resonator close to an input terminal is divided into parts connected in series with each other.

A poor linearity of the duplexer may degrade the receiver sensitivity of the communication equipment.

SUMMARY OF THE INVENTION

According to an aspect of the present invention, there is provided a duplexer having an improved linearity.

According to another aspect of the present invention, there is provided a duplexer including: a reception filter that is connected between a reception terminal and an antenna terminal and includes one or a plurality of series resonators that are acoustic wave resonators; and a transmission filter that is connected between a transmission terminal and the antenna terminal and includes one or a plurality of acoustic wave resonators, a resonance frequency of a first series resonator that is one of the one or the plurality of series resonators and is closest to the antenna terminal in the reception filter being higher than an upper limit frequency of a reception band of the reception filter.

BRIEF DESCRIPTION OF THE DRAWINGS

FIG. 25A is a circuit diagram of a duplexer used in a simulation of a third embodiment, and FIG. 25B is a circuit diagram of a duplexer in which a parallel resonator P11 is not divided;

FIG. 28A is a circuit diagram of a duplexer used in a simulation of a fourth embodiment, and FIG. 28B is a circuit diagram of a duplexer in which a series resonator S23 is not divided;

FIG. 30 is a diagram of a pass characteristic of the transmission filter, and a pass characteristic of a series resonator S23a;

FIG. 32A is a circuit diagram of a duplexer in accordance with a comparative example, and FIG. 32B is a circuit diagram of a duplexer in accordance with a fifth embodiment;

FIGS. 39A and 39B are plan views of transmission filter chips of the comparative example and the fifth embodiment, respectively;

DETAILED DESCRIPTION

Figure 1:
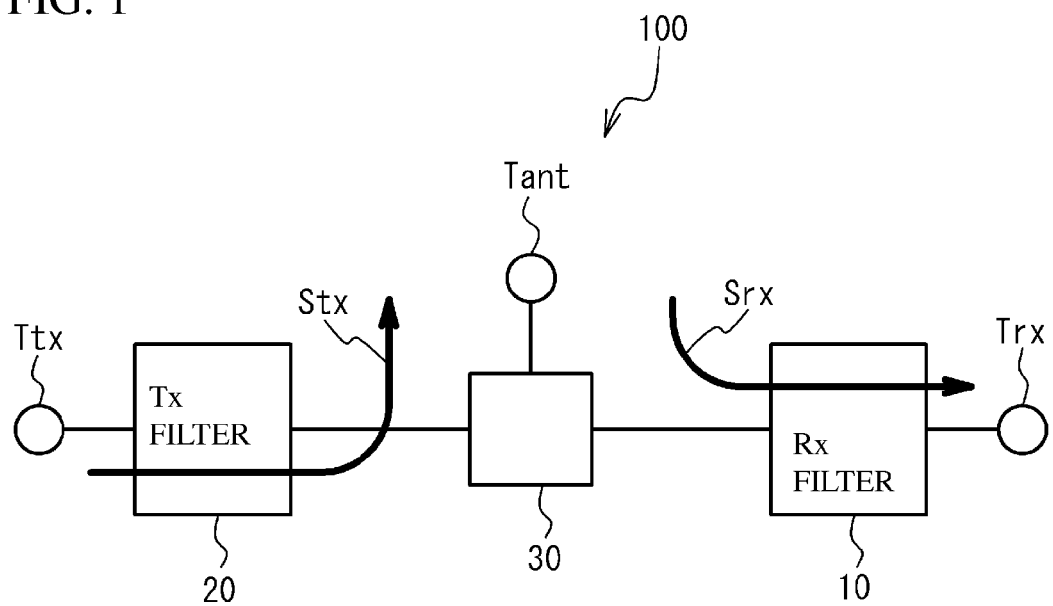
FIG. 1 is a block diagram of an exemplary duplexer.

A description is now given of a duplexer used in embodiments described below. FIG. 1 is a block diagram of an exemplary duplexer. Referring to FIG. 1, a duplexer 100 includes a reception (Rx) filter 10, a transmission (Tx) filter 20, and a matching circuit 30. The reception filter 10 is connected between an antenna terminal Tant and a reception terminal Trx. The transmission filter 20 is connected between the antenna terminal Tant and a transmission terminal Ttx. The matching circuit 30 is connected between at least one of the reception filter 10 and the transmission filter 20 and the antenna terminal Tant.

The transmission filter 20 passes signals that are included in signals applied to the transmission terminal Ttx and are located in a transmission band, as a transmission signal Stx, and attenuates the remaining signals. The reception filer 10 passes signals that are included in signals received via the antenna terminal Tant and are located in a reception band, as a reception signal Srx, and attenuates the remaining signals. The matching circuit 30 matches the impedance of the antenna terminal Tant in the transmission and reception bands.

Figure 2:
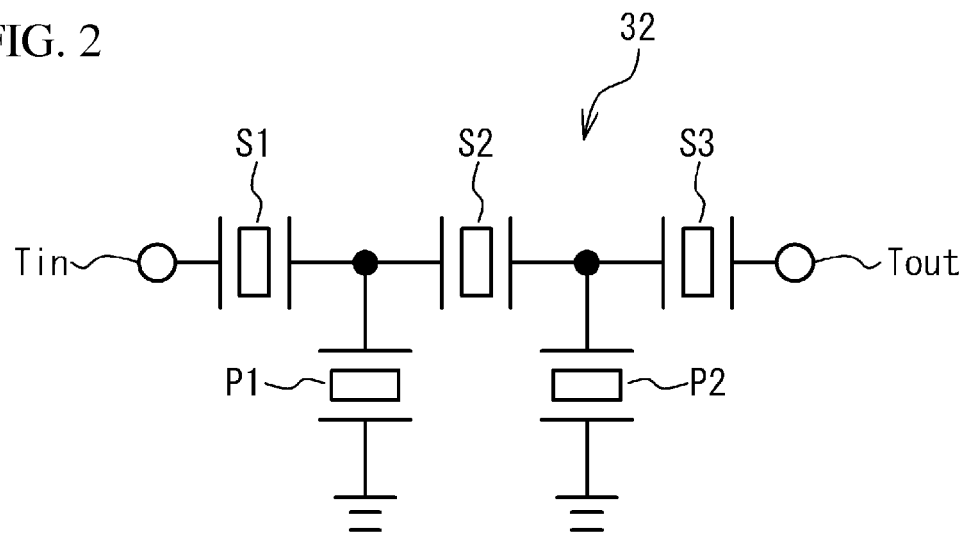
FIG. 2 is a circuit diagram of an exemplary ladder type filter.

Next, an exemplary filter used in the duplexers of the embodiments is described. FIG. 2 is a circuit diagram of a ladder type filter. Referring to FIG. 2, a ladder type filter 32 includes one or a plurality of series resonators S1~S3 and one or a plurality of parallel resonators P1~P2. The series resonators S1~S3 are connected in series with each other between an input terminal Tin and an output terminal Tout. The parallel resonators P1~P2 are connected in parallel with each other between the input terminal Tin and the output terminal Tout. The ladder type filter 32 may be used as at least one of the reception filter 10 and the transmission filter 20 of the duplexer 100.

Figure 3:
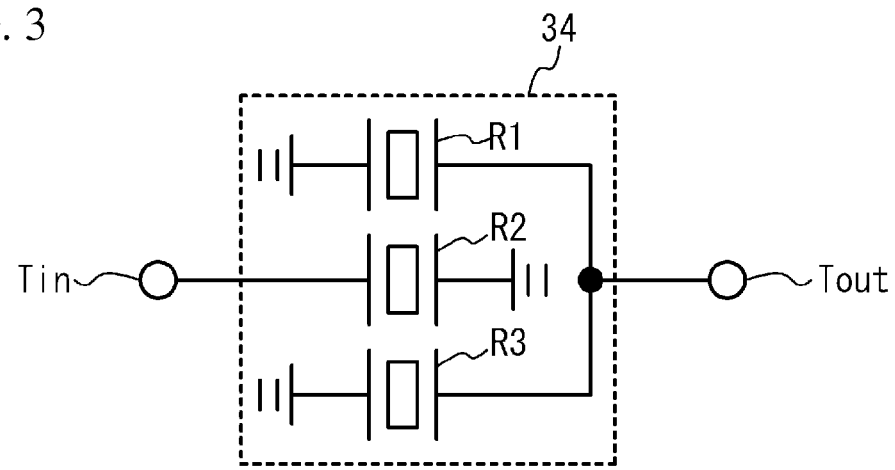
FIG. 3 is a circuit diagram of an exemplary multimode filter.

FIG. 3 is a circuit diagram of an exemplary multimode filter. Referring to FIG. 3, a multimode filter 34 includes resonators R1~R3. The resonators R1~R3 are arranged in a direction in which acoustic waves are propagated. One end of the reflector R2 is connected to the input terminal Tin, and the other end is grounded. One end of each of the resonators R1 and R3 is connected to the output terminal Tout, and the other end thereof is grounded. The multimode filter 34 may be used as at least one of the reception filter 10 and the transmission filter 20 of the duplexer 100.

Figure 4:
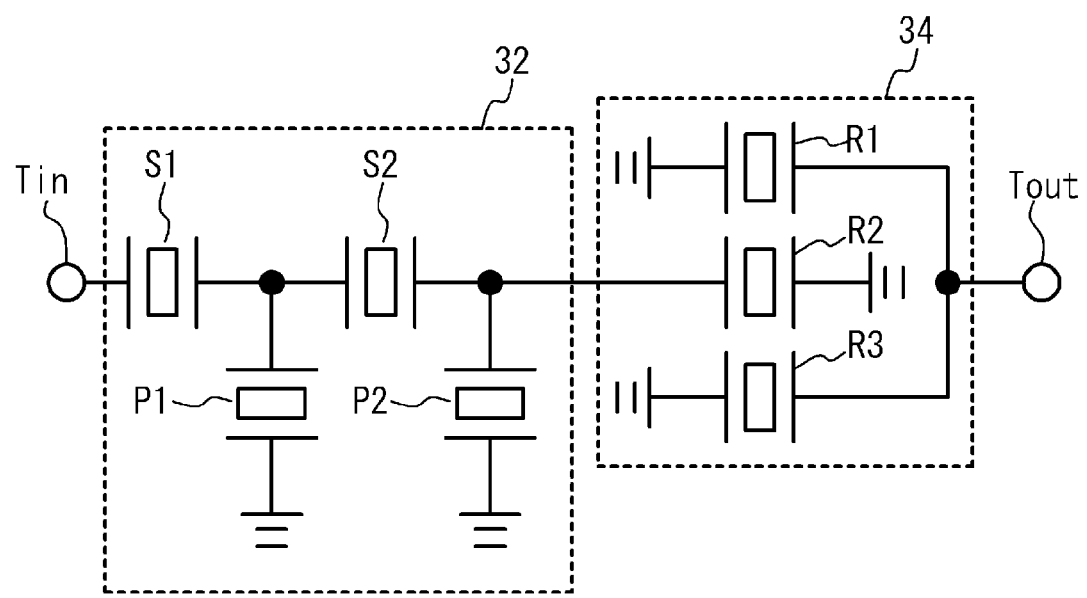
FIG. 4 is a circuit diagram of an exemplary filter in which a ladder type filter and a multimode filter are combined.

FIG. 4 is a circuit diagram of a filter having a combination of a ladder type filter and a multimode filter. Referring to FIG. 4, the ladder type filter 32 and the multimode filter 34 are connected between the input terminal Tin and the output terminal Tout. The ladder type filter 32 is composed of the series resonators S1~S2 and the parallel resonators P1~P2. The multimode filter 34 is composed of resonators R1~R3. The filter illustrated in FIG. 4 may be used as at least one of the reception filter 10 and the transmission filter 20 of the duplexer 100.

Figure 5:
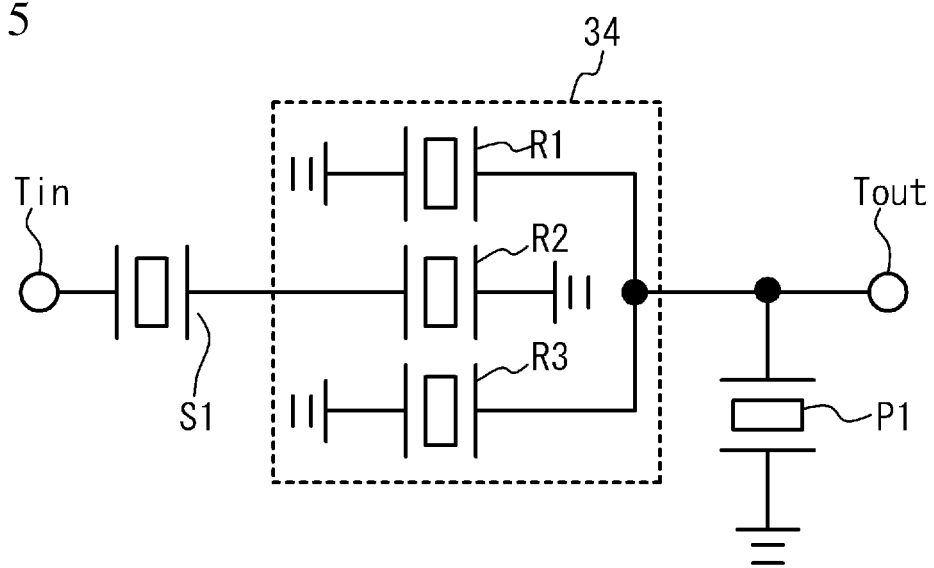
FIG. 5 is a circuit diagram of an exemplary filter in which a multimode filter and a resonator are combined.

FIG. 5 is a circuit diagram of a filter having a combination of a multimode filter and a resonator. Referring to FIG. 5, the series resonator S1 and the multimode filter 34 are connected between the input terminal Tin and the output terminal Tout in series, and the parallel resonator P1 is connected in parallel. The filter illustrated in FIG. 5 may be used as at least one of the reception filter 10 and the transmission filter 20 of the duplexer 100.

Figure 6A:
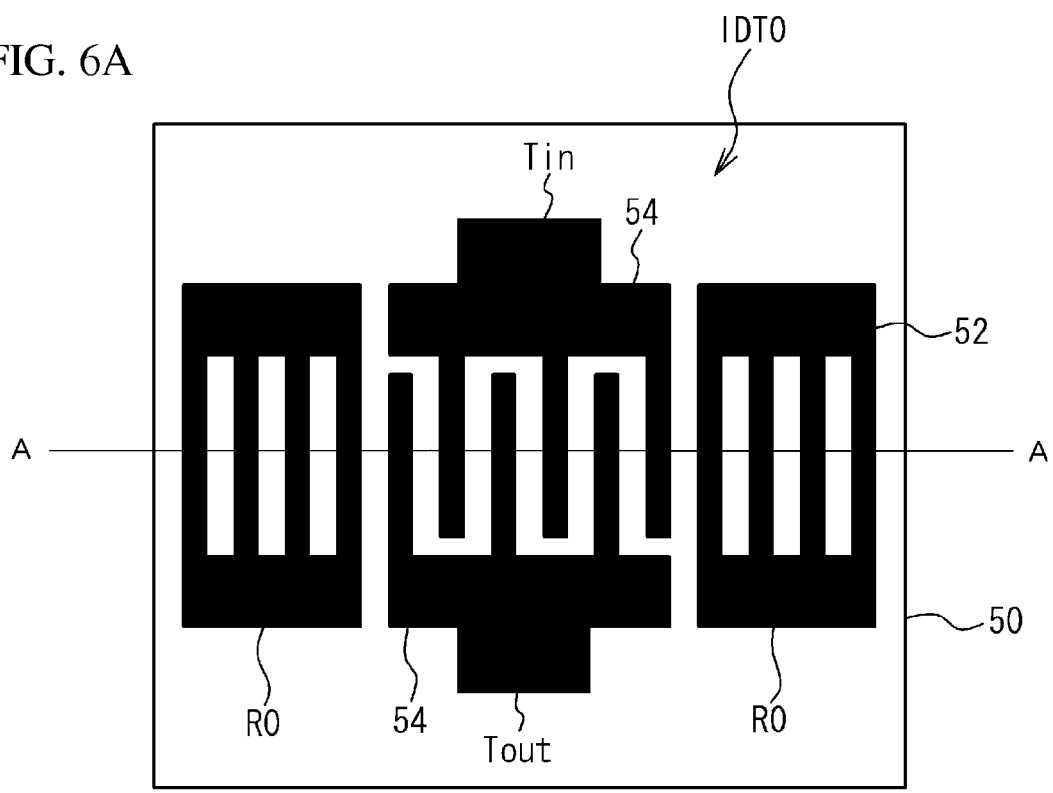
FIG. 6A is a plan view of a surface acoustic wave resonator.
Figure 6B:
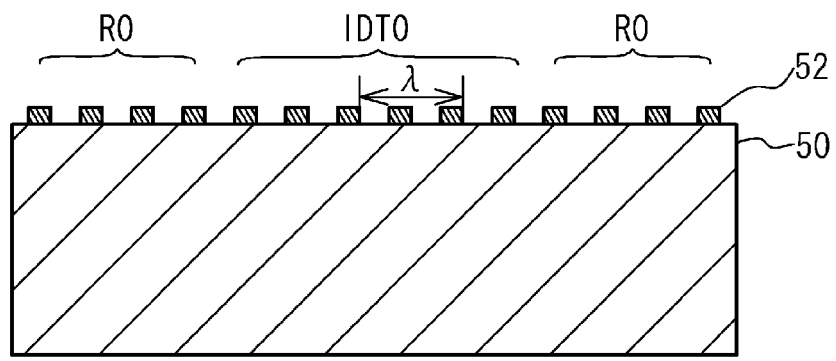
FIG. 6B is a cross-sectional view taken along a line A-A in FIG. 6A.

An exemplary resonator used in the filters is described. FIG. 6A is a plan view of a surface acoustic wave (SAW) resonator, and FIG. 6B is a cross-sectional view taken along a line A-A in FIG. 6A. Referring to FIGS. 6A and 6B, a metal film 52 made of, for example, aluminum or copper, is formed on a piezoelectric substrate 50 made of, for example, lithium tantalate or a lithium niobate. The metal film 52 forms reflectors R0, an interdigital transducer (IDT) IDT0, the input terminal Tin and the output terminal Tout. The IDT0 has two comb-like electrodes 54, which are respectively connected to the input terminal Tin and the output terminal Tout. The input terminal Tin and the output terminal Tout are pads, for example. The reflectors R0 are arranged at both sides of IDT0 in the propagation direction. The comb-like electrodes 54 and the reflectors R0 have fingers arranged at intervals corresponding to the wavelength λ of the acoustic wave. The acoustic waves excited by IDT0 are reflected by the reflectors R0. Thus, the SAW resonator resonates at a frequency corresponding to the wavelength λ of the SAW.

Figure 7A:
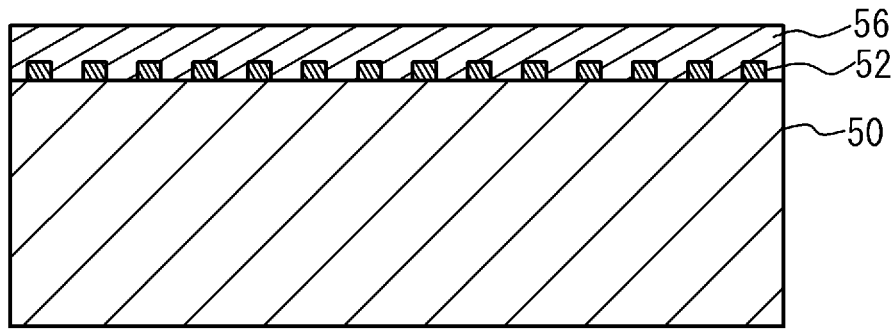
FIG. 7A is a cross-sectional view of a Love-wave resonator.
Figure 7B:
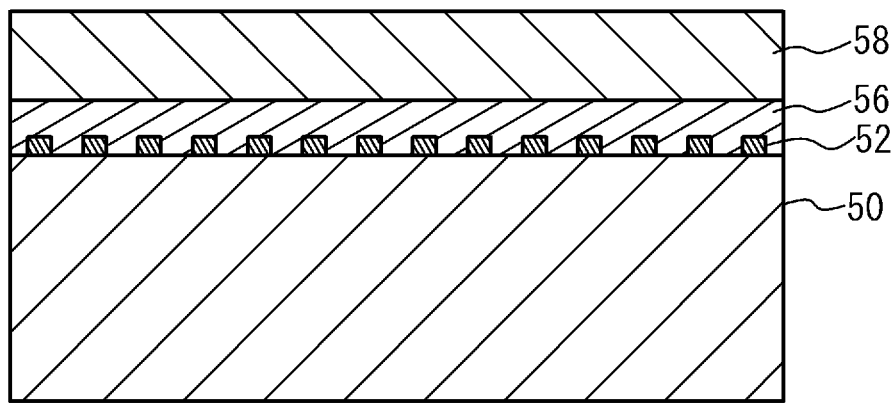
FIG. 7B is a cross-sectional view of a boundary acoustic wave resonator.

FIG. 7A is a cross-sectional view of a Love wave resonator, and FIG. 7B is a cross-sectional view of a boundary acoustic wave resonator. The plan view of the Love wave resonator and that of the boundary acoustic wave resonator are the same as illustrated in FIG. 6A, and a description thereof is omitted here. Referring to FIG. 7A, the Love wave resonator is configured to have a dielectric film 56 formed so as to cover the metal film 52. The dielectric film 56 may be a silicon oxide film, for example. As illustrated in FIG. 7B, the boundary acoustic wave resonator is configured to have the dielectric film 56 formed so as to cover the metal film 52. Further, a dielectric film 58 is formed on the dielectric film 56. The dielectric film 58 is an aluminum oxide film, for example. Preferably, the sonic velocity of the dielectric film 58 is faster than that of the dielectric film 56 in order to confine the acoustic wave within the dielectric film 56.

Figure 8A:
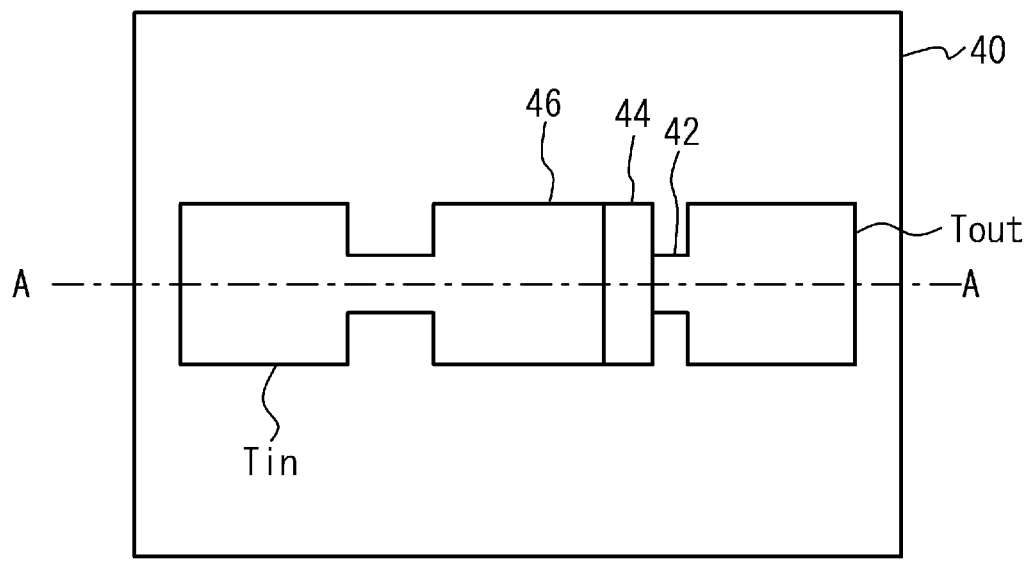
FIG. 8A is a plan view of a piezoelectric thin-film resonator.
Figure 8B:
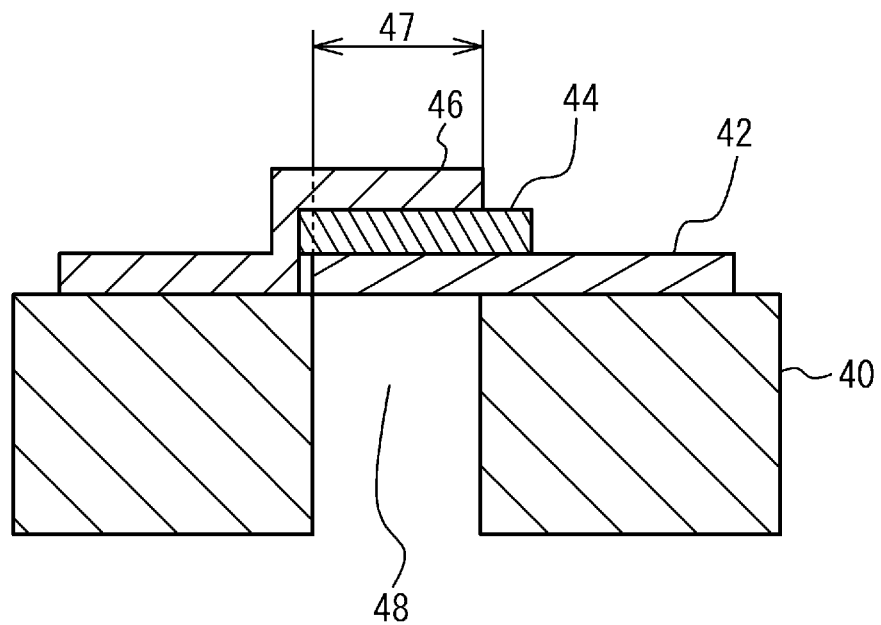
FIG. 8B is a cross-sectional view taken along a line A-A in FIG. 8A.

FIG. 8A is a plan view of a piezoelectric thin-film resonator, and FIG. 8B is a cross-sectional view taken along a line A-A depicted in FIG. 8A. Referring to FIGS. 8A and 8B, a piezoelectric thin-film resonator includes a lower electrode 42, a piezoelectric film 44 made of aluminum nitride, for example, and an upper electrode 46, which are stacked in this order on a substrate 40 made of silicon, for example. An area in which the upper electrode 46 and the lower electrode 42 overlap each other through the piezoelectric film 44 is a resonance part 47. In the resonance part 47, an acoustic wave propagated vertically resonates, whereby a resonator is realized. A cavity 48 is formed in the substrate 40 and is located below the lower electrode 42. The cavity 48 may be replaced by an acoustic multilayer film that reflects the acoustic wave propagated vertically.

The resonators of the filters illustrated in FIGS. 2 through 5 may be at least one type of the SAW resonators, the Love resonators, the boundary acoustic wave resonators, and the piezoelectric thin-film resonators.

Figure 9A:
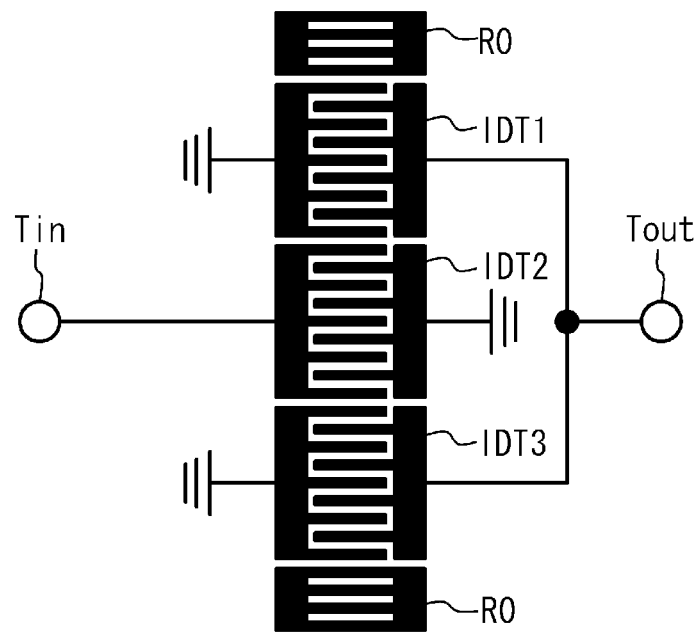
FIGS. 9A and 9B are diagrams of a multimode filter.
Figure 9B:
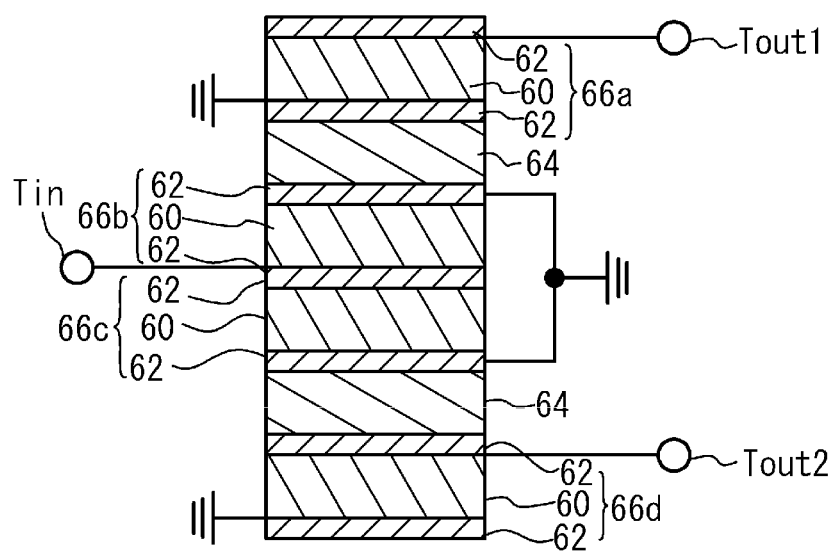

Now, an exemplary multimode filter is described. FIGS. 9A and 9B illustrate an exemplary multimode filter. FIG. 9A is a plan view of a multimode filter using the SAW, the Love wave and the boundary acoustic wave. A plurality of IDT1~IDT3 are arranged between the reflectors R0 in the direction in which the acoustic waves are propagated. One of a pair of comb-like electrodes of IDT2 is connected to the input terminal Tin, and the other comb-like electrode is grounded. One of a pair of comb-like electrodes of each of IDT1 and IDT3 is connected to the output terminal Tout, and the other comb-like electrode is grounded. The unbalanced type of output In FIG. 9A may be replaced by a balanced type of output.

FIG. 9B is a cross-sectional view of a multimode filter using the bulk wave. A plurality of piezoelectric thin-film resonators 66a~66d are stacked, each of which is composed of a piezoelectric film 60 and electrodes 62 between which the piezoelectric film 60 is sandwiched. A dielectric film 64 is provided between the piezoelectric thin-film resonators 66a and 66b. Another dielectric film 64 is provided between the piezoelectric thin-film resonators 66c and 66d. The lower electrode of the piezoelectric thin-film resonator 66b and the upper electrode of the piezoelectric thin-film resonator 66c are commonly provided. The upper electrode of the resonator 66a is connected to an output terminal Tout1, and the lower electrode thereof is grounded. The upper electrode of the resonator 66b is grounded, and the lower electrode thereof is connected to the input terminal Tin. The upper electrode of the piezoelectric thin-film resonator 66c is connected to the input terminal Tin, and the lower electrode thereof is grounded. The upper electrode of the resonator 66d is connected to an output terminal Tout2, and the lower electrode thereof is grounded. The balanced type of output in FIG. 9B may be replaced by an unbalanced type of output.

Figure 10:
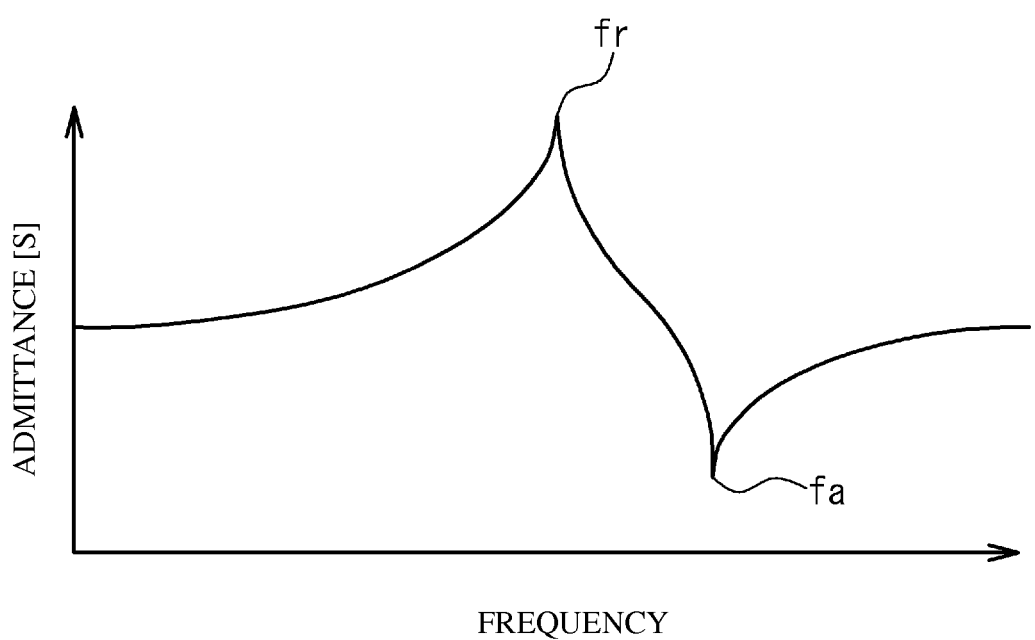
FIG. 10 is a diagram of admittance characteristics of a surface acoustic wave resonator, a Love-wave resonator, and a boundary acoustic wave resonator.

A description is now given of the operating principle of the ladder type filter. FIG. 10 is a graph of an admittance characteristic of the SAW resonator, Love resonator and boundary acoustic wave resonator. These resonators have an admittance characteristic of double resonance having a resonance frequency fr and an anti-resonance frequency fa.

Figure 11A:
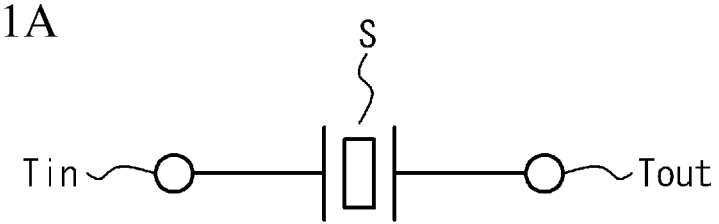
FIG. 11A is a circuit diagram of a series resonator S.
Figure 11B:
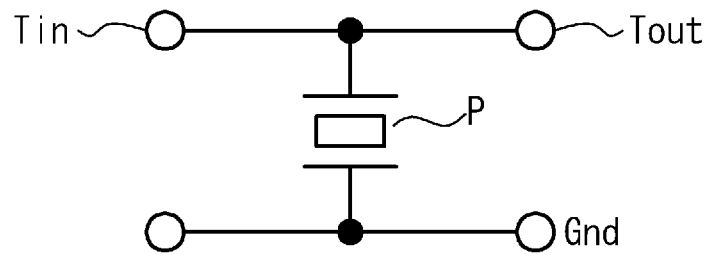
FIG. 11B is a circuit diagram of a parallel resonator P.
Figure 11C:
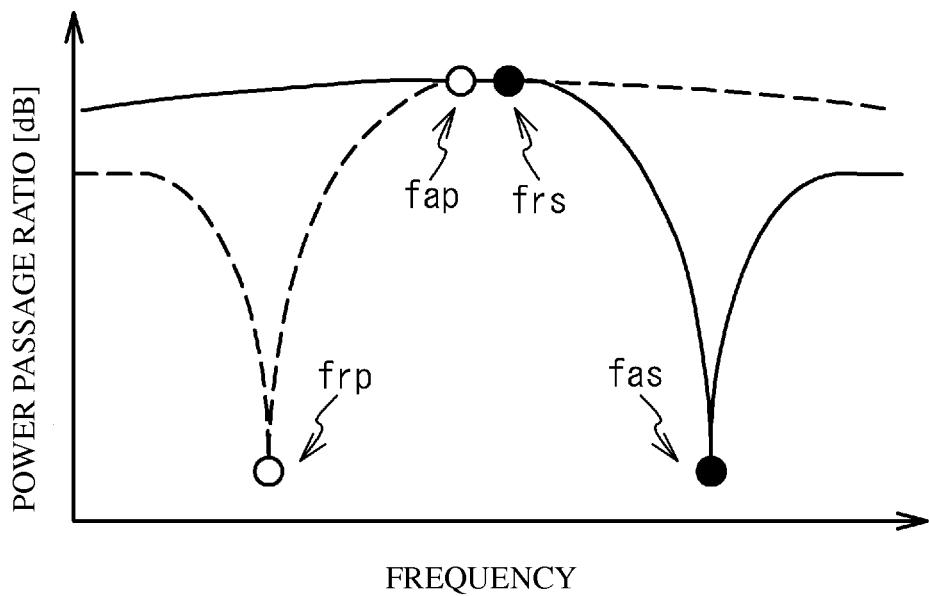
FIG. 11C is a diagram of pass characteristics of the series resonator and the parallel resonators.

FIG. 11A is a circuit diagram of a series resonator S, FIG. 11B is a circuit diagram of a parallel resonator P, and FIG. 11C is pass characteristics of the series resonator and the parallel resonator. Referring to FIG. 11A, an acoustic wave resonator having an admittance characteristic as illustrated in FIG. 10 is connected, as the series resonator S, in series between the input terminal Tin and the output terminal Tout. Referring to FIG. 11B, an acoustic wave resonator having an admittance characteristic as illustrated in FIG. 10 is connected, as the parallel resonator P, in parallel with the input terminal Tin and the output terminal Tout.

In FIG. 11C, the pass characteristic of the series resonator S is illustrated by a solid line, and that of the parallel resonator P is illustrated by a broken line. The series resonator S functions as a low-pass filter having transition frequencies between the resonance frequency frs and the anti-resonance frequency fas. The parallel resonator P functions as a high-pass filter having transition frequencies between the resonance frequency frp and the anti-resonance frequency fap. It is designed to set the resonance frequency frs of the series resonator S and the anti-resonance frequency fap of the parallel resonator P approximately equal to each other. A bandpass filter may be configured by connecting the series resonator S an the parallel resonator P to form a single-stage ladder filter.

Figure 12A:
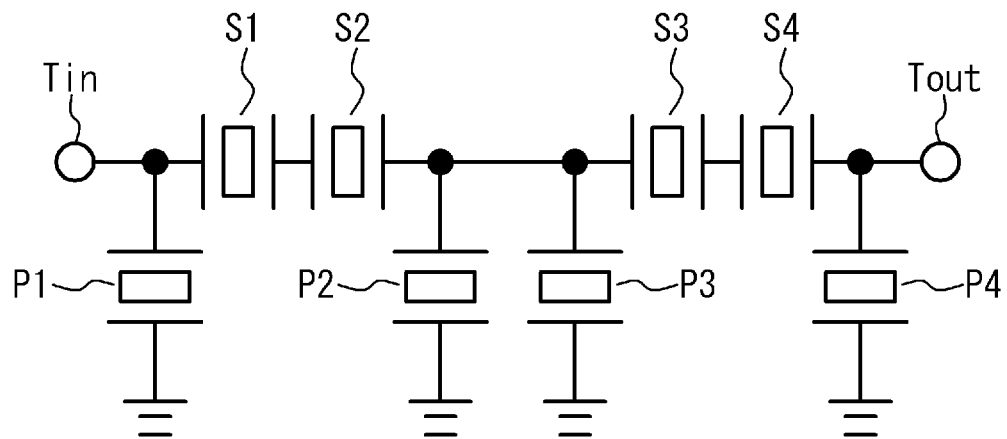
FIG. 12A is a circuit diagram of a ladder type filter.
Figure 12B:
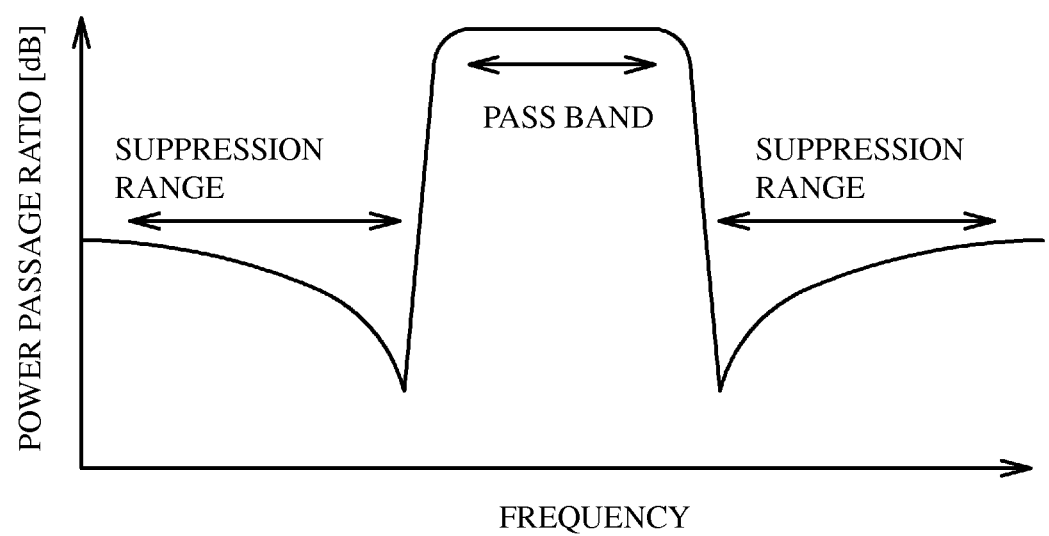
FIG. 12B is a diagram of a pass characteristic thereof.

FIG. 12A is a circuit diagram of a ladder type filter having a plurality of stages, and FIG. 12B is a frequency characteristic of this filter. As illustrated in FIG. 12A, the filter is configured to have a plurality of stages, each of which is composed of one series resonator and one parallel resonator. The filter thus configured functions as a bandpass filter that has one pass band and suppression ranges at both sides of the pass band.

Figure 13A:
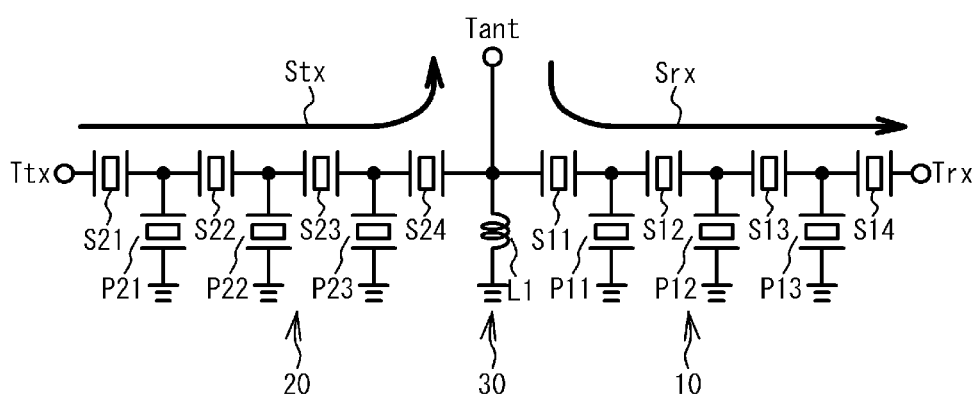
FIG. 13A is a circuit diagram of a duplexer.
Figure 13B:
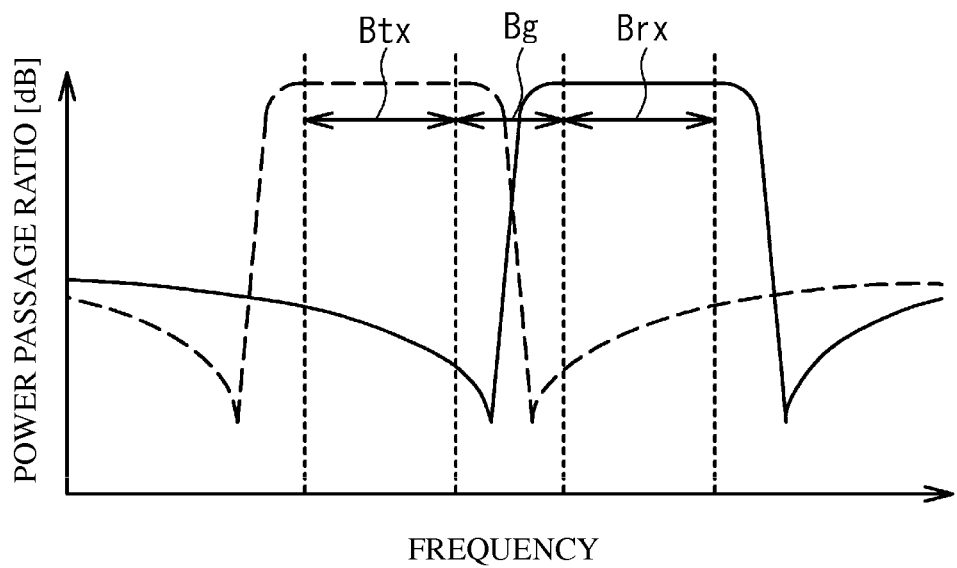
FIG. 13B is a diagram of a pass characteristic thereof.

Now, a duplexer is described. FIG. 13A is a circuit diagram of an exemplary duplexer, and FIG. 13B is a pass characteristic of the duplexer. Referring to FIG. 13A, the duplexer has the reception filter 10 and the transmission filter 20, each of which is a ladder type filter. The reception filter 10 has series resonators S11~S14, and parallel resonators P11~P13. The transmission filter 20 has series resonators S21~S24 and parallel resonators P21~P23. The matching circuit 30 has an inductor L1 connected to the antenna terminal Tant and ground. The transmission signal Stx applied via the transmission terminal Ttx passes through the transmission filter 20 and is output to the antenna terminal Tant. The reception signal Srx received via the antenna terminal Tant passes through the reception filter 10 and is applied to the reception terminal Trx.

In FIG. 13B, a broken line indicates a pass characteristic of the transmission filter 20 in which a signal applied to the transmission terminal Ttx passes through the transmission filter 20 and is output to the antenna terminal Tant. A solid line indicates a pass characteristic of the reception filter 10 in which a signal received by the antenna terminal Tant passes through the reception filter 10 and is output to the reception terminal Trx. A reception band Brx and a transmission band Btx are determined so as to conform with the communication system. In the FDD system, the reception band Brx and the transmission band Btx are set so as to be different from each other. A spacing Bg between the reception band Brx and the transmission band Btx is a guard band. The passband of the reception filter 10 is designed to include the reception band Brx, and the passband of the transmission filter 20 is designed to include the transmission band Btx. The transmission band Btx is designed to be a suppression range of the reception filter 10. The reception band Brx is designed to be a suppression range of the transmission filter 20.

Figure 14A:
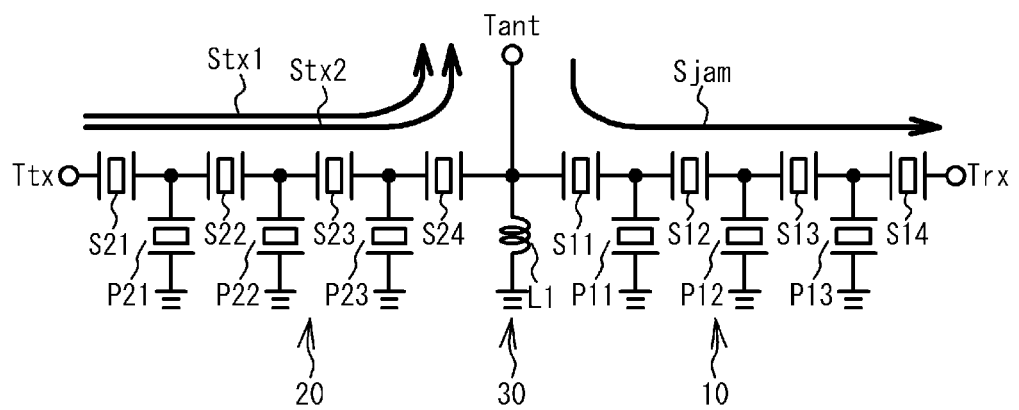
FIG. 14A is a circuit diagram of a duplexer.
Figure 14B:
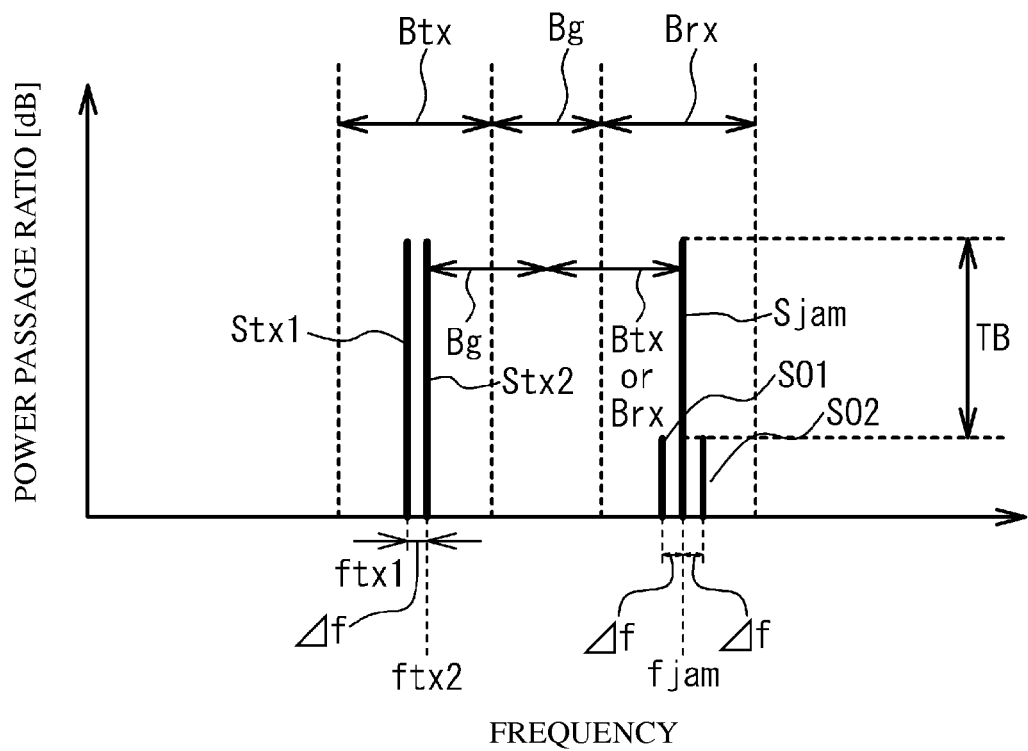
FIG. 14B is a diagram of spectra of signals that are output via a reception terminal.

A description is now given of a triple-beat test, which is a test for evaluating the linearity of the duplexer. FIG. 14A is a circuit diagram of a duplexer, and FIG. 14B is a diagram of signal spectra output via the reception terminal. Referring to FIG. 14A, the duplexer has the same configuration as that illustrated in FIG. 13A, and a description thereof is omitted here. Referring to FIG. 14B in addition to FIG. 14A, transmission signals Stx1 and Stx2 are applied to the transmission terminal Ttx. The frequencies of the transmission signals Stx1 and Stx2 are within the transmission band Btx, and are indicated as ftx1 and ftx2, respectively. The difference between the frequencies ftx1 and ftx2 is $\Delta f$, which may be 1 MHz, for example. The powers of the transmission signals Stx1 and Stx2 are +22 dBm, for example.

A jammer signal Sjam is input via the antenna terminal Tant. The frequency of the jammer signal Sjam is within the reception band Brx, and is denoted as fjam. The frequency fjam is set to a frequency defined by adding the guard band width Bg and the transmission band Btx (or the reception band Brx) to the frequency ftx2 of the transmission signal Stx2. The power of the jammer signal Sjam is −27 dBm, for example. In a simulation and measurement in the following embodiments, $\Delta f$ is 1 MHz, the powers of Stx1 and Stx2 are +22 dBm, and the power of the jammer signal Sjam is −27 dBm.

Under the above conditions, the signal spectra that are output via the reception terminal Trx are measured by a spectrum analyzer or the like, whereby spectrum characteristics illustrated in FIG. 14B are obtained. As illustrated in FIG. 14B, besides the transmission signals Stx1 and Stx2 and the jammer signal Sjam, non-linear signals S01 and S02 are observed near the jammer signal Sjam. The non-linearity of the duplexer results in the non-linear signals S01 and S02, which have frequencies fjam−$\Delta f$ and fjam+$\Delta f$, respectively.

A power ratio between the jammer signal Sjam and the non-linear signals S01 and S02 (power of S01 and S02/power of Sjam) is defined as a triple-beat value TB, and the unit thereof is dBc. As the triple-beat value TB is smaller, the non-linearity of the duplexer is smaller and the linearity thereof is larger. A small linearity of the duplexer degrades the receiver sensitivity of communication equipment using the duplexer. It is therefore required that the triple-beat value TB is small.

The measurement of the triple-beat values is carried out by simultaneously sweeping the transmission signals Stx1 and Stx2 and the jammer signal Sjam. The range of sweeping is the range of the reception band Brx. When the transmission band Btx and the reception band Brx have an identical width, the sweep is started from the lower limit frequency of the transmission band Btx at which the transmission signal Stx2 is located and also the lower limit frequency of the reception band Brx at which the jammer signal Sjam is located. Then, the sweep is ended at the upper limit frequency of the transmission band Btx at which the transmission signal Stx2 is located and also the upper limit frequency of the reception band Brx at which the jammer signal Sjam is located.

Figure 15:
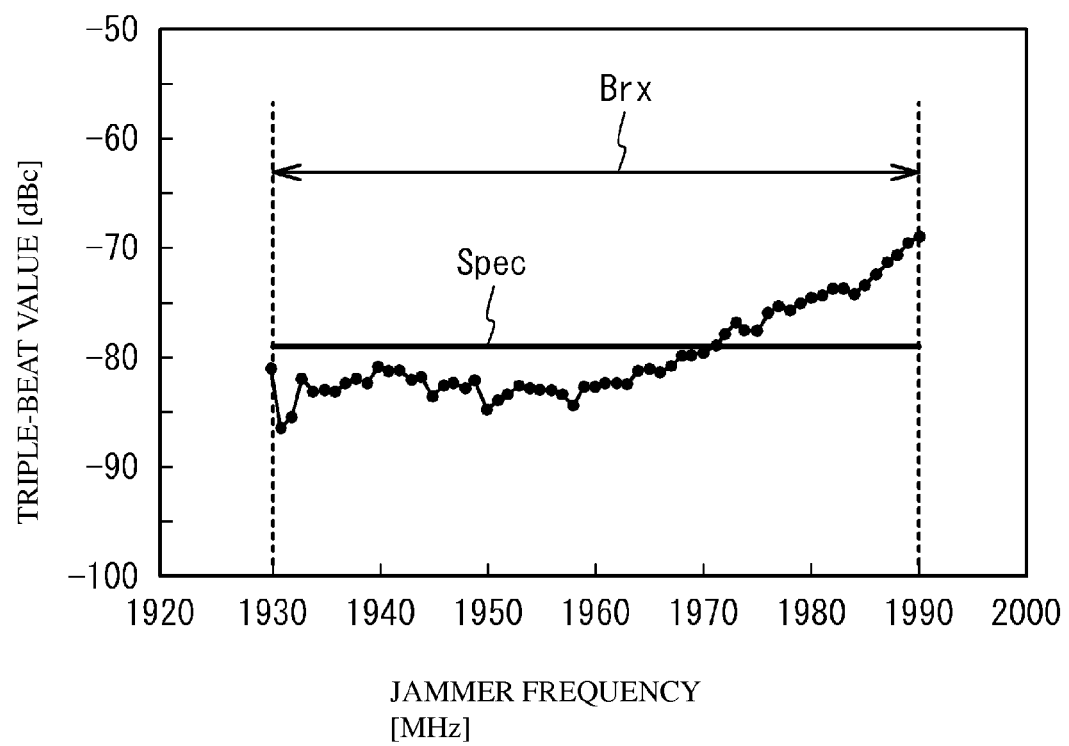
FIG. 15 is a diagram of measurement results of a triple-beat value.

FIG. 15 is a diagram of an exemplary result of measurement of the triple-beat value. As illustrated in FIG. 15, the jammer signal Sjam is swept within the reception band Brx, and the triple-beat value TB at each frequency is measured. In many cases, the specification for the triple-beat value Spec is set equal to or smaller than −79 dBc~−82 dBc. In FIG. 15, the specification for the triple-beat value Spec is −79 dBc. On the high-frequency side of the reception band Brx, the triple-beat values are larger than the specification for the triple-beat value Spec.

Figure 16:
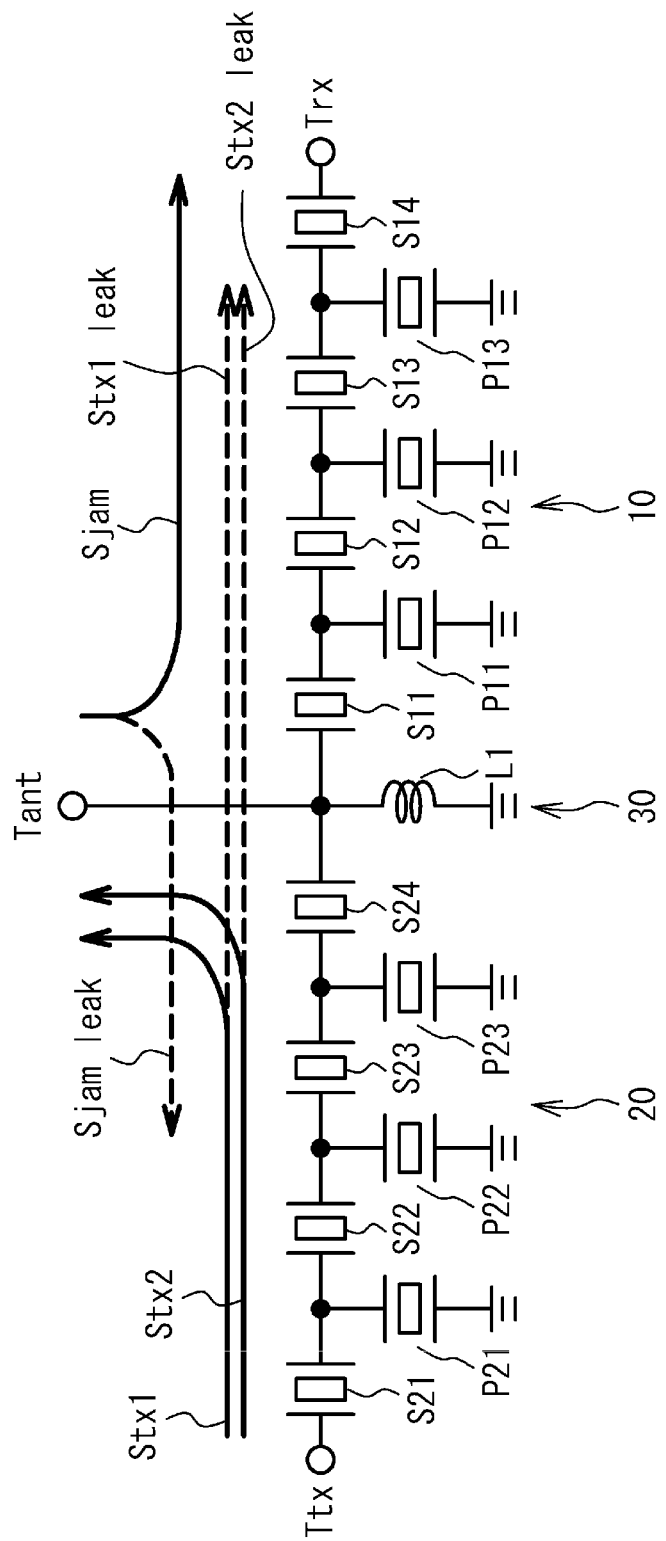
FIG. 16 is a circuit diagram of a duplexer.

Next, a description is given of a mechanism for generation of the non-linear signals S01 and S02. FIG. 16 is a circuit diagram of a duplexer, which has the same configuration as illustrated in FIG. 13, and a description thereof is omitted here. Referring to FIG. 16, ideally, all of the transmission signals Stx1 and Stx2 applied to the transmission terminal Ttx are output via the antenna terminal Tant, as indicated by arrows of solid lines. However, actually, leakage signals $Stx1_{leak}$ and $Stx2_{leak}$ flow in the reception filter 10, as indicated by arrows of broken lines. Ideally, all of the jammer signal that is input via the antenna terminal Tant is output via the reception terminal Trx, as indicated by an arrow of solid line. However, actually, a leakage signal $Sjam_{leak}$ flows in the transmission filter 20, as indicated by an arrow of broken line.

Therefore, during the triple-beat test, the transmission signals Stx1 and Stx2 and the jammer signal Sjam flow through each resonator of the duplexer. The three signals that flow through one resonator results in a non-linear signal. More particularly, a non-linear displacement is excited in one resonator wherein the non-linear displacement is proportional to the product of displacements of acoustic waves excited respectively when the transmission signals Stx1 and Stx2 and the jammer signal Sjam flow in the one resonator independently. The non-linear displacement induces the non-linear signal. Therefore, the non-linear signal generated in one resonator becomes larger as the acoustic waves excited by the transmission signals Stx1 and Stx2 and the jammer signal Sjam become larger.

Generally, the duplexers using acoustic wave filters have a lower linearity than duplexers having dielectric filters and may not satisfy the specification for the triple-beat value in many cases.

Embodiments of the duplexer having improvements in the non-linearity are described. In the following description, there are provided exemplary duplexers that conform with North America PCS (Personal Communications Services) in which the transmission band Btx is 1850 MHz~1910 MHz, the reception band Brx is 1930 MHz~1990 MHz. Embodiments described below are not limited to PCS but are applicable to other communication systems.

In order to perform a simulation in the following embodiments, the present inventors developed a simulator that simulates the triple-beat values of the duplexers using the surface acoustic wave filters. The developed simulator is based on the mode coupling theory. In the simulator, displacements of the surface acoustic waves respectively excited by the signals that flow in each resonator are measured, and non-linear displacements excited by these displacements are calculated, and non-linear signals generated are calculated.

First Embodiment

A first embodiment is an exemplary duplexer in which the resonance frequency of the series resonator in the reception filter 10 closest to the antenna terminal Tant is adjusted. From the results of analyzing the non-linear phenomenon of the duplexer by using the simulator, the inventors found out that the non-linear signal generated in the resonator in the reception filter 10 closest to the antenna terminal Tant is the largest in most cases.

The linearity of the resonator is enhanced by dividing the resonator into serial parts. It is required that there is little change of the impedance of the resonator (mainly, the electrostatic capacitance) before and after the resonator is divided.

Figure 17:
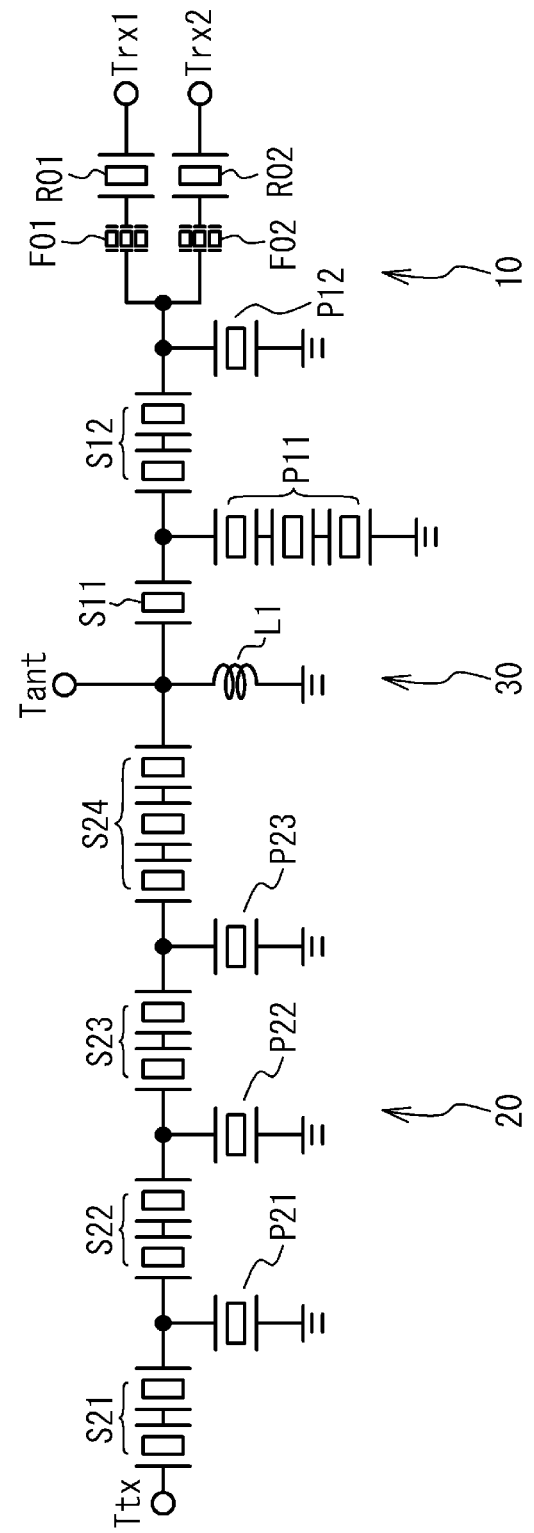
FIG. 17 is a circuit diagram in accordance with a first embodiment.

FIG. 17 is a circuit diagram of a duplexer in accordance with a first embodiment. Referring to FIG. 17, the present duplexer has the reception filter 10, the transmission filter 20 and the matching circuit 30. The reception filter 10 has two stages. The previous stage or first stage has a ladder type filter and the next stage or the second stage is a multimode filter. The ladder type filter composed of series resonators S11 and S12 and the parallel resonators P11 and P12. The series resonator S12 is divided into two in series with each other, and the parallel resonator P11 is divided into three in series with each other. Multimode filters F01 and F02 of the second stage are connected in parallel with each other. The multimode filters F01 and F02 are followed by resonators R01 and R02, respectively. Balanced output signals are output via reception terminals Trx1 and Trx2.

The transmission filter 20 is a ladder type filter, and is composed of series resonators S21~S24 and parallel resonators P21~P23. Each of the series resonators S21~S23 is divided into two in series, and the series resonator S24 is divided into three in series. The reason why the series resonators other than the series resonator S11 are divided into parts in series is that it is intended to reduce non-linear signals generated in the series resonators other than the series resonator S11 and to relatively emphasize the non-linear signal generated in the series resonator S11.

As illustrated in FIG. 11C, generally, the resonance frequency of the series resonator is set close to the center of the pass band. Therefore, the resonance frequency of the series resonator S11 is set to 1964 MHz close to the center of the reception band Brx.

Figure 18:
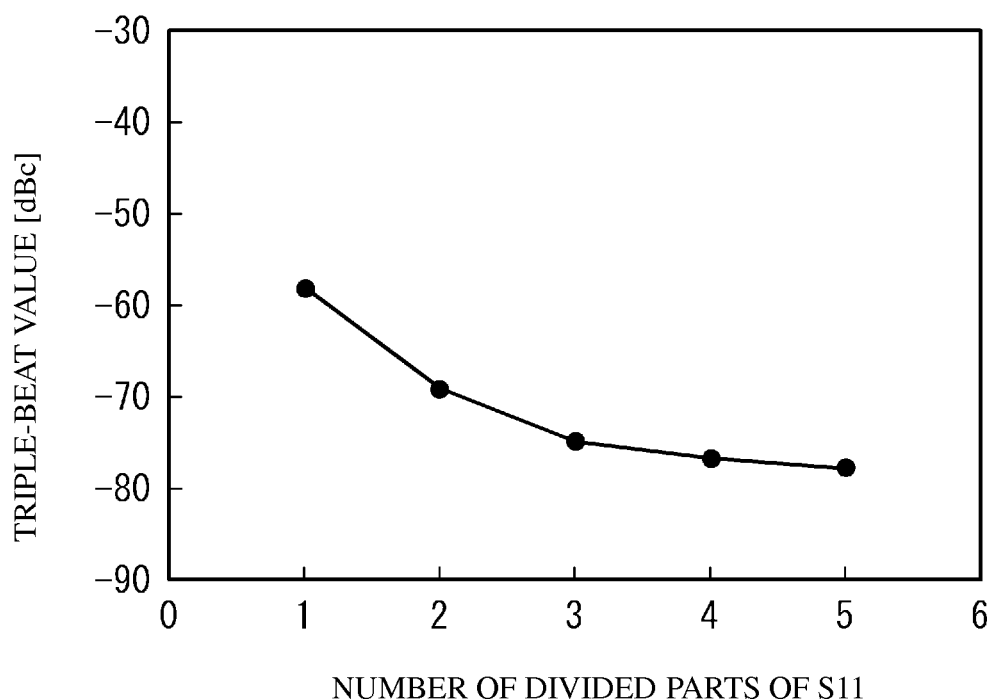
FIG. 18 is a diagram of the triple-beat value associated with the number of divided parts of a series resonator S11.

FIG. 18 is a diagram of triple-beat values associated with the number of divided parts of the series resonator S11. The series resonator is divided into parts in series so that the combined electrostatic capacitance after division is equal to the electrostatic capacitance before division. For example, in a case where the resonator is divided into n, the aperture length of the resonator and the number of pairs of electrode fingers thereof are adjusted so that the electrostatic capacitance of one resonator after division is n times the electrostatic capacitance before division. The resonance frequency of the resonator after division is set equal to 1964 MHz, which is the same as that before division. The triple-beat values illustrated in FIG. 18 are the worst values obtained by sweeping the jammer signal in the reception band.

As illustrated in FIG. 18, the division of the series resonator S11 improves the triple-beat value. The division of the series resonator S11 is very effective in terms of improvement in the triple-beat value. However, even when the series resonator S11 is divided into 5, the triple-beat value is approximately −77 dBc. A further increase in the number of divided parts tends towards a saturation of the triple-beat values. Further, an increase in the number of divided parts increases the electrostatic capacitance of each divided resonator, and increases the area occupied. For example, when the resonator is divided into n, the size of the resonator is $n^2$ times the original, which needs a larger filter area. Further, the division of the resonator increases the resistances of the electrodes, and increases the loss of the filter.

The inventors studied methods for improving the triple-beat value other than the division of the series resonator. Then, the inventors found out that the triple-beat value changes greatly by the resonance frequency of the series resonator S11 besides the division thereof.

Figure 19:
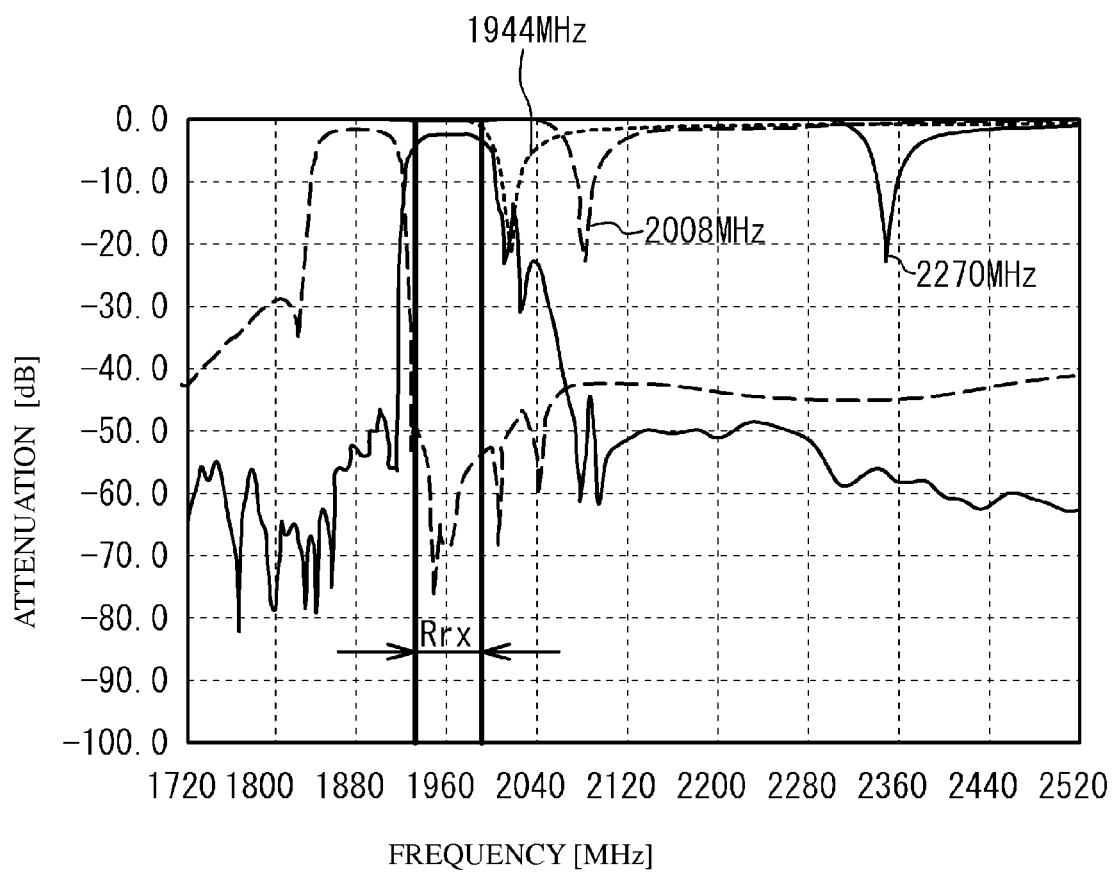
FIG. 19 is a diagram of a pass characteristic of a duplexer used in a simulation and a pass characteristic of a resonator S11 solely.

FIG. 19 is a diagram of the pass characteristic of a duplexer used in the simulation and the pass characteristic of the resonator S11 solely. Referring to FIG. 19, there are illustrated resonance characteristics respectively observed when the resonance frequency of the series resonator S11 is 1944 MHz, 2008 MHz and 2270 MHz. A solid line indicates the pass characteristic of the reception filter 10 when the resonance frequency of the series resonator S11 is 2008 MHz, and a broken line indicates a pass characteristic of the transmission filter 20.

Figure 20:
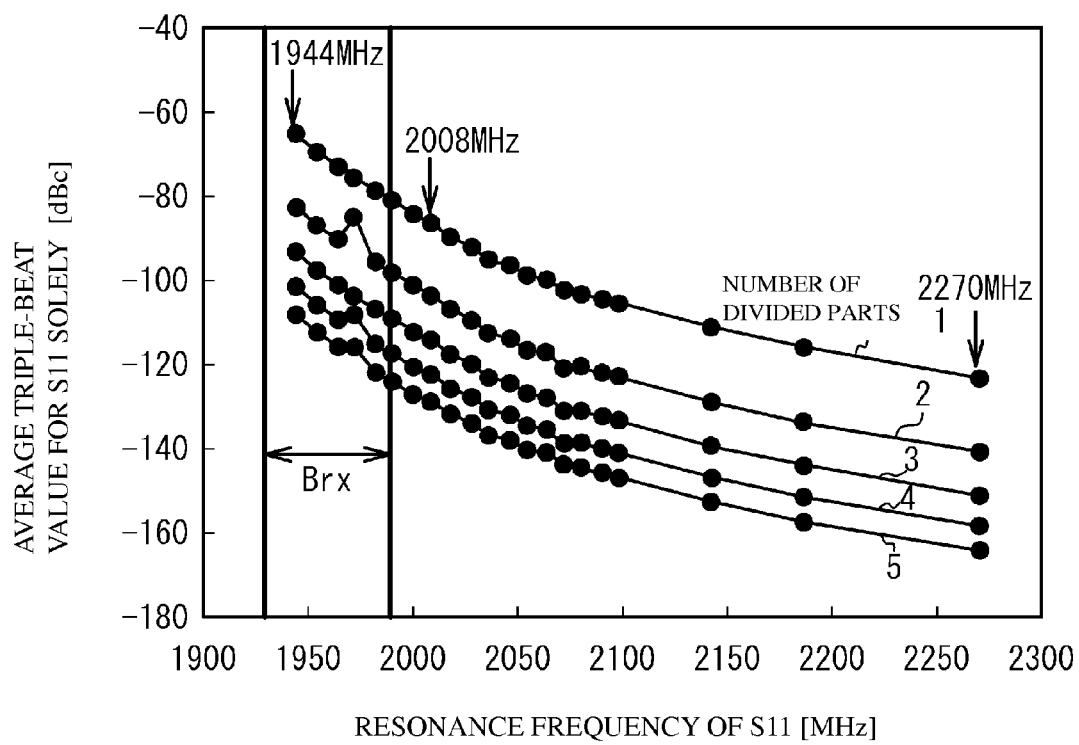
FIG. 20 is a diagram of an average triple-beat value of the series resonator S11 solely associated with the resonance frequency thereof.

FIG. 20 is a diagram of the average triple-beat values of the series resonator S11 solely associated with the resonance frequencies thereof. In each of the series resonators S11 which are respectively divided into one through five, the resonance frequency is changed from 1944 MHz to 2270 MHz as illustrated in FIG. 19. The vertical axis of FIG. 20 denotes the average triple-beat value of the series resonator S11 solely, wherein the non-linear signals of the resonators other than the resonator S11 are set equal to zero, and the triple-beat value of the resonator S11 solely is measured over the reception band Brx. In cases where the series resonator S11 is divided into two or more, the average triple-beat value of the resonator solely closest to the antenna terminal Tant is illustrated.

It is seen from FIG. 20 that the non-linear signal generated in the series resonator S11 can be reduced by increasing the resonance frequency of the series resonator S11. This may be considered as follows. As the resonance frequency of the series resonator S11 becomes higher, the frequencies of the transmission signals Stx1 and Stx2 and the jammer signal Sjam become relatively farther away from the resonance frequency of the series resonator S11. Thus, the amplitude of the surface acoustic wave excited in the series resonator S11 becomes small. Therefore, the non-linear displacement excited becomes small. Even when the resonator S11 is divided into an increased number of resonators, the triple-beat value is improved by increasing the resonance frequency of the series resonator S11. It is seen from the above consideration that the triple-beat value can be improved by increasing the resonance frequency of the series resonator S11 without dividing the series resonator S11 into series resonators in parallel. Further, the specification for the triple-beat value can be satisfied by dividing the series resonator S11 into a practical number of resonators such as two or three resonators.

Figure 21:
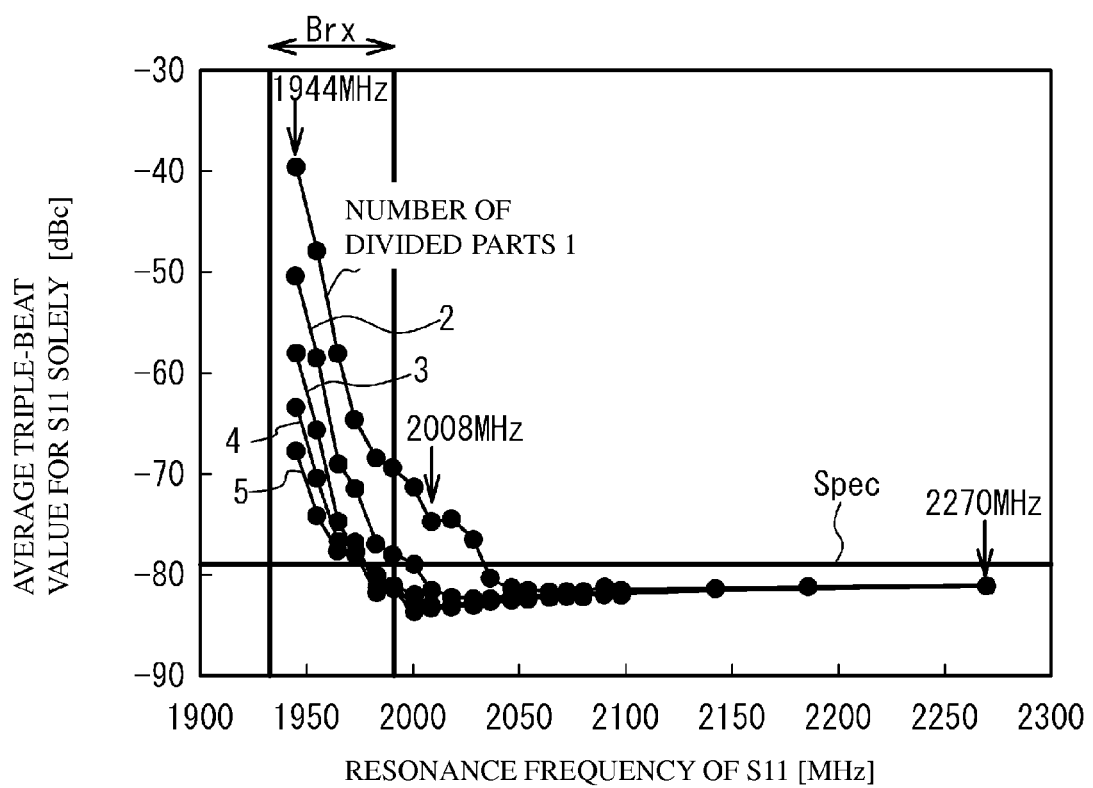
FIG. 21 is a diagram of the maximum value of the total triple-beat value of the series resonator S11 associated with the resonance frequency thereof.

FIG. 21 is a diagram of the maximum value of the total triple-beat value associated with the resonance frequency of the series resonator S11. The vertical axis indicates the worst value of the triple-beat value calculated by adding up the non-linear signals generated in all the resonators of the duplexer illustrated in FIG. 17 in the whole reception band Brx. As illustrated in FIG. 21, the triple-beat value is not improved by setting the resonance frequency of the series resonator S11 higher than a certain frequency (for example, 2050 MHz). This is because the non-linear signal of the series resonator S11 is smaller than the non-linear signals generated in the series resonators other than the series resonator S11 when the resonance frequency of the series resonator S11 is equal to or higher than the certain frequency. Therefore, the total triple-beat value is not improved even by further reducing the non-linear signal generated in the series resonator S11.

When the specification for the triple-beat value is set equal to or smaller than −79 dBc, the specification for the triple-beat value is satisfied by setting the resonance frequency of the series resonator S11 equal to or higher than 2030 MHz in a case where the series resonator S11 is not divided. In a case where the series resonator S11 is divided into two resonators in series with each other, the specification for the triple-beat value is satisfied by setting the resonance frequency of the series resonator equal to or higher than 2010 MHz. In a case where the series resonator S11 is divided into three resonators in series with each other, the specification for the triple-beat value is satisfied by setting the resonance frequency of the series resonator S11 equal to or higher than 1980 MHz. The specification for the triple-beat value is generally equal to or lower than −79 dBc∼−82 dBc in various communication systems. FIG. 21 employs a loose specification out of the specifications for the triple-beat value generally used.

In the above-mentioned simulation, although the resonance frequencies of the divided resonators of the series resonator S11 are equal to each other, the resonator frequencies may be different from each other. It is apparent that the triple-beat value is generally determined by the average resonance frequency of the divided resonators of the series resonator S11 in a case where the resonance frequencies of the divided resonators are designed to be mutually different from each other. Similar results are obtained even when the reception filter 10 is formed by the ladder type filter only, whereas the reception filter 10 in FIG. 17 is the combination of the ladder type filter and the multimode filter.

According to the first embodiment, the reception filter 10 includes one or a plurality of series resonators that are acoustic wave resonators. The resonance frequency of the series resonator S11 closest to the antenna terminal Tant among one or the plurality of series resonators of the reception filter 10 is higher than the upper limit frequency of the reception band Brx. With this setting, the triple-beat value can be improved, as illustrated in FIGS. 20 and 21. In order to function the reception filter 10 as a band-pass filter, it is preferable that the resonance frequency of at least one of the other series resonators is located in the reception band Brx. More preferably, the resonance frequencies of all of the other series resonators are located in the reception band Brx.

In a case where the series resonator S11 is not divided, it is preferable that the resonance frequency of the series resonator S11 is equal to higher than 2030 MHz (that is, not less than 102% of the upper limit frequency of 1990 MHz of the reception band Brx), as is seen from FIG. 21. It is thus possible to improve the triple-beat value.

In a case where the series resonator S11 is divided into two or more in series, it is preferable that the average resonance frequency of the divided series resonators of the series resonator S11 is higher than the upper limit frequency (1990 MHz) of the reception band Brx, as is seen from FIG. 21. It is thus possible to improve the triple-beat value.

Further, in a case where the series resonator S11 is divided into two or more in series, it is preferable that the average resonance frequency of the divided series resonators of the series resonator S11 is equal to or higher than 2010 MHz (that is, not less than 100.9% of the upper limit frequency of 1990 MHz of the reception band Brx). It is thus possible to improve the triple-beat value.

It is preferable that the resonance frequency of the series resonator S11 closest to the antenna terminal Tant out of the series resonators S11 and S12 of the reception filter 10 is the highest among the series resonators of the reception filter 10. The series resonator S11 closest to the antenna terminal Tant most affects the non-linearity. Thus, the resonance frequency of the series resonator S11 is farthest away from the transmission signals Stx1 and Stx2 and the jammer signal Sjam.

It is preferable that the resonance of the series resonator S12 closest to the reception terminal Trx out of the series resonators S11 and S12 of the reception filter 10 is the lowest among the series resonators S11 and S12 of the reception filter 10. This is because the influence of the series resonator S12 closest to the reception terminal Trx to the non-linearity is the smallest.

In a case where the series resonator S11 is divided into three resonators in series with each other, the average resonance frequency of the divided series resonators is preferably located in the reception band Brx. In the case where the series resonator S11 is divided into three or more, as illustrated in FIG. 21, the specification for the triple-beat value is satisfied even when the resonance frequency of the series resonator S11 is in the reception band Brx.

Second Embodiment

A second embodiment is an exemplary duplexer in which the resonance frequency of the series resonator closest to the antenna terminal Tant in the transmission filter 20 is adjusted. The non-linearity signals of triple beats are generated when the three signals of the transmission signal Btx1 and Btx2 and the jammer signal Sjam flow in the resonator concurrently. Therefore, the series resonator S24 closest to the antenna terminal Tant in the transmission filter 20 is capable of considerably suppressing a leakage signal $Sjam_{leak}$ of the jammer signal flowing in the transmission filter 20. In this case, the leakage signal $Sjam_{leak}$ flowing in the transmission terminal Ttx from the series resonator S24 is reduced, and the non-linear signal generated in the transmission filter 20 is therefore reduced.

Figure 22A:
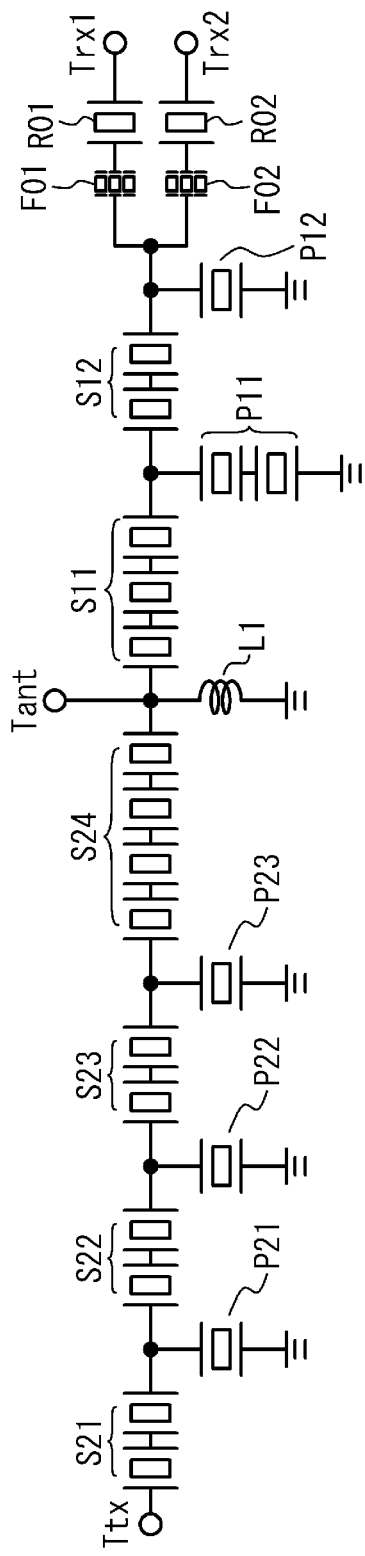
FIG. 22A is a circuit diagram of a duplexer used in a simulation of a second embodiment.
Figure 22B:
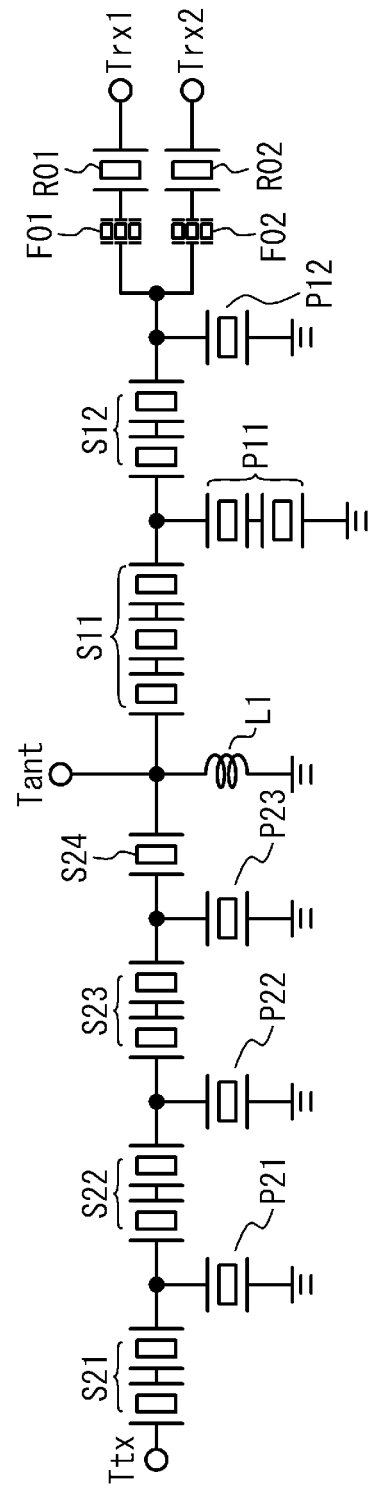
FIG. 22B is a circuit diagram of a duplexer in which a series resonator S24 is not divided.

FIG. 22A is a circuit diagram of a duplexer used in a simulation of the second embodiment. FIG. 22B is a circuit diagram of a duplexer in which the series resonator S24 is not divided. Referring to FIG. 22A, the series resonator S11 of the reception filter 10 is divided into three parts. The average resonance frequency of the three divided series resonators of the series resonator S11 is set equal to 1960 MHz. The parallel resonator P11 of the reception filter 10 is divided into two in series. The series resonator S24 of the transmission filter 20 is divided into four. The other structures are the same as those illustrated in FIG. 17.

Figure 23:
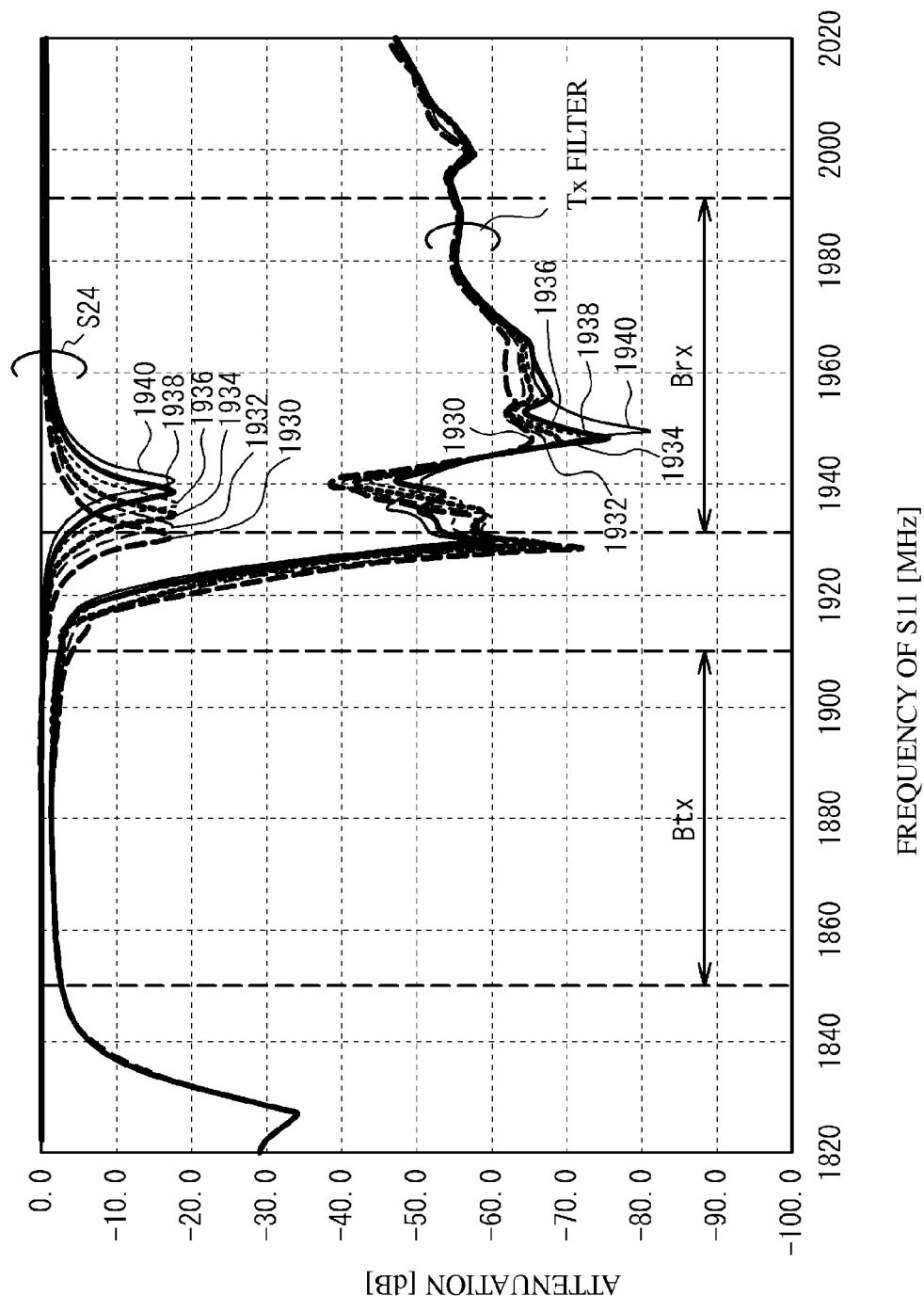
FIG. 23 is a diagram of a pass characteristic of a transmission filter used in the simulation, and a pass characteristic of the series resonator S24 solely.

FIG. 23 is a diagram of a pass characteristic of the transmission filter used in the simulation and a pass characteristic of the resonator S24 solely. Numerals added to curves in FIG. 23 are anti-resonance frequencies of the resonator S24. Referring to FIG. 23, it is assumed that the anti-resonance frequencies of the divided resonators of the series resonator S24 are equal to each other. The anti-resonance frequency of the series resonator S24 divided into four is changed every 2 MHz from 1940 MHz (used in the first embodiment) to 1930 MHz that is the lower limit frequency of the reception band Brx. The pass characteristic of the transmission filter 20 hardly changes in the transmission band Btx, whereas the pass characteristic thereof varies slightly in the reception band Brx.

Figure 24:
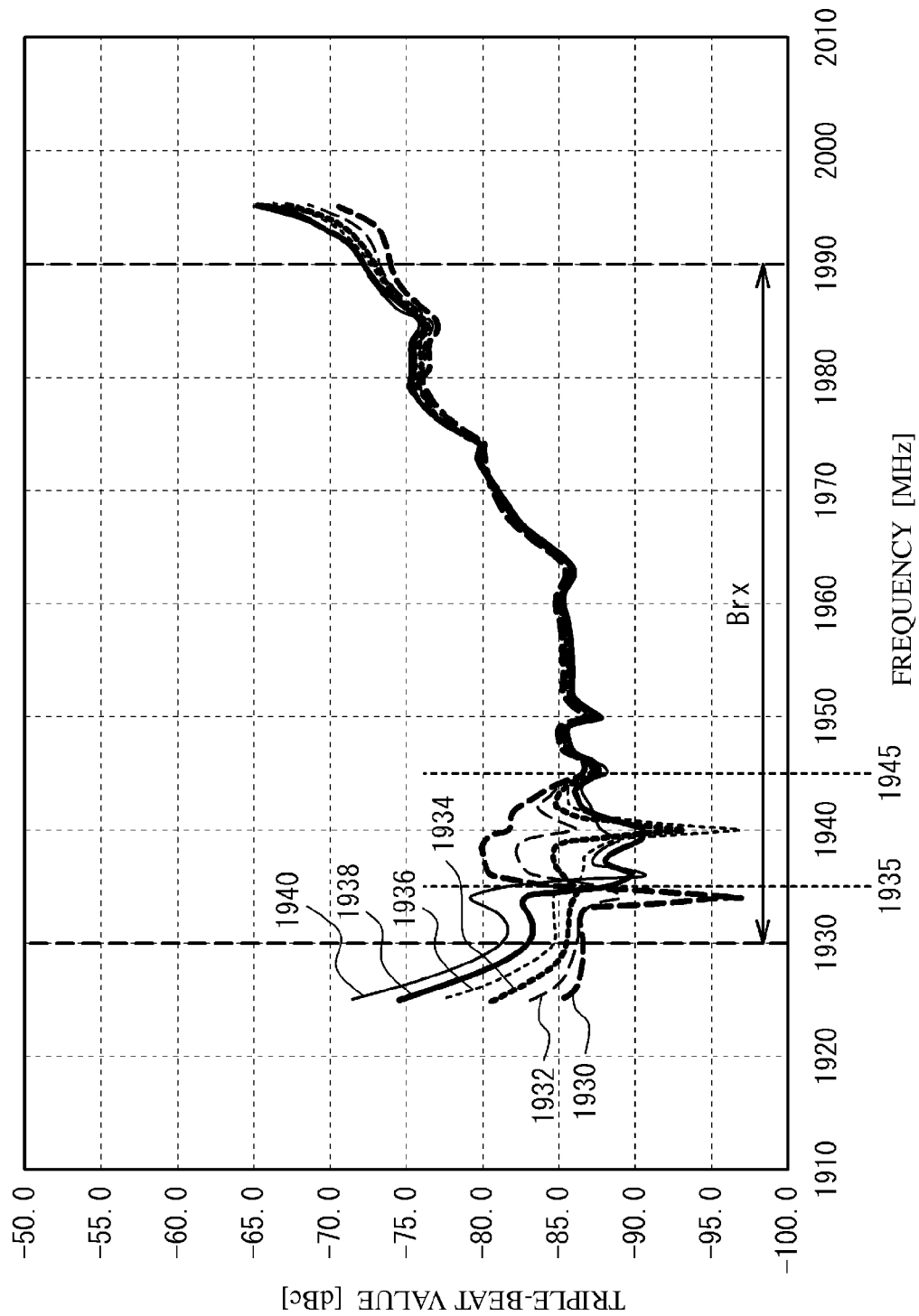
FIG. 24 is a diagram of the triple-bat value in a reception band Brx.

FIG. 24 is a diagram of the triple-beat value in the reception band Brx. The triple-beat value is such that the non-linear signals of all the resonators of the duplexer are considered. Numerals added to curves are anti-resonance frequencies of the series resonator S24. The triple-beat value hardly changes at frequencies equal to or higher than 1945 MHz even by changing the anti-resonance frequency of the resonator S24. This is because the non-linear signal of the series resonator S11 is most dominant at frequencies equal to or higher than 1945 MHz. On the contrary, a change of the triple-beat value is observed at frequencies lower than 1945 MHz. This is because the non-linear signal generated in the transmission filter 20 is larger than the non-linear signal generated in the series resonator S11 at frequencies lower than 1945 MHz. Particularly, the triple-beat value is improved by lowering the anti-resonance frequency of the series resonator S24 at frequencies equal to or lower than 1935 MHz.

This is because the amount of passage on the low-frequency side of the reception band Brx reduces due to the pass characteristic of the series resonator S24 illustrated in FIG. 23 when the anti-resonance frequency of the series resonator S24 is reduced down to the vicinity of the lower limit frequency of the reception band Brx. It is thus possible to suppress leakage of the jammer signal Sjam to the transmission filter 20 and to suppress the generation of the non-linear signal in the transmission filter 20.

When the anti-resonance frequency of the series resonator S24 is too close to the lower limit frequency of 1930 MHz of the reception band Brx, the triple-beat value in the range of 1935 MHz to 1945 MHz deteriorates. This is because the amount of passage of the series resonator S24 solely increases in the range of 1935 MHz to 1945 MHz due to the pass characteristic of the series resonator S24 in FIG. 23 when the anti-resonance frequency of the series resonator S24 is reduced to the vicinity of the lower limit frequency of the reception band Brx. From the above, the anti-resonance frequency of the series resonator S24 is preferably in the range of 1932 MHz to 1938 MHz.

The simulation of the second embodiment handles the case where the series resonator S24 is divided into four in series. Similar results are obtained in a case where the series resonator S24 is not divided, as illustrated in FIG. 22B. This is because the anti-resonance frequency is set using the pass characteristic of the series resonator S24 for the purpose of restraining the leakage signal $Sjam_{leak}$ of the jammer signal from flowing in the transmission terminal Ttx. Similar results are obtained in a case where the series resonator S24 is divided into parts other than four. Similar results are obtained in a case where at least one of divided parts of the series resonator S24 has the pass characteristic illustrated in FIG. 23. In this case, the leakage signal $Sjam_{leak}$ of the jammer signal that flows in the transmission filter 20 can be restrained. Preferably, all of the divided parts of the series resonator S24 have the pass characteristic illustrated in FIG. 23.

According to the second embodiment, the transmission filter 20 includes one or more series resonators. In the case where the series resonator S24 is not divided, the anti-resonance frequency of the series resonator S24 is preferably equal to higher than 1932 MHz (that is, not less than 100.1% of the lower limit frequency of 1930 MHz of the reception band Brx) and is equal to or lower than 1938 MHz (not more than 100.4% of the lower limit frequency of 1930 MHz of the reception band Brx). It is thus possible to suppress the triple-beat value in the reception band Brx as illustrated in FIG. 24. It is preferable that the anti-resonance frequency of the series resonator S24 is equal to or higher than 1934 MHz (that is, not less than 100.2% of the lower limit frequency of 1930 MHz of the reception band Brx) and is equal to or lower than 1936 MHz (that is, not more than 100.3% of the lower limit frequency of 1930 MHz of the reception band Brx).

In the case where the series resonator S24 is divided into two or more parts, at least one of the divided series resonators is preferably not less than 100.1% of the lower limit frequency of the reception band and is not more than 100.4% thereof. More preferably, the anti-resonance frequencies of all of the divided resonators are not less than 100.1% of the lower limit frequency of the reception band and are not more than 100.4% thereof for the purpose of suppressing the leakage of the jammer signal Sjam to the transmission filter 20.

In the case where the series resonator 24 is not divided, it is preferable that the anti-resonance frequency of the series resonator S24 is not the highest among the series resonators S21~S24 of the transmission filter 20. For example, it is preferable that the anti-resonance frequency of any of the series resonators S22~S23 is higher than that of the series resonator S24. In the case where the series resonator S24 is divided into two or more series resonators, the anti-resonance frequency of at least one of the divided series resonators of the series resonator S24 is not the highest among the series resonators S21~S24 of the reception filter 10. The above arrangements form the pass band of the ladder type filter.

In the case where the series resonator S24 is not divided, it is preferable that the anti-resonance frequency of the series resonator S24 is not the lowest among the series resonators S21~S24 of the transmission filter 20. For example, the anti-resonance frequency of any of the series resonators S22~S23 is lower than that of the series resonator S24. In the case where the series resonator S24 is divided into two series resonators, it is preferable that the anti-resonance frequency of at least one of the divided series resonators of the series resonator S24 is not the lowest among the series resonators S21~S24 of the reception filter 10. The above arrangements define the pass band of the ladder type filter.

In the case where the series resonator S24 is not divided, the anti-resonance frequency of the series resonator S24 may be set to the lowest among the series resonators S21~S24 of the transmission filter 20. In the case where the series resonator S24 is divided into two or more series resonators, the anti-resonance frequency of at least one of the divided series resonators of the series resonator S24 may be set to the lowest among the series resonators S21~S24 of the transmission filter 20. The above arrangements define the pass band of the ladder type filter.

In the case where the series resonator S24 is not divided as depicted in FIG. 22B, the anti-resonance frequency of the series resonator S24 may be within the reception band Brx. Thus, the triple-beat value may be suppressed. In FIG. 22A, in the case where the series resonator S24 is divided into two or more series resonators, the anti-resonance frequency of at least one of the divided series resonators may be within the reception band Brx.

Third Embodiment

A third embodiment is an exemplary duplexer in which the resonance frequency of the parallel resonator closest to the antenna terminal Tant in the reception filter 10 is adjusted. The non-linear signal of the triple beats is generated when the three signals of the transmission signals Btx1 and Btx2 and the jammer signal Sjam flow in the resonator concurrently. Therefore, the parallel resonator P11 closest to the antenna terminal Tant in the reception filter 10 is capable of considerably suppressing leakage signals $Stx1_{leak}$ and $Stx2_{leak}$ that flow in the reception filter 10. In this case, due to the parallel resonator P11, the leakage signals $Stx1_{leak}$ and $Stx2_{leak}$ that flow in the reception terminals Trx1 and Trx2 are reduced, and the non-linear signal generated in the reception filter 10 can be suppressed.

FIG. 25A is a circuit diagram of a duplexer used in a simulation of the third embodiment. FIG. 25B is a circuit diagram of a duplexer in which the parallel resonator P11 is not divided. Referring to FIG. 25A, the series resonator S11 of the reception filter 10 is divided into two. The resonance frequency of the series resonator S11 composed of the divided series resonators is 2100 MHz. The parallel resonator P11 of the reception filter 10 is divided into four. The series resonator S24 of the transmission filter 20 is divided into four. The anti-resonance frequency of the series resonator S24 composed of the divided series resonators is 1936 MHz. The other structures are the same as those illustrated in FIG. 22A, and a description thereof is omitted here.

Figure 26:
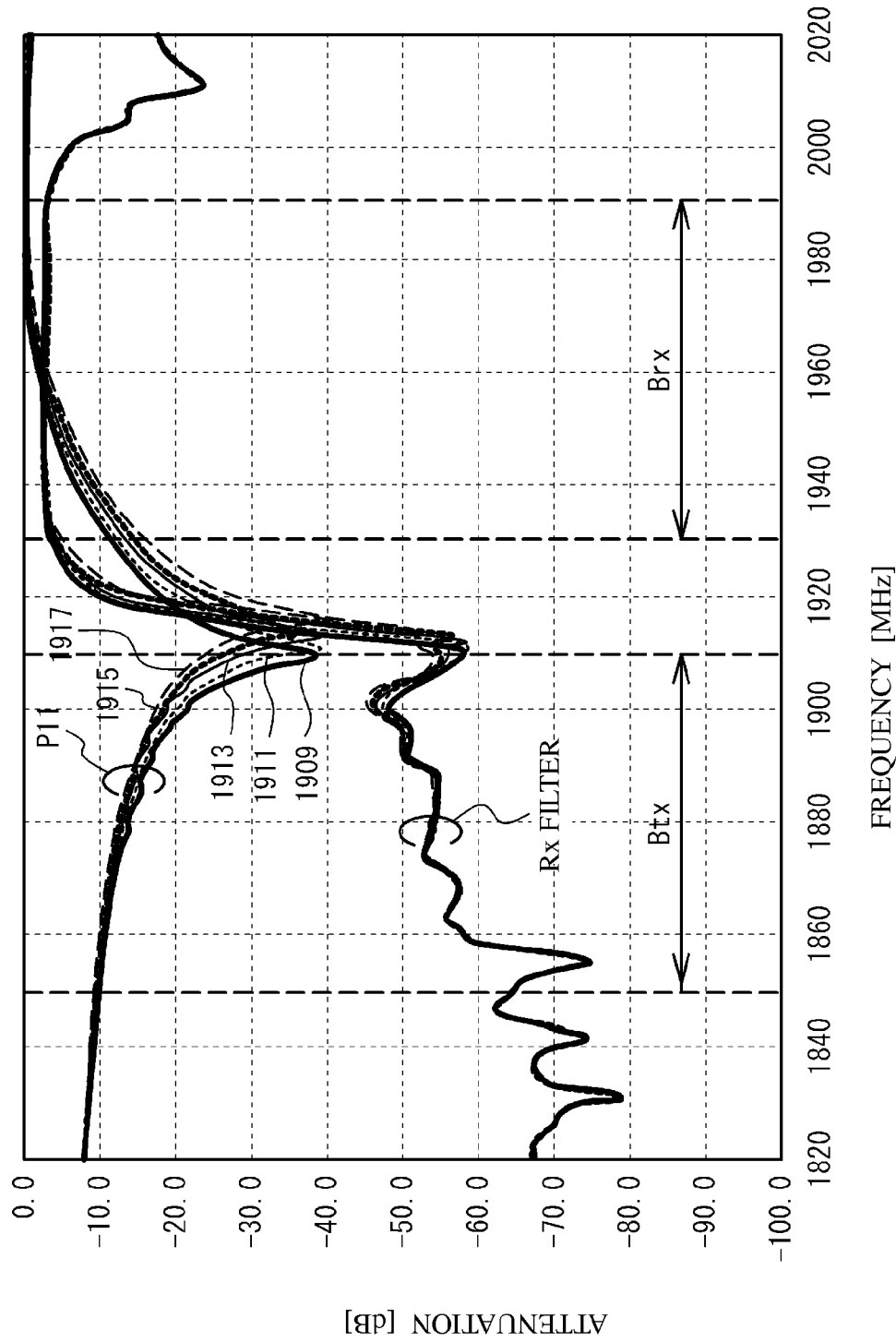
FIG. 26 is a diagram of a pass characteristic of a reception filter used in the simulation and a pass characteristic of the parallel resonator P11 solely.

FIG. 26 is a graph of a pass characteristic of the reception filter used in the simulation and a pass characteristic of the parallel resonator P11 solely. Numerals added to curves in FIG. 26 are resonance frequencies of the parallel resonator P11. Referring to FIG. 26, the divided series resonators of the series resonator P11 have an equal resonance frequency. The resonance frequency of the parallel resonator P11 composed of the divided series resonators is changed every 2 MHz from 1909 MHz (used in the first and second embodiments) to 1917 MHz. The resonance frequency of the parallel resonator P11 does not include a parasitic ground inductance. The pass characteristic of the reception filter 10 hardly changes regardless of the resonance frequency of the parallel resonator P11.

Figure 27:
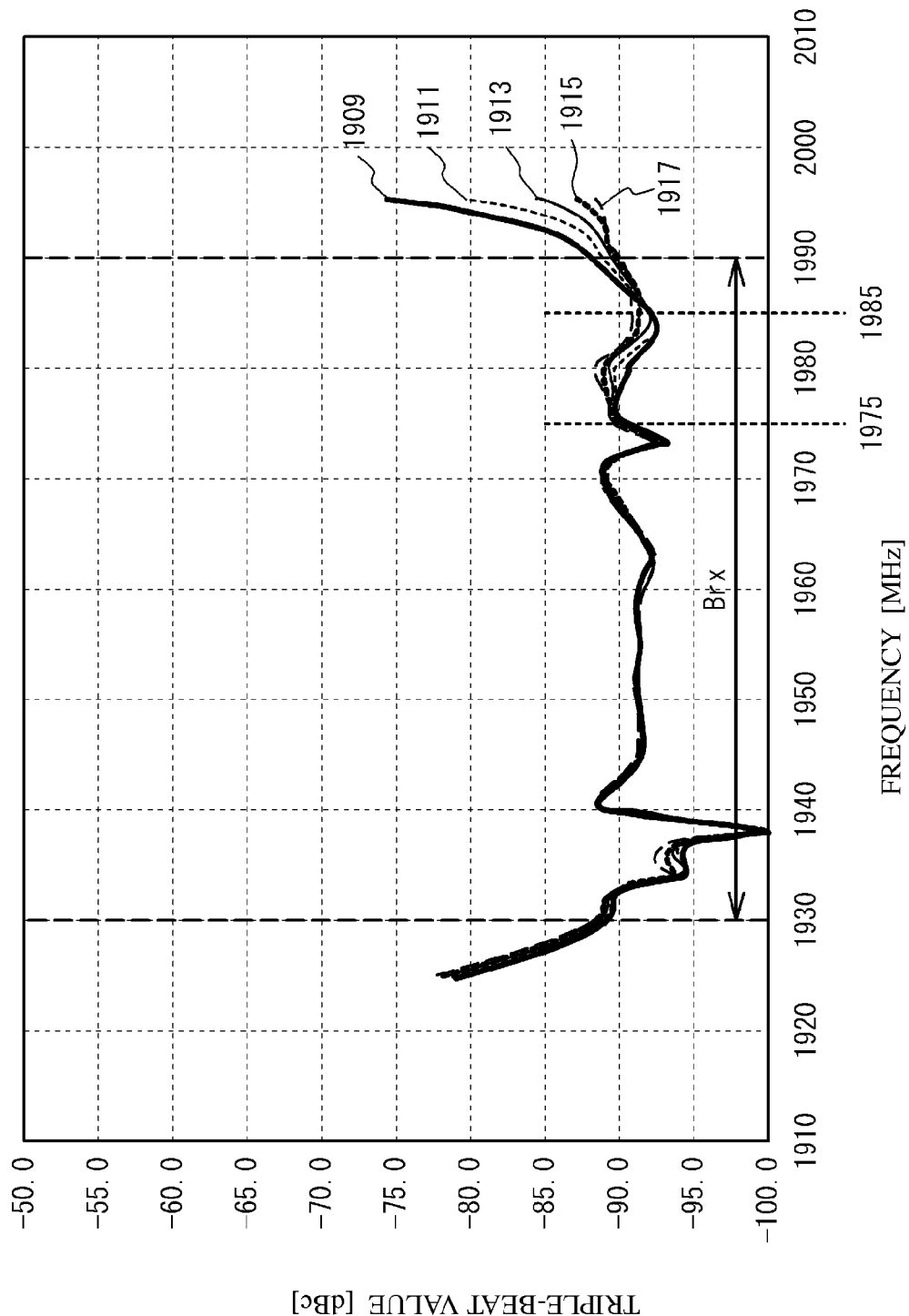
FIG. 27 is a diagram of the triple-beat value in the reception band Brx.

FIG. 27 is a diagram of the triple-beat value in the reception band Brx. The triple-beat value is such that the non-linear signals of all the resonators of the duplexer are considered. Numerals added to curves are resonance frequencies of the parallel resonator P11. It is seen from FIG. 27 that the triple-beat value hardly changes at frequencies equal to or lower than 1975 MHz even by changing the resonance frequency of the parallel resonator P11. In contrast, a change of the triple-beat value is observed at frequencies higher than 1975 MHz. This is because the non-linear signal of the reception filter on the reception terminal Trx side is dominant at frequencies equal to or lower than 1975 MHz due to the parallel resonator P11.

Particularly, at frequencies equal to or higher than 1985 MHz, the triple-beat value is improved by increasing the resonance frequency of the parallel resonator P11. This may be explained from the pass characteristic of the parallel resonator P11 in FIG. 26. An interconnection line of a filter chip, a bump, a package wiring line and the like are connected to the terminal of the parallel resonator P11 on the ground side. These inductances are added to the ground terminal of the parallel resonator P11. The inductances added to the ground terminal of the parallel resonator P11 shifts the resonance frequency thereof to a lower side. When the parasitic inductance added to the ground terminal of the parallel resonator P11 is considered, the resonance frequency of the parallel resonator P11 is approximately 5 MHz lower than that in FIG. 26. For example, in the 1.9 GHz band, a general ground impedance of 0.1 nH added to the parallel resonator lowers the resonance frequency of the parallel resonator by about 5 MHz.

When the pass characteristic of the parallel resonator P11 illustrated in FIG. 26 is shifted to a lower side by about 5 MHz, the amount of passage of the parallel resonator P11 becomes smaller as the resonance frequency of the parallel resonator P11 becomes higher in the vicinity of the upper limit of the transmission band Btx. Thus, when the jammer signal Sjam is close to the upper limit of the reception band Brx (which is equal to or higher than 1985 MHz, for example), the parallel resonator P11 suppresses the leakage signals $Stx1_{leak}$ and $Stx2_{leak}$ of the corresponding transmission signal. Thus, the leakage of the transmission signals Stx1 and Stx2 to the reception filter 10 can be restrained. It is thus possible to suppress the generation of the non-linear signal in the reception filter 10.

In FIG. 27, when the resonance frequency of the parallel resonator P11 is set to 1917 MHz, the triple-beat value deteriorates at frequencies of 1975 MHz to 1985 MHz. This is because, when the resonance frequency of the parallel resonator P11 is set to 1917 MHz due to the pass characteristic of the parallel resonator P11 taking the parasitic ground inductance illustrated in FIG. 26 into consideration, the amount of passage of the resonator P11 solely having frequencies that are 5~15 MHz lower than the upper limit frequency of the transmission band Btx increases. As a result of the above consideration, the resonance frequency of the parallel resonator P11 is preferably 1911 MHz~1917 MHz when the parasitic ground inductance is not included, and is preferably 1906 MHz~1912 MHz when the parasitic ground inductance is included. A deterioration of the triple-beat value at frequencies of 1975 MHz~1985 MHz is not as large as that at frequencies of 1935 MHz~1945 MHz of the second embodiment in FIG. 24. It is thus preferable that the resonance frequency of the parallel resonator P11 is equal to or higher than the upper limit frequency of the transmission band Btx irrespective of whether the parasitic ground inductance is included or not.

The simulation of the third embodiment handles an exemplary case where the parallel resonator P11 is divided into four. However, like the consideration of the second embodiment, similar results are obtained when the parallel resonator P11 is not divided as illustrated in FIG. 25B. Further, results similar to those of the third embodiment are obtained when the parallel resonator P11 is divided into parts other than four. In the case where the parallel resonator P11 is divided into parts, the resonance frequency of at least one of the divided resonators of the parallel resonator P11 has the pass characteristic of FIG. 26 for the purpose of suppressing leakage of the transmission signal to the reception terminal Trx. Preferably, all of the divided resonators of the parallel resonator P11 have the pass characteristic of FIG. 26.

According to the third embodiment, the reception filter 10 includes one or a plurality of parallel resonators. In the case where the parallel resonator P11 is not divided, it is preferable that the resonance frequency of the parallel resonator P11 including the parasitic ground inductance is 1906 MHz (that is, 99.8% of the upper limit frequency of 1910 MHz of the transmission band Btx). Thus, as illustrated in FIG. 27, the triple-beat value can be suppressed. In the case where the parallel resonator P11 is divided into two series resonators or more, the average resonance frequency of each divided resonator of the parallel resonator P11 including the parasitic ground inductance is preferably equal to or higher than 1906 MHz (that is, 99.8% of the upper limit frequency of 1910 MHz of the transmission band Btx or more). Further, the resonance frequency of the parallel resonator p11 including the parasitic ground inductance is equal to or lower than 1912 MHz (that is, 100.1% of the upper limit frequency of the transmission band Btx or lower).

In the case where the parallel resonator P11 is not divided as illustrated in FIG. 25B, it is preferable that the resonance frequency of the parallel resonator P11 including the parasitic ground inductance is equal to or higher than the upper limit frequency of 1910 MHz of the transmission band Btx. Thus, as illustrated in FIG. 27, the triple-beat value can be suppressed. In FIG. 25A, in a case where the parallel resonator P11 is divided into two series resonators or more, it is preferable that the average resonance frequency of each divided series resonator of the parallel resonator P11 including the parasitic ground inductance is equal to or higher than the upper limit frequency of 1910 MHz of the transmission band Btx. Further, in the case where the parallel resonator P11 is divided into two series resonators or more, the resonance frequency of at least one of the divided series resonators of the parallel resonator P11 that does not include the parasitic ground inductance is equal to or higher than the upper limit frequency of 1910 MHz of the transmission band Btx. It is to be noted that the discussion of the resonance frequency of at least one of the divided series resonators of the parallel resonator P11 that does not include the parasitic ground inductance is based on the fact that the discussion of the resonance frequency of each divided series resonator of the parallel resonator P11 that includes the parasitic ground inductance is meaningless.

In the case where the parallel resonator P11 is not divided, the resonance frequency of the parallel resonator P11 including the parasitic ground inductor can be set to the highest among the parallel resonators of the reception filter 10. In the case where the parallel resonator P11 is divided into two series resonators or more, the resonance frequency of at least one of the divided series resonators of the parallel resonator P11 that does not include the parasitic ground inductance can be set to the highest among all the parallel resonators P11~P12 of the reception filter 10. This is because the parallel resonator P11 closest to the antenna terminal Tant most affects the non-linearity.

In the case where the parallel resonator P12 closest to the reception terminal Trx in the reception filter 10 is not divided, the resonance frequency of the parallel resonator P12 including the parasitic ground inductance can be set to the lowest among all the parallel resonators P11~P12 of the reception filter 10. In the case where the parallel resonator P12 is divided into two series resonators or more, the resonance frequency of at least one of the divided series resonators of the parallel resonator P12 that does not include the parasitic ground inductance can be set to the lowest among all the parallel resonators P11~P12 of the reception filter 10. This is because the parallel resonator P12 closest to the reception terminal Trx has the least influence to the non-linearity.

Fourth Embodiment

A fourth embodiment is an exemplary duplexer in which the anti-resonance frequency of the series resonator S23 is adjusted. FIG. 28A is a circuit diagram of a duplexer of the fourth embodiment, and FIG. 28B is a circuit diagram of a duplexer in which the series resonator S23 is not divided. As illustrated in FIG. 28A, the series resonator S11 of the reception filter is divided into two. A parasitic ground inductance L21 is provided in common to the parallel resonators P21 and P22 of the transmission filter 20, and a parasitic ground inductance L22 is provided to the parallel resonator P23. Each of the series resonators S21, S22 and S23 is divided into two. One of the two divided series resonators in each of the series resonators S21, S22 and S23 closer to the transmission terminal Ttx is given reference numerals S21a, S22a and S23a, respectively. The other divided series resonator in each of the series resonators S21, S22 and S23 closer to the antenna terminal Tant is given reference numerals S21b, S22b and S23b. The other structures are the same as those of the first embodiment illustrated in FIG. 17, and a description thereof is omitted here.

Figure 29A:
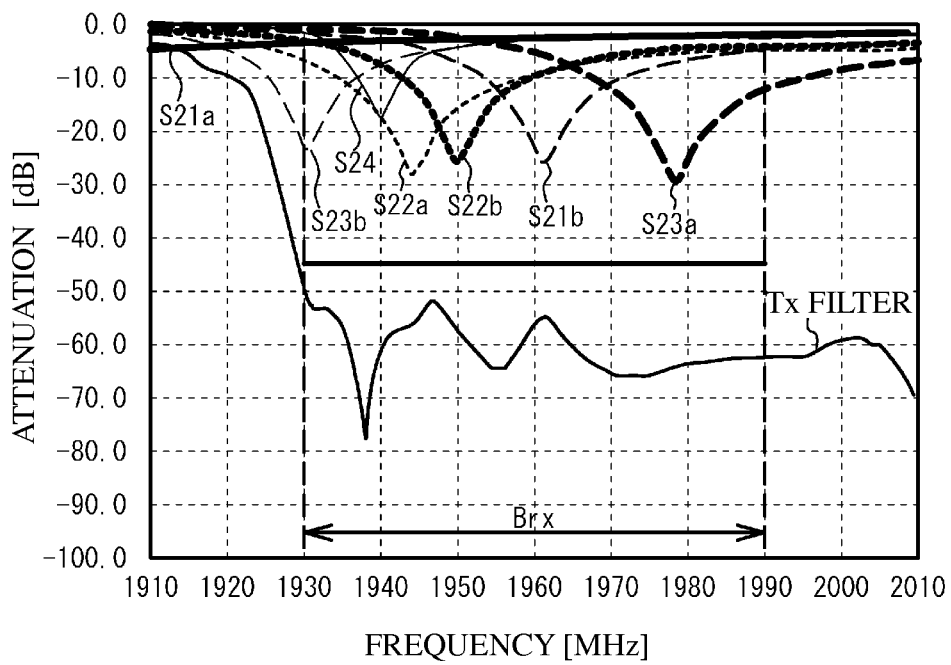
FIG. 29A is a diagram of a pass characteristic of a transmission filter and a pass characteristic of each series resonator.
Figure 29B:
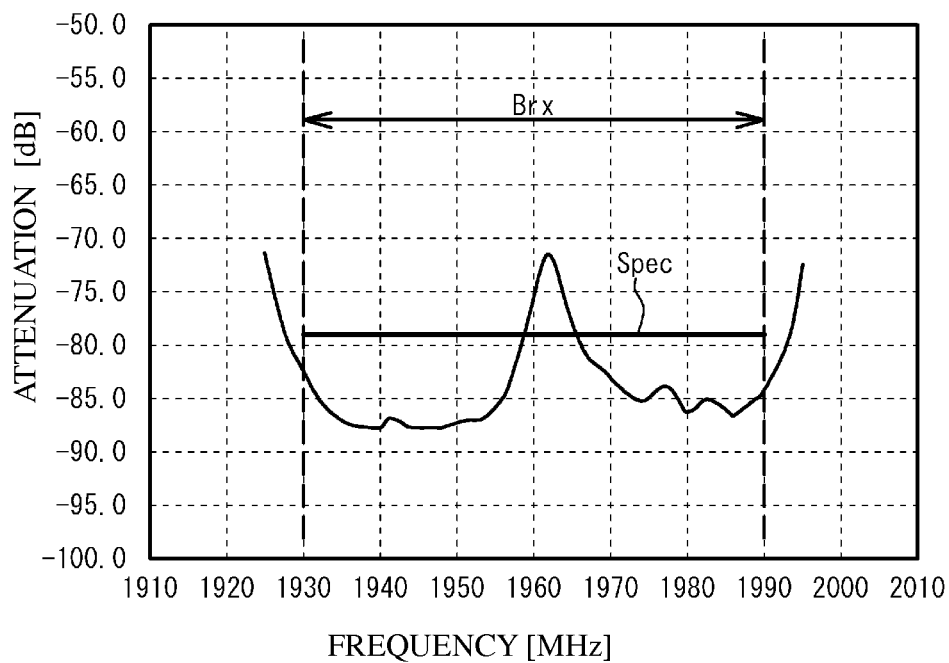
FIG. 29B is a diagram of the triple-beat value in the reception band.

FIG. 29A is a diagram of a pass characteristic of the transmission filter and a pass characteristic of each series resonator. In FIG. 29A, the anti-resonance frequency of the series resonator S23a is 1978 MHz. FIG. 29B is a diagram of the triple-beat value in the reception band. As illustrated in FIG. 29B, the triple-beat value deteriorates in the vicinity of the center of the reception band Brx.

Figure 30:
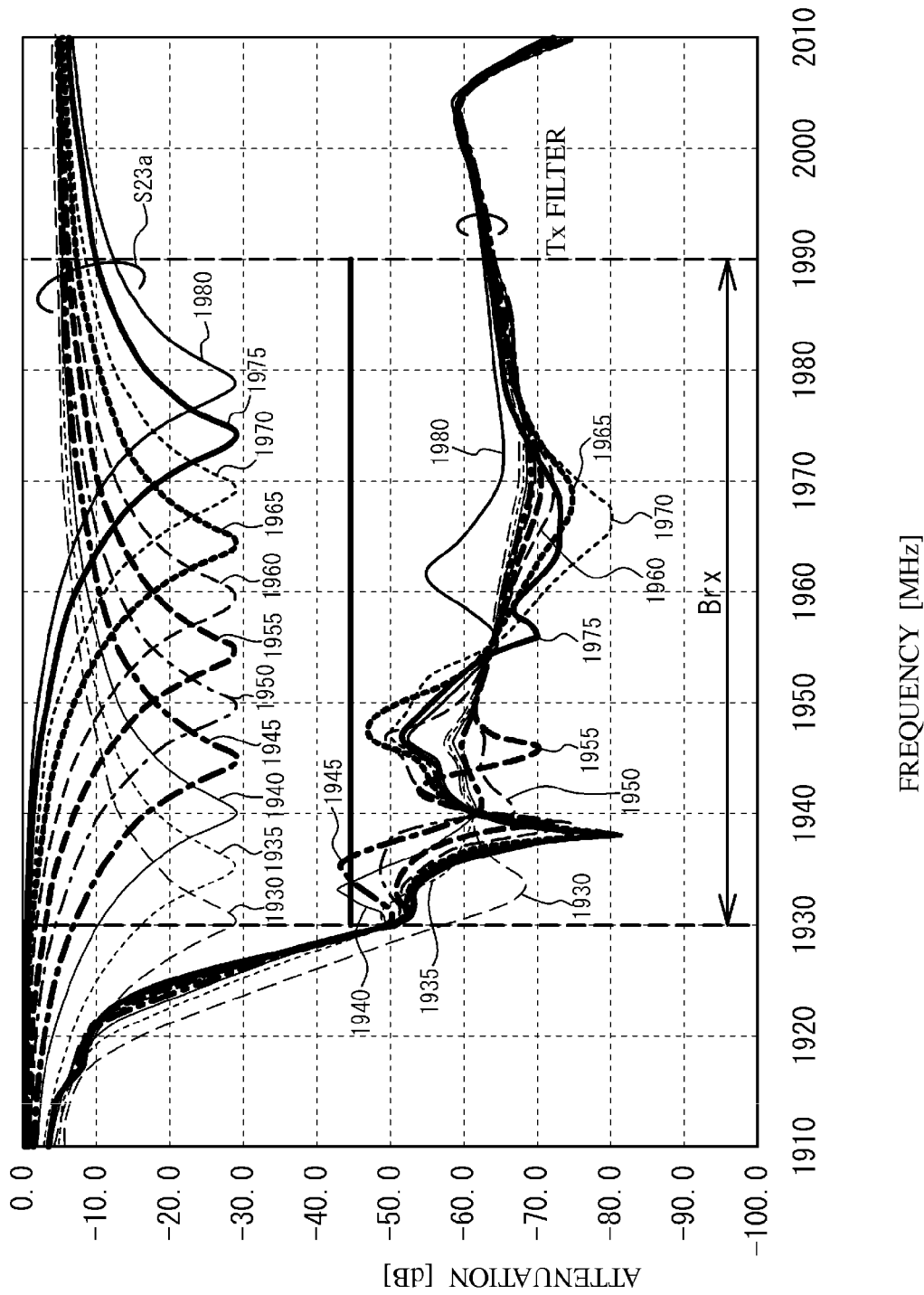

FIG. 30 is a diagram of a pass characteristic of the transmission filter and a pass characteristic of the series resonator S23a solely. Numerals added to curves in FIG. 30 are the anti-resonance frequencies of the series resonator S23a. As illustrated in FIG. 30, the anti-resonance frequency of the series resonator S23a is changed every 5 MHz from 1980 MHz to 1930 MHz. The specification of the amount of attenuation of the transmission filter 20 in the reception band Brx is −43 dB. All the transmission filers 20 satisfy the specification.

Figure 31:
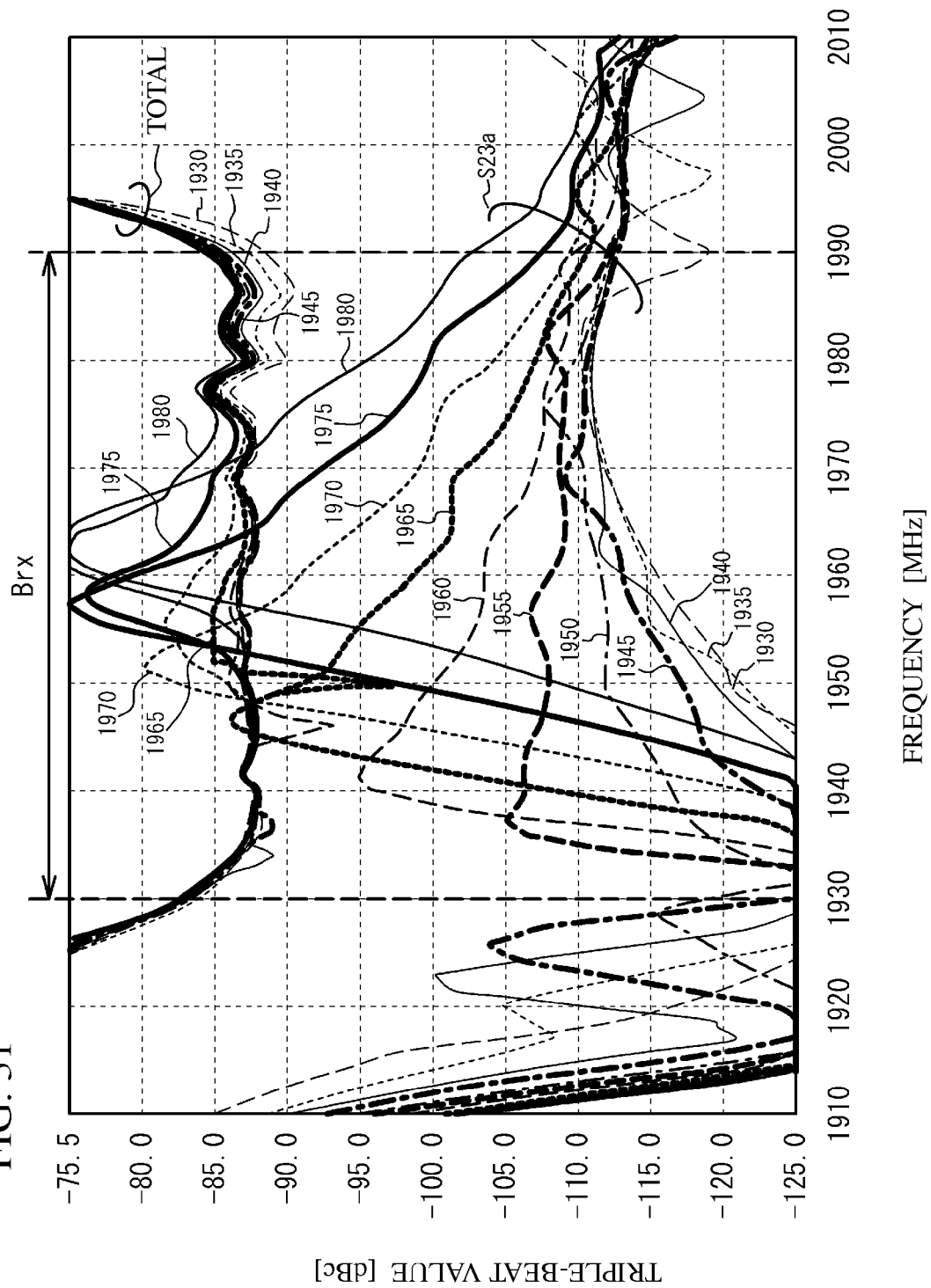
FIG. 31 is a diagram of the triple-beat value of the fourth embodiment.

FIG. 31 is a diagram of the triple-beat value in the fourth embodiment, and illustrates the total triple-beat value considering the non-linearity signal of all the resonators and the triple-beat value of the series resonator S23a solely. Numerals added to curves in FIG. 31 are the anti-resonance frequencies of the series resonator S23a. As illustrated in FIG. 31, as the anti-resonance frequency of the series resonator S23a is lower, the triple-beat value is better. The triple-beat value is reduced when the anti-resonance frequency of the series resonator S23a is equal to or lower than 1970 MHz. At frequencies equal to or lower than 1960 MHz, the total triple beat value is not affected. That is, the non-linearity of the series resonator S23a hardly affects the non-linearity of all of the other resonators.

According to the fourth embodiment, the transmission filter 20 includes the plurality of series resonators. The anti-resonance frequencies of the series resonators S23a and S23b next to the series resonator S24 closest to the antenna terminal Tant among all the series resonators of the transmission filter 20 are preferably equal to or lower than 1970 MHz (that is, 102.1% of the lower limit frequency of the reception band Brx or lower). More preferably, the anti-resonance frequency of the series resonator S23a is equal to or lower than 1960 MHz (that is, 101.6% of the lower limit frequency of the reception band Brx or lower).

The simulation of the fourth embodiment handles the case where the series resonator S23 is divided into two. However, like the consideration of the second embodiment, similar results are obtained when the series resonator S23 is not divided as illustrated in FIG. 28B. Further, results similar to those of the fourth embodiment are obtained when the series resonator S23 is divided into parts other than two parts. In the case where the series resonator S23 is divided into parts, the anti-resonance frequency of at least one of the divided resonators of the series resonator S23 has the pass characteristic of FIG. 29A. Preferably, all of the divided resonators of the series resonator S23 have the pass characteristic of FIG. 29A.

As described above, in the case where the series resonator next to the series resonator closest to the antenna terminal Tant is divided into two or more, the anti-resonance frequency of at least of the divided series resonators S23a and S23b is equal to or lower than 102.1% of the lower limit frequency of the reception band Brx. More preferably, the anti-resonance frequencies of all the divided series resonators are equal to or lower than 101.6% of the lower limit frequency of the reception band Brx.

As illustrated in FIG. 28B, in the case where the series resonator next to the series resonator closest to the antenna terminal Tant is not divided, it is preferable that the anti-resonance frequency of the series resonator S23 that is not divided is equal to or lower than 102.1% of the lower limit frequency of the reception band Brx.

Fifth Embodiment

A fifth embodiment is an exemplary duplexer that is actually manufactured and the triple-beat value thereof is measured. FIG. 32A is a circuit diagram of a duplexer in accordance with a comparative example, and FIG. 32B is a circuit diagram of a duplexer in accordance with the fifth embodiment. In each of FIGS. 32A and 32B, the reception filter 10 and the transmission filter 20 are filters using the surface acoustic wave resonators. As illustrated in FIG. 32B, the configuration of the duplexer of the fifth embodiment is the same as that of the third embodiment illustrated in FIG. 25A, and a description thereof is omitted here. The series resonator S22 is composed of the series resonator S22a closer to the transmission terminal Ttx, and the series resonator S22b closer to the antenna terminal Tant. The series resonator S12 is composed of a resonator S12b closer to the reception terminal Trx, and a resonator closer S12a to the antenna terminal Tant. As illustrated in FIG. 32A, the duplexer of the comparative example is configured so that the series resonator S11 is divided into three, the series resonator S24 is divided into two, and the parallel resonator P11 is divided into two. The parallel resonator P12 is not divided. The other structures of the comparative example are the same as those of the fifth embodiment in FIG. 32B, and a description thereof is omitted here.

Figure 33:
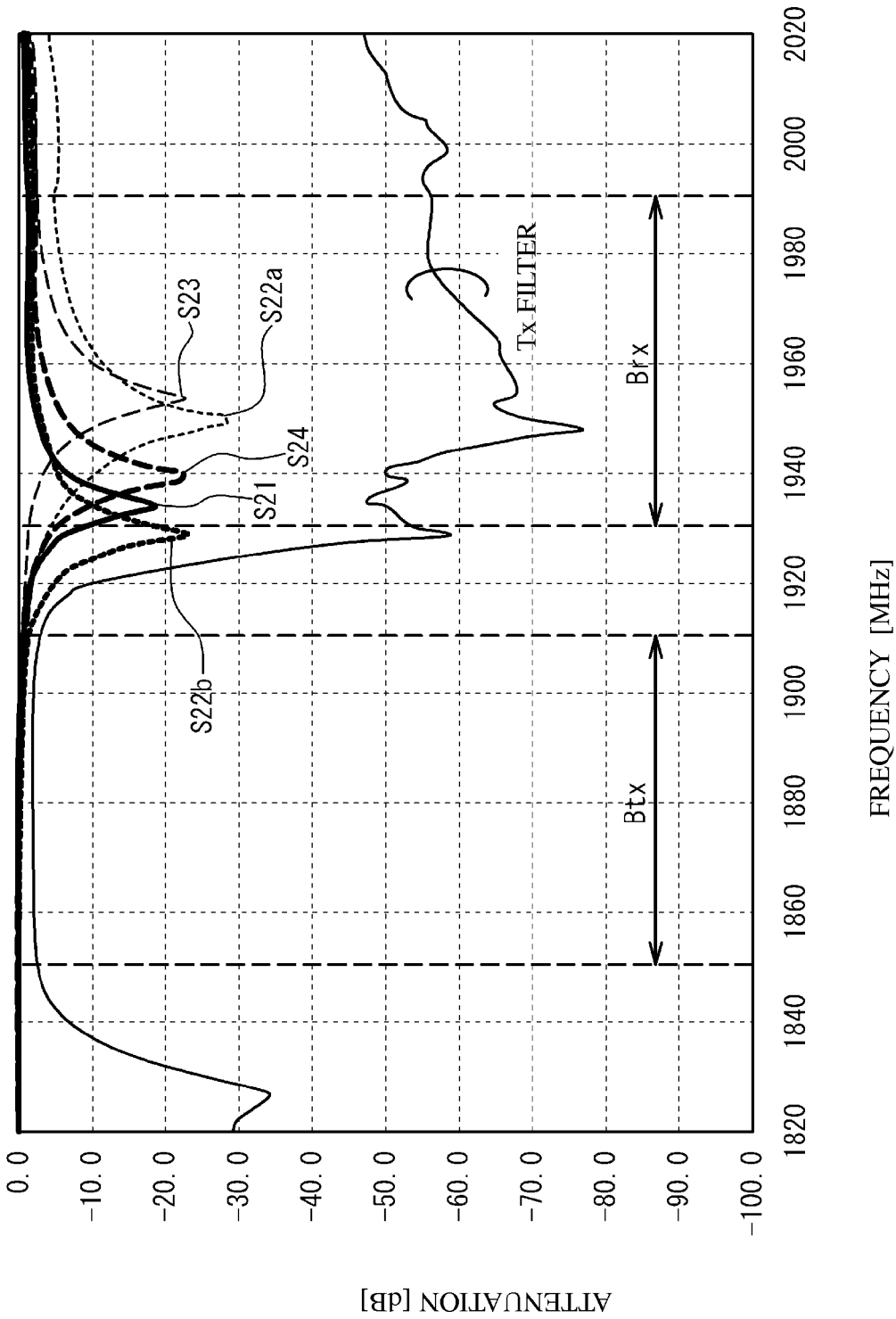
FIG. 33 is a diagram of a pass characteristic of a transmission filter of the duplexer of the comparative example, and a pass characteristic of each series resonator.
Figure 34:
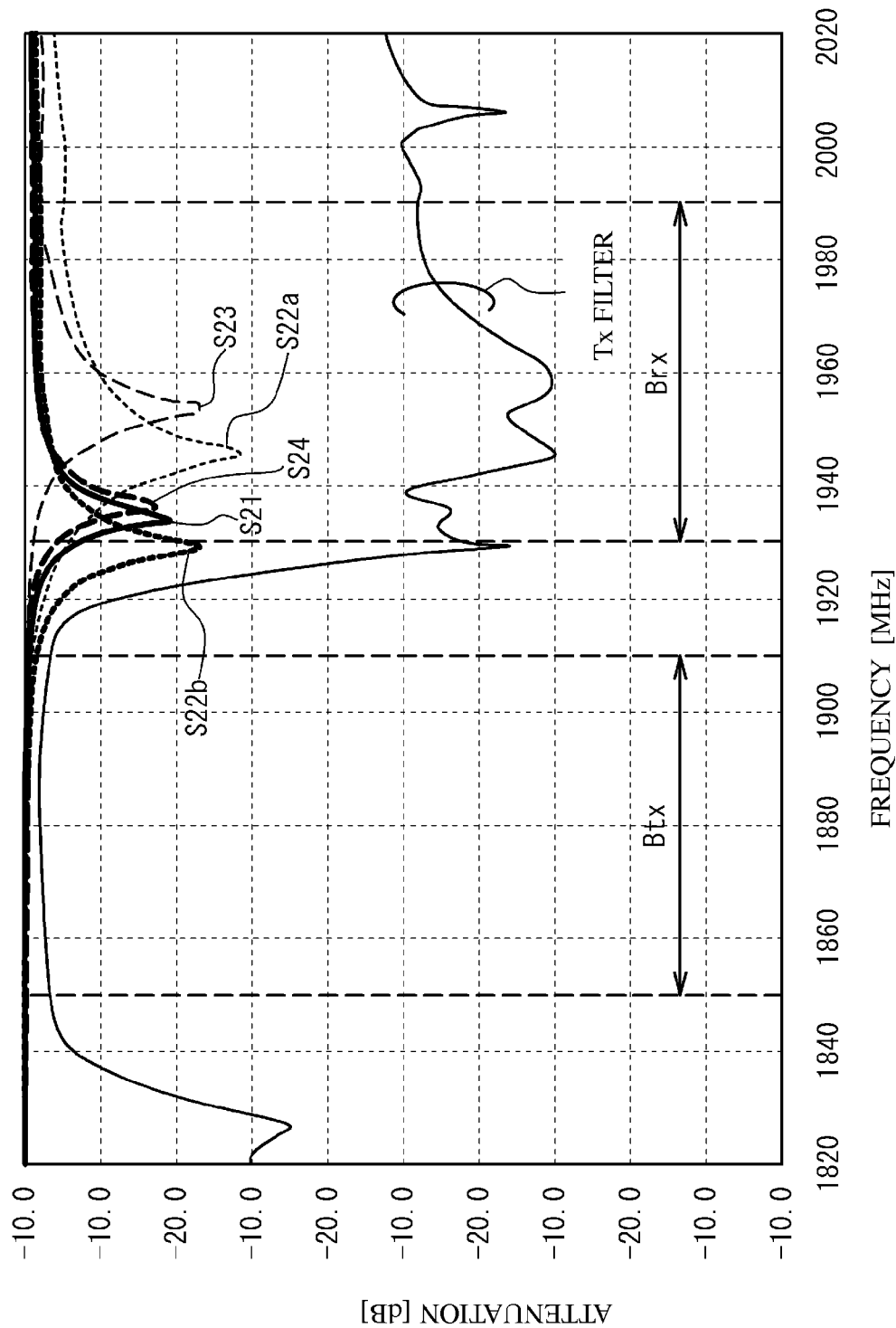
FIG. 34 is a diagram of a pass characteristic of a transmission filter of a duplexer in accordance with a fifth embodiment, and a pass characteristic of each series resonator.

FIG. 33 is a diagram of a pass characteristic of the transmission filter of the duplexer of the comparative example, and a pass characteristic of each series resonator. FIG. 34 is a diagram of a pass characteristic of the transmission filter of the fifth embodiment, and a pass characteristic of each series resonator. Referring to FIGS. 33 and 34, the anti-resonance frequency of the series resonator S24 of the comparative example is 1940 MHz, and the anti-resonance frequency of the series resonator S24 of the fifth embodiment is 1936 MHz. By changing the anti-resonance frequency of the series resonator S24, the degree of suppression of the transmission filter 20 in the reception band deteriorates. In order to correct this, according to the fifth embodiment, the anti-resonance frequency of the series resonator S22a is set so as to be 4 MHz lower than that of the comparative example.

Figure 35:
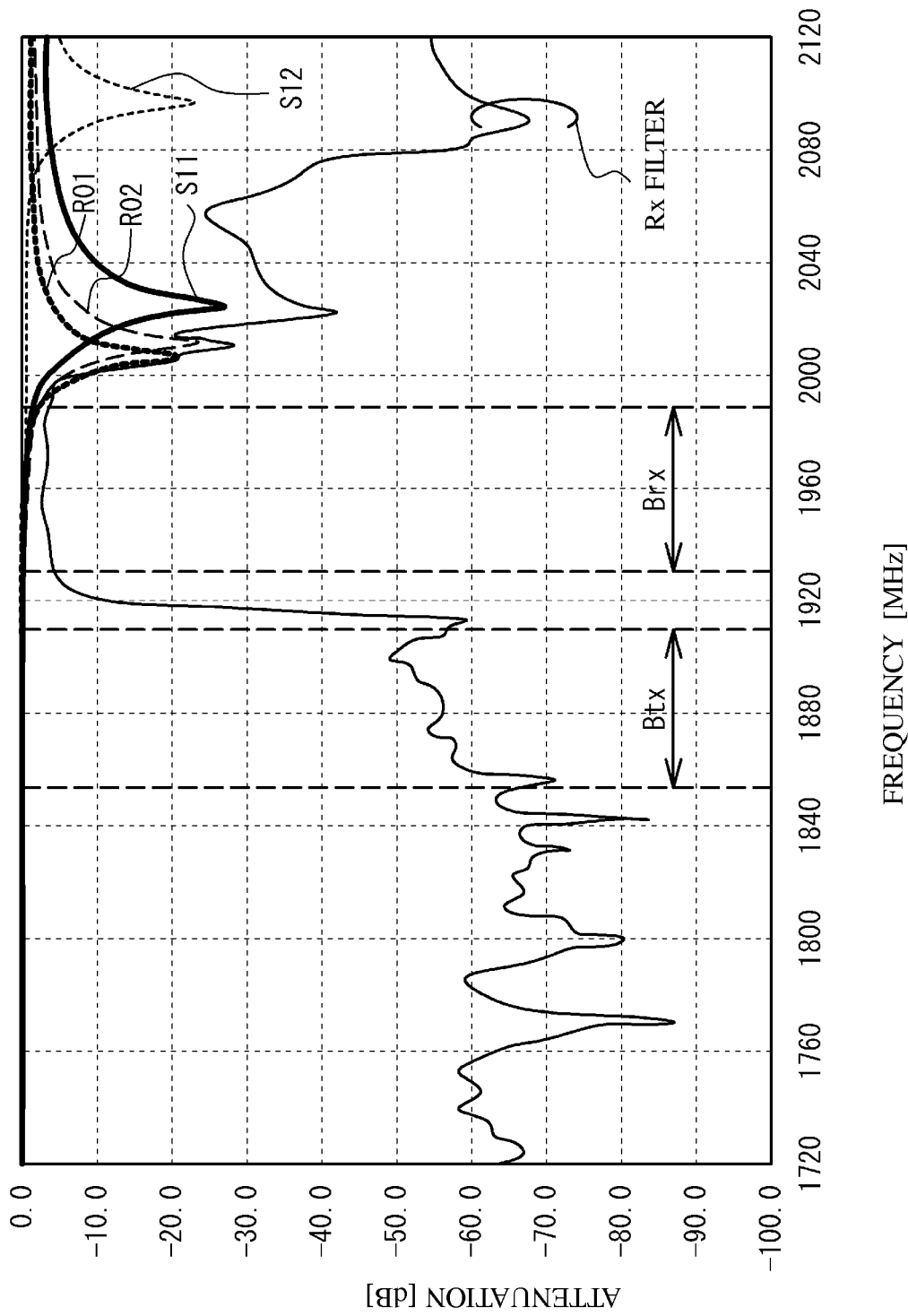
FIG. 35 is a diagram of a pass characteristic of a reception filter of the duplexer of the comparative example, and a pass characteristic of each series resonator.
Figure 36:
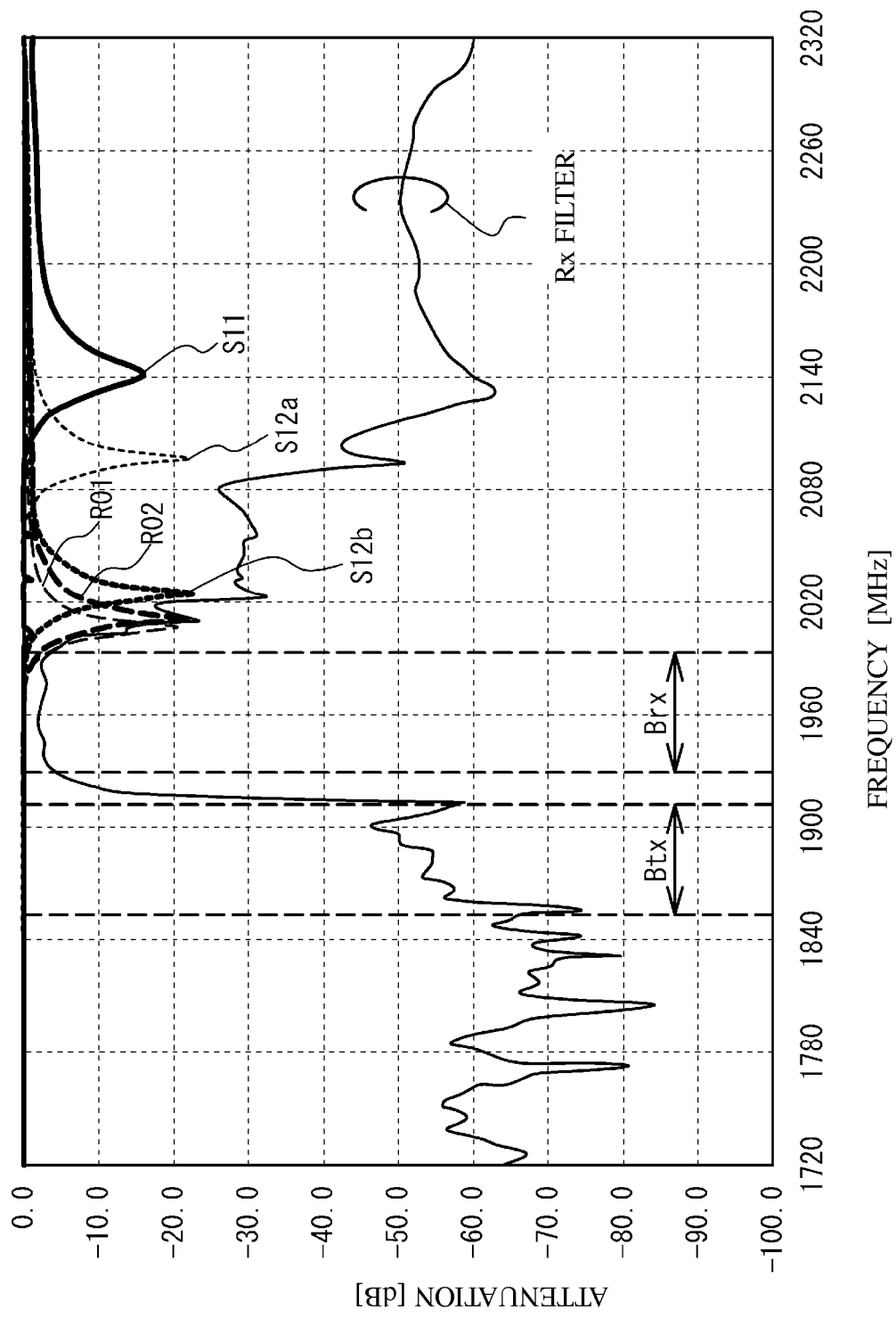
FIG. 36 is a diagram of a pass characteristic of a reception filter of the duplexer of the fifth embodiment, and a pass characteristic of each series resonator.

FIG. 35 is a diagram of a pass characteristic of the reception filter of the duplexer of the comparative example, and a pass characteristic of each series resonator. FIG. 36 is a diagram of a pass characteristic of the reception filter of the fifth embodiment, and a pass characteristic of each series resonator. Referring to FIGS. 35 and 36, the resonance frequency of the series resonator S11 of the comparative example is 1952 MHz, and the resonance frequency of the series resonator S11 of the fifth embodiment is 2070 MHz. This change of the resonance frequency of the series resonator S11 deteriorates the degree of suppression at the high-frequency side of the pass band of the reception filter 10. In order to correct this, according to the fifth embodiment, the resonance frequency of the series resonator S12b is set to 1952 MHz to which the series resonator S11 of the comparative example is set. The reason why the resonance frequency of the series resonator S12a is not changed but that of the series resonator S12b is changed is that the resonance frequency of the resonator that is farther away from the antenna terminal Tant and is not affected by non-linearity is made close to the pass band.

Figure 37:
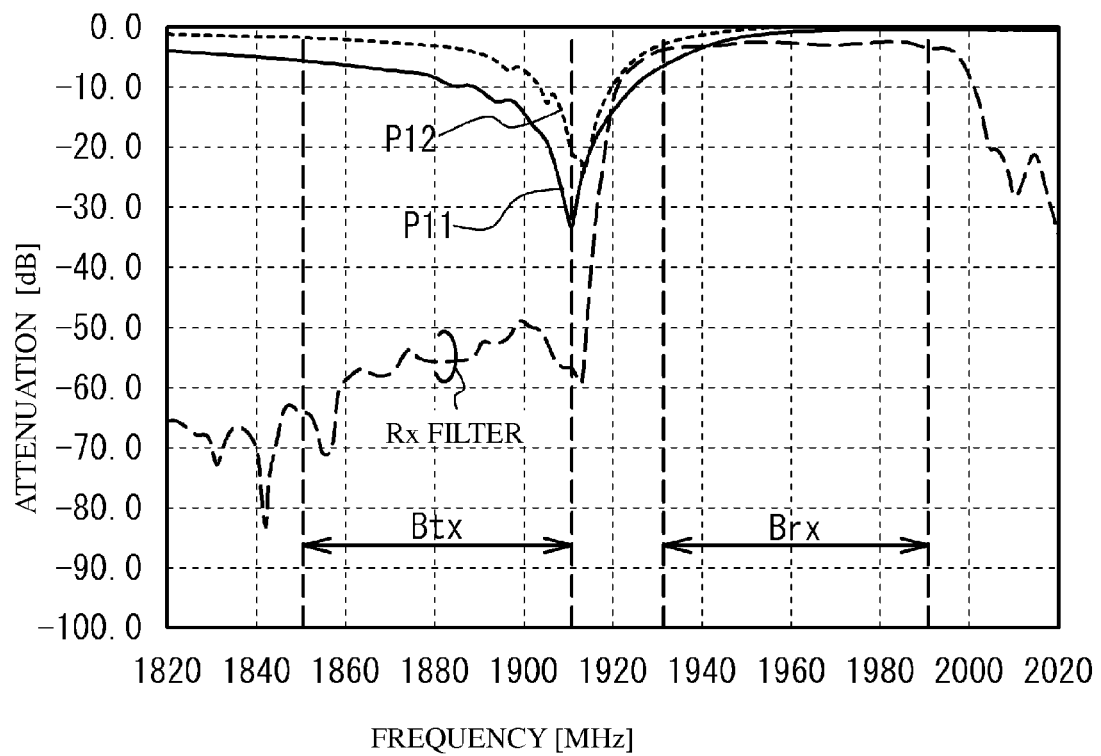
FIG. 37 is a diagram of the pass characteristic of the reception filter of the duplexer in accordance with the comparative example, and a pass characteristic of each parallel resonator.
Figure 38:
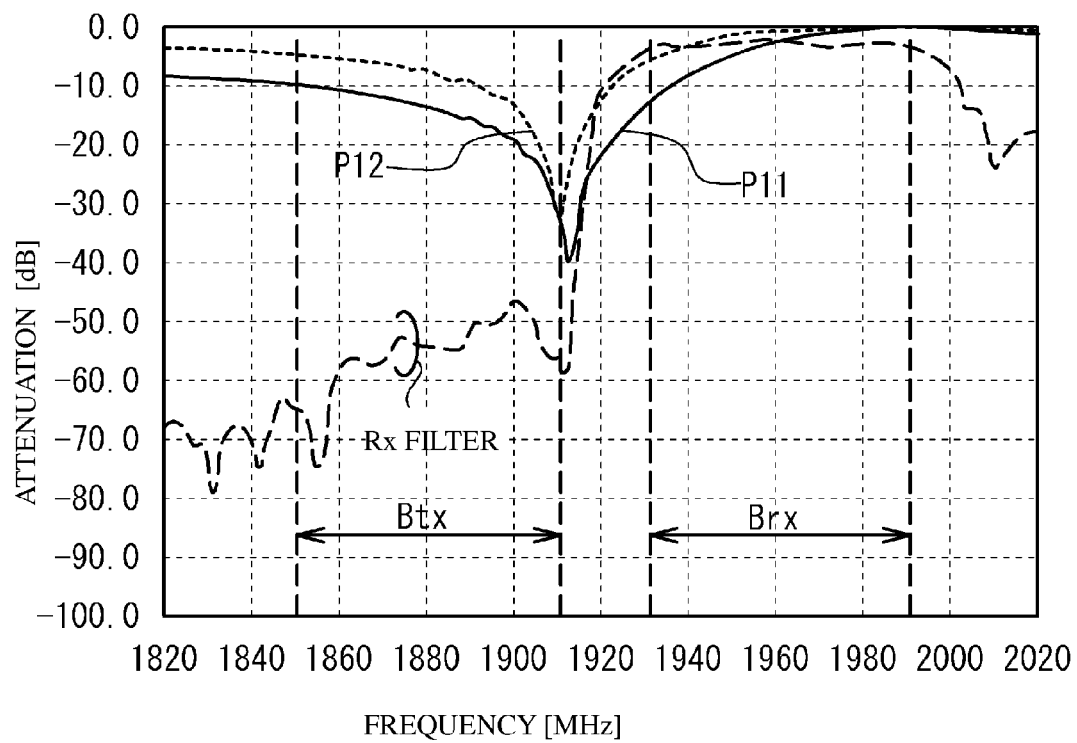
FIG. 38 is a diagram of the pass characteristic of the reception filter of the duplexer of the fifth embodiment, and a pass characteristic of each parallel resonator.

FIG. 37 is a diagram of a pass characteristic of the reception filter of the duplexer of the comparative example, and a pass characteristic of each parallel resonator. FIG. 38 is a diagram of a pass characteristic of the reception filter of the duplexer of the fifth embodiment, and a pass characteristic of each parallel resonator. Referring to FIGS. 37 and 38, the resonance frequency of the parallel resonator P11 of the comparative example is 1909 MHz (1904 MHz when the parasitic ground inductance is included), and the resonance frequency of the fifth embodiment is 1913 MHz (1908 MHz when the parasitic ground inductance is included). This change of the resonance frequency of the parallel resonator P11 deteriorates the degree of suppression of the reception filter 10 in the transmission band Btx. In order to correct this, the resonance frequency of the parallel resonator P12 of the fifth embodiment is 1909 MHz, which is equal to the resonance frequency P11 of the comparative example.

FIGS. 39A and 39B are plan views of transmission filter chips 78 of the comparative example and the fifth embodiment. Referring to FIGS. 39A and 39B, a metal film including aluminum as a main component is formed on a piezoelectric substrate 70, which may be lithium tantalate, for example. The metal film forms the resonators, pads 72 and interconnections. Bumps 74 are formed on the pads 72. The pads 72 include pads Ant connected to the antenna terminals, pads Tx connected to the transmission terminals, and pads Gnd connected to the ground. The resonators correspond to those in the circuits of FIGS. 32A and 32B. FIGS. 33 through 39B illustrate the results of simulations for designing the resonators.

Figure 40A:
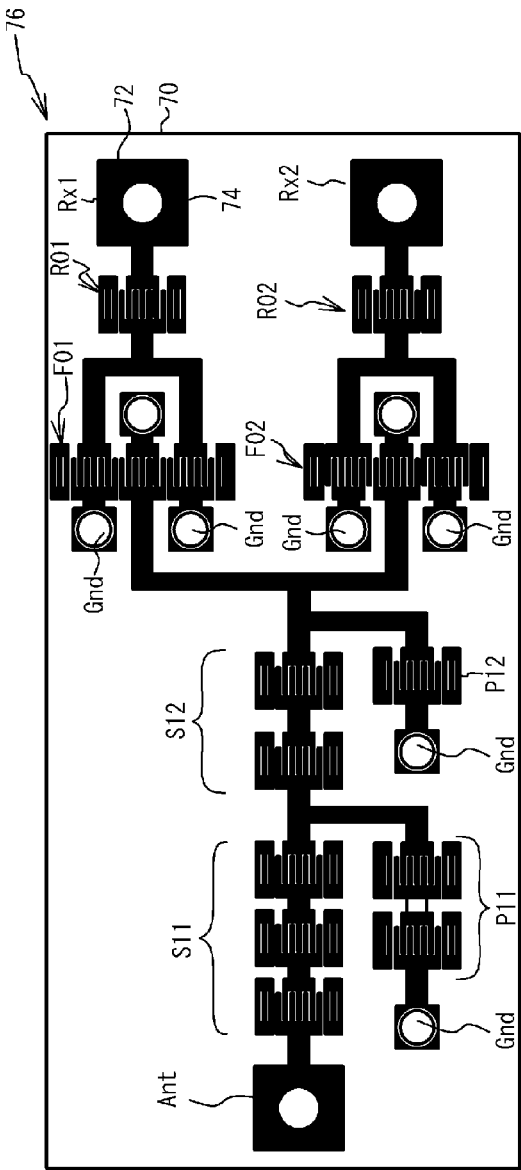
FIGS. 40A and 40B are plan views of reception filter chips of the comparative example and the fifth embodiment, respectively.
Figure 40B:
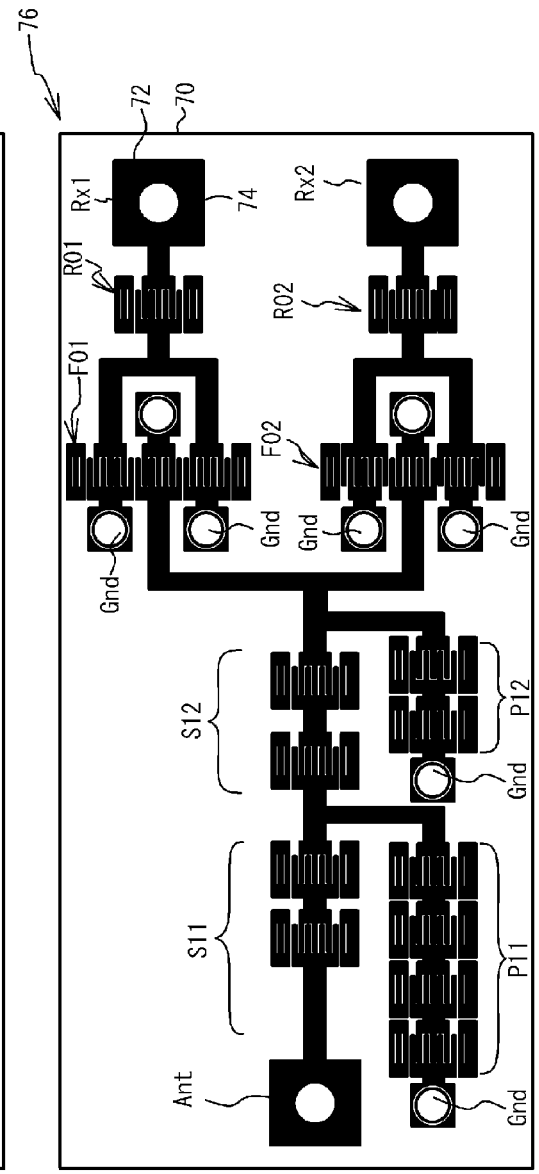

FIGS. 40A and 40B are plan views of reception filter chips 76 of the comparative example and the fifth embodiment. Referring to FIGS. 40A and 40B, a metal film including aluminum as a main component is formed on a piezoelectric substrate 70, which may be lithium tantalate, for example. The metal film forms the resonators, pads 72 and interconnections. Bumps 74 are formed on the pads 72. The pads 72 include pads Ant connected to the antenna terminals, pads Rx connected to the reception terminals, and pads Gnd connected to the ground. The resonators correspond to those in the circuits of FIGS. 32A and 32B.

Figure 41A:
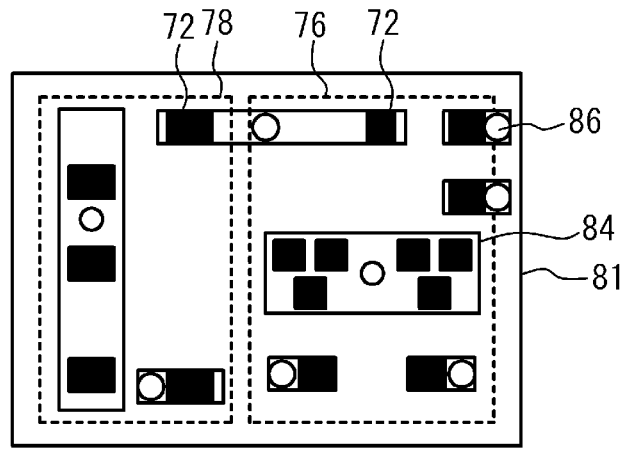
FIGS. 41A through 41C are plan views of layers stacked to form a multilayer substrate on which chips are mounted.
Figure 41B:
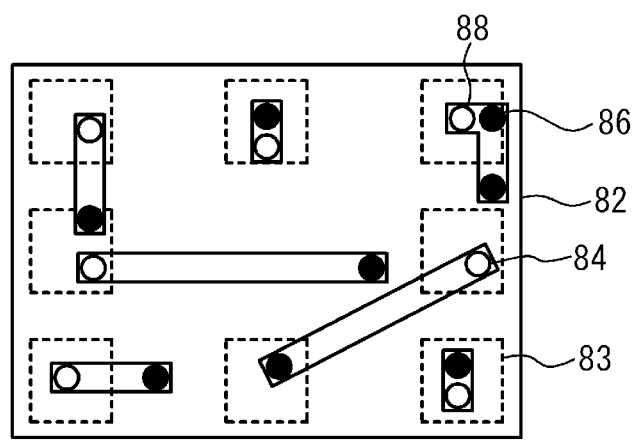
Figure 41C:
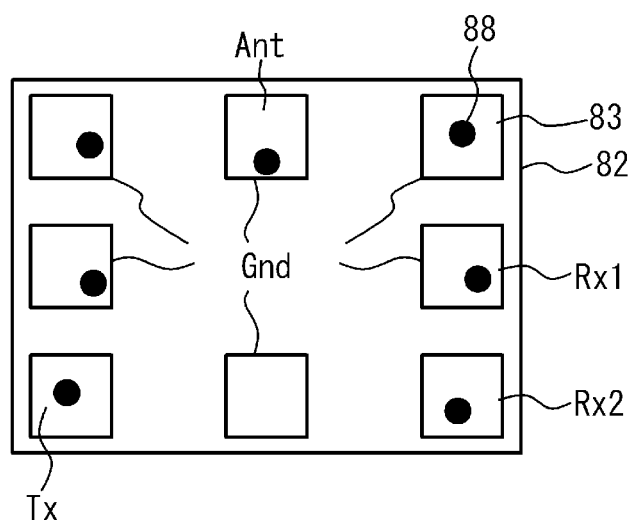

FIGS. 41A through 41C are plan views of layers that are stacked to form a multilayer substrate on which chips are mounted. FIG. 41A is a plan view of a die attach layer 81 on which the transmission filter chip 78 and the reception filter chip 76 are flip-chip mounted, in which the plan view is seen through the chips 76 and 78. The pads 72 of the chips 76 and 78 are illustrated. FIG. 41B is a plan view of a foot pad layer 82 having a lower surface on which foot pads 83 are formed. The foot pads 83 are depicted by broken lines. FIG. 41C is a view of the lower surface seen through the foot pad layer 82.

As illustrated in FIG. 41A, interconnections 84 made of a metal such as copper are formed on the upper surface of the die attach layer 81 made of an insulator such as ceramic. The pads 72 of the chips 76 and 78 are connected to the interconnections 84 via bumps. Vias 86 have holes that pass through the die attach layer 81 and are full of a metal.

As illustrated in FIG. 41B, interconnections 84 made of a metal such as copper are formed on the upper surface of the foot pad layer 82 made of an insulator such as ceramic. The vias 86 that pass through the die attach layer 81 are electrically connected to the interconnections 84. Vias 88 have holes that pass through the foot pad layer 82 and are full of a metal.

As illustrated in FIG. 41C, the vias 88 that pass through the foot pad layer 82 are electrically connected to the foot pads 83 made of a metal. The foot pads 83 include a foot pad Ant connected to the antenna terminal, a foot pad Tx connected to the transmission terminal, foot pads Rx1 and Rx2 connected to the reception terminals, and foot pads Gnd connected to the ground.

Figure 42:
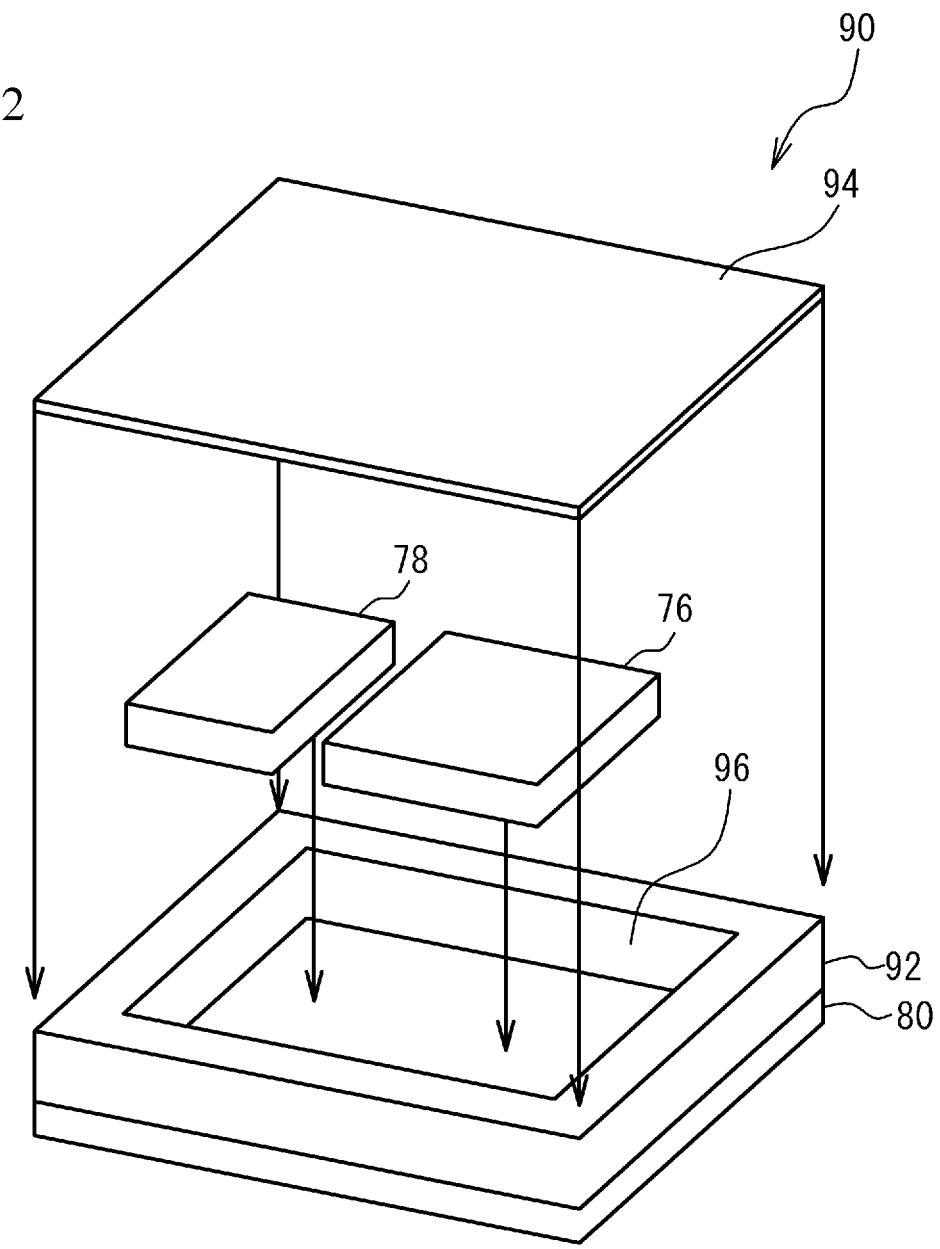
FIG. 42 is an exploded perspective view of a package.

FIG. 42 is an exploded perspective view of a package. Referring to FIG. 42, a package 90 includes a multilayer substrate 80 including the die attach layer and the foot pad layer, and a cavity layer 92 that is formed on the multilayer substrate 80 and is made of an insulator such as ceramic. The cavity layer 92 has a cavity 96 located in the center of the cavity layer 92. The chips 76 and 78 are flip-chip mounted on the multilayer substrate 80. A lid 94 made of a metal is fixedly attached on the top of the cavity layer 92. Thus, the chips 76 and 78 are hermetically sealed in the cavity layer 92 of the package 90.

Figure 43:
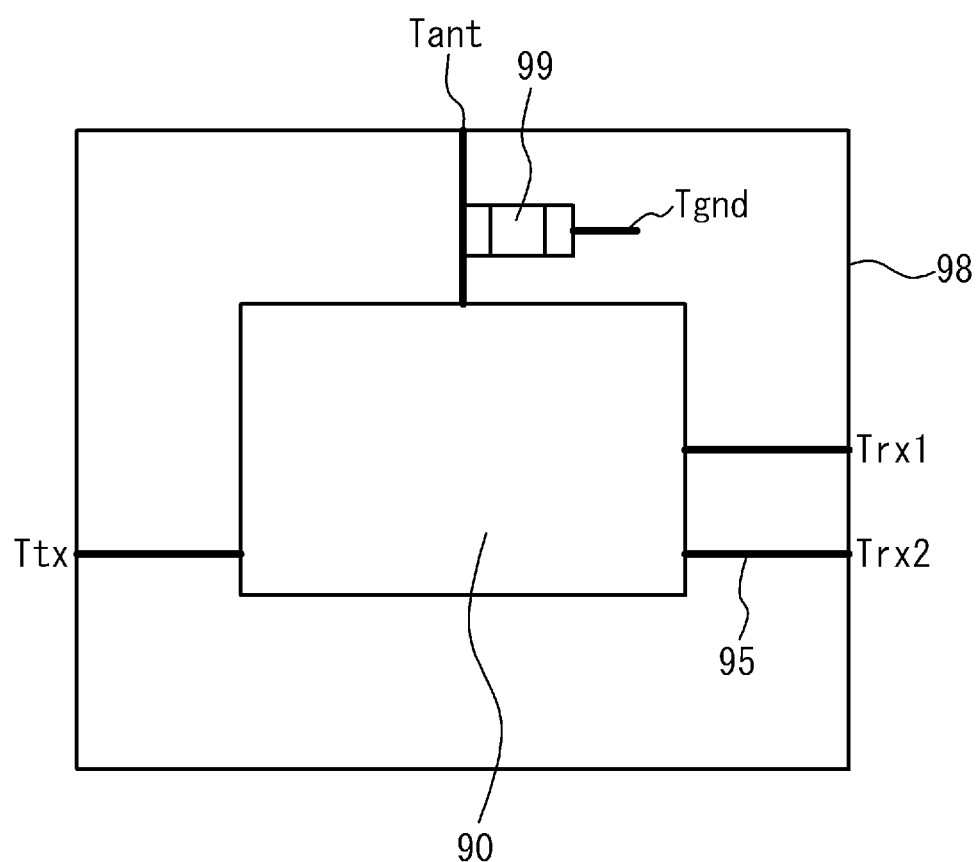
FIG. 43 is a plan view of a printed-circuit board.

FIG. 43 is a plan view of a printed-circuit board. A printed-circuit board 98 has interconnections 95 made of a metal formed on a surface thereof. The package 90 is surface-mounted on the printed-circuit board 98. The foot pad Ant of the package 90 is connected to the interconnection 95 connected to the antenna terminal Tant. A chip inductor 99 is surface-mounted on the printed-circuit board 98 so as to be connected between the interconnection 95 connected to the antenna terminal Tant and a ground terminal Tgnd. The foot pad Tx of the package 90 is connected to the interconnection 95 connected to the transmission terminal Ttx. The foot pads Rx1 and Rx2 of the package 90 are connected to the interconnections 95 respectively connected to the reception terminals Trx1 and Trx2.

Figure 44:
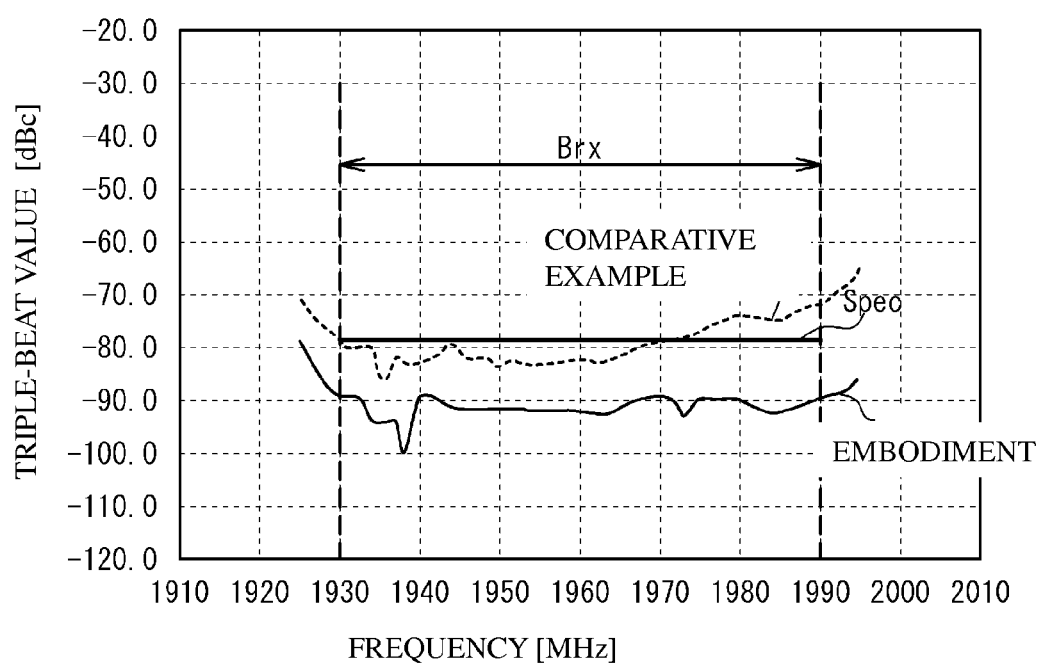
FIG. 44 is a diagram of measurement results of the triple-beat values of the duplexers of the comparative example and the fifth embodiment.

FIG. 44 is a diagram of the results of measurement of the triple-beat values of the comparative example and the fifth embodiment. In FIG. 44, a solid line indicates the fifth embodiment, and a broken line indicates the comparative example. In the duplexer of the comparative example, a part of the reception band Brx does not satisfy not greater than −79 dBc, which is the specification of the triple-beat value. In contrast, in the duplexer of the fifth embodiment, the triple-beat value is not greater than −79 dBc in the whole reception band Brx. The fifth embodiment improves the non-linearity, as compared with the comparative example.

Sixth Embodiment

A sixth embodiment is a duplexer in which the series resonator S11 of the reception filter 10 is replaced by a capacitor. According to the previously-described first embodiment, an increased resonance frequency of the series resonator S11 closest to the antenna terminal Tant in the reception filter 10 enhances the linearity. This means that the series resonator S11 hardly excites the acoustic waves in the transmission band Btx and the reception band Brx, and functions as a capacitor. Therefore, a replacement of the series resonator S11 with a capacitor improves the triple-beat value as well as the first embodiment or more.

Figure 45:
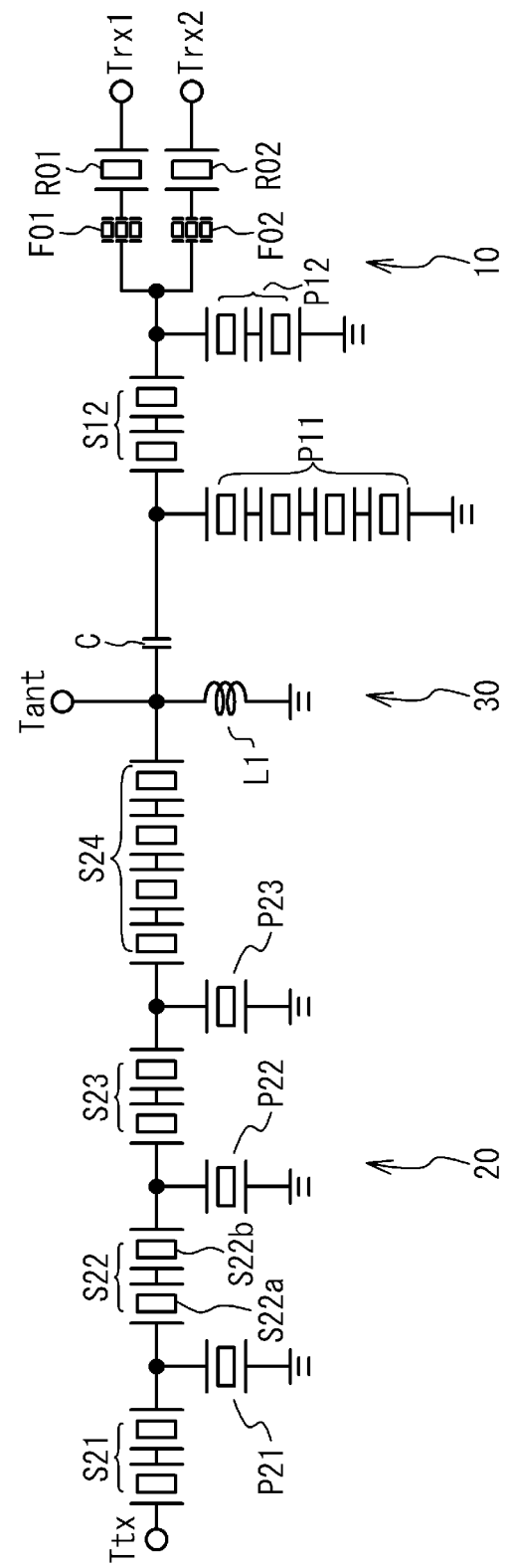
FIG. 45 is a circuit diagram of a duplexer in accordance with a sixth embodiment.

FIG. 45 is a circuit diagram of a duplexer in accordance with a sixth embodiment. The series resonator S11 of the fifth embodiment illustrated in FIG. 32B is replaced with a capacitor C. The other structures of the sixth embodiment are the same as those illustrated in FIG. 32B.

Figure 46:
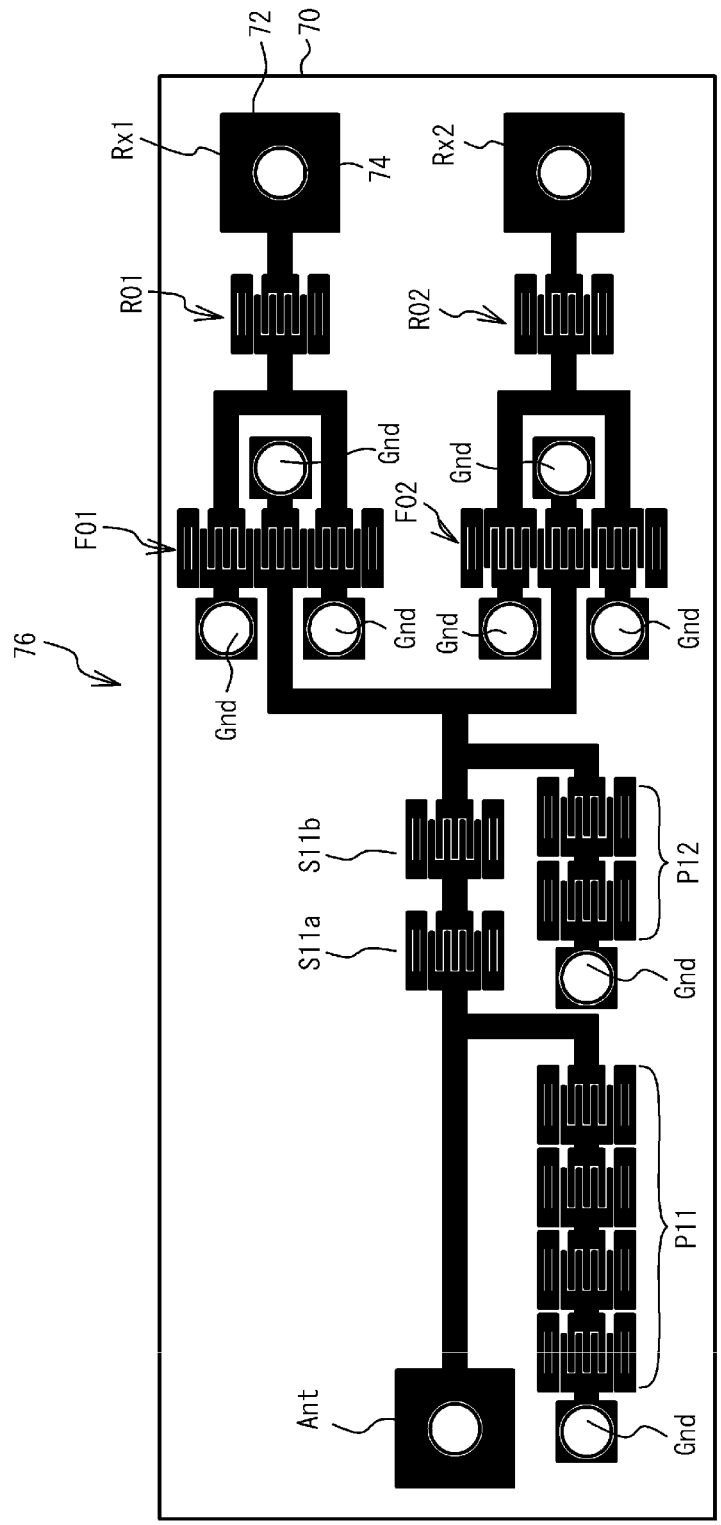
FIG. 46 is a plan view of a reception filter chip used in the sixth embodiment.

FIG. 46 is a plan view of a reception filter chip employed in the sixth embodiment. As compared with FIG. 40B of the fifth embodiment, the reception filter chip does not have the series resonator S11. The other structures in FIG. 46 are the same as those illustrated in FIG. 40B.

Figure 47A:
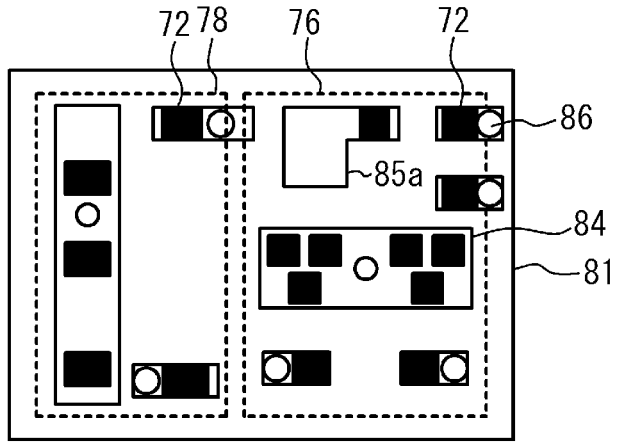
FIGS. 47A through 47C are plan views of layers stacked to form a multilayer substrate on which chips are mounted.
Figure 47B:
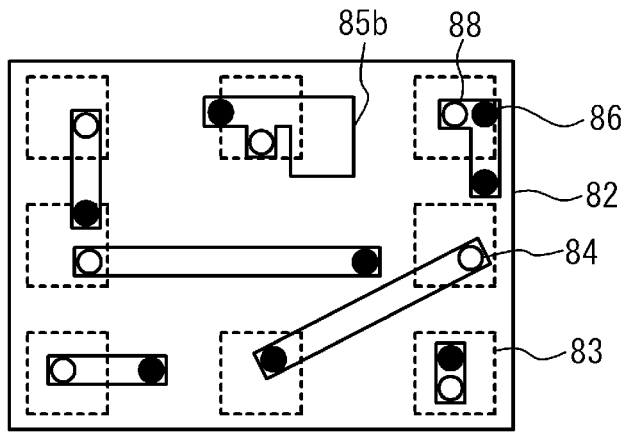
Figure 47C:
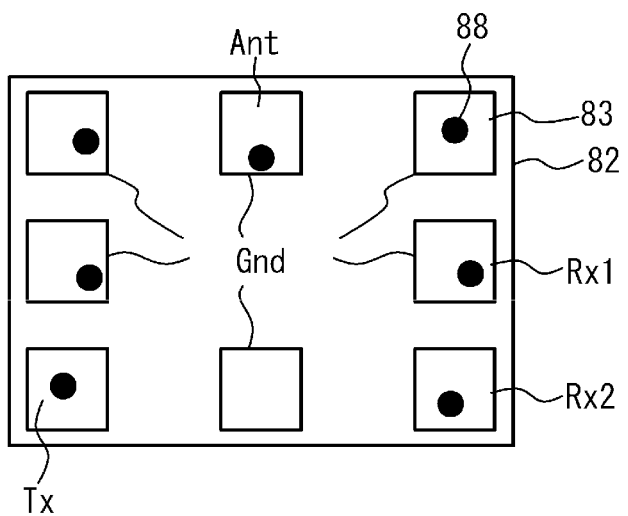

FIGS. 47A through 47C are plan views of a multilayer substrate on which chips are mounted. Referring to FIGS. 47A and 47B, an electrode 85a electrically connected to the pad Ant of the transmission filter chip 76 is formed on the upper surface of the die attach layer 81. An electrode 85b electrically connected to the foot pad Ant on the antenna side is formed on the upper surface of the foot pad layer 82. The dielectric formed into the die attach layer 81 between the electrodes 85a and 85b functions as a capacitor. The capacitor C is formed within the multilayer substrate 80. The capacitor C may be a chip capacitor. According to the sixth embodiment, the triple-beat value can be improved.

In the sixth and seventh embodiments, the transmission filter chip 76 and the reception filter chip 78 are mounted on the ceramic multilayer substrate. The chips 76 and 78 may be amounted on a ceramic package or a printed-circuit board. The chips 76 and 78 are not limited to the flip-chip mounting but may be face-up mounted. The transmission filter 20 and the reception filter 10 may be formed on a common chip instead of the separate chips.

The matching circuit 30 is not limited to the circuit using the inductor L1 but may be configured differently. For example, a capacitor may be connected between the antenna terminal and the reception filter. The inductor L1 is not limited to the chip inductor but may be an inductor formed within the package such as a multilayered ceramic package.

Seventh Embodiment

Figure 48:
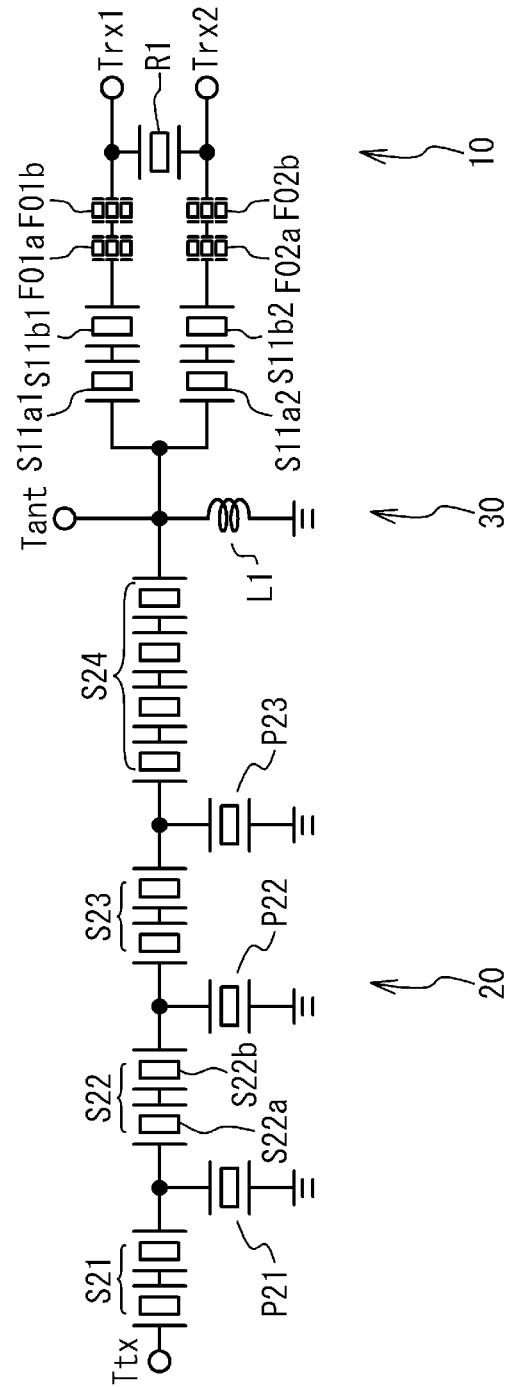
FIG. 48 is a circuit diagram of a duplexer in accordance with a seventh embodiment.

A seventh embodiment is an exemplary duplexer in which the multimode filter of the reception filter 10 is divided into parts. FIG. 48 is a circuit diagram of a duplexer of the seventh embodiment. Referring to FIG. 48, in the reception filter 10, series resonators S11a1 and S11b1 and multimode filters F01a and F01b are connected in series with each other between the antenna terminal Tant and the reception terminal Trx1. Similarly, series resonators S11a2 and S11b2 and multimode filters F02a and F02b are connected in series with each other between the antenna terminal Tant and the reception terminal Trx2. A resonator R1 is connected between the reception terminals Trx1 and Trx2. The configuration of the transmission filter 20 is the same as that of the fifth embodiment illustrated in FIG. 32B, and a description thereof is omitted here.

Figure 49:
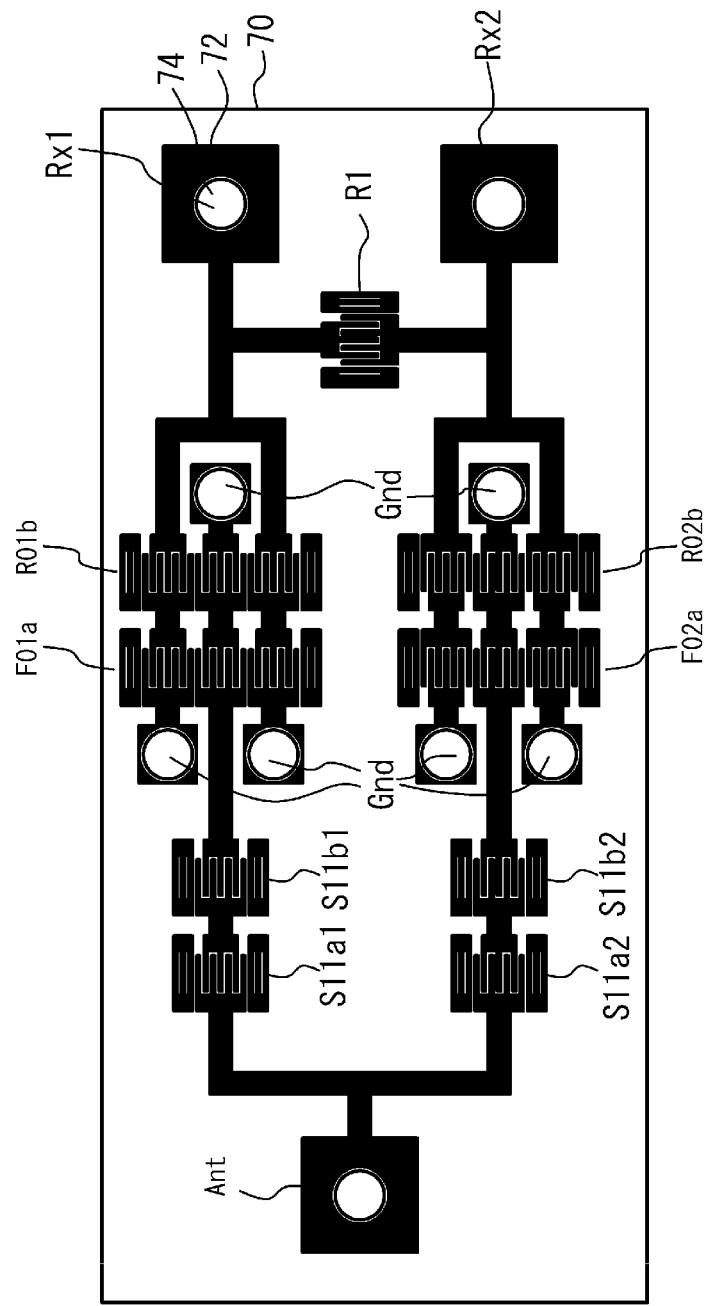
FIG. 49 is a plan view of a reception filter chip used in the seventh embodiment.

FIG. 49 is a plan view of a reception filter chip used in the seventh embodiment. A metal film is formed on the piezoelectric substrate 70. The metal film is formed into the resonators, pads 72 and interconnections. Bumps 74 are formed on the pads 72. The pads 72 include a pad Ant connected to the antenna terminal, pads Rx1 and Rx2 connected to the reception terminals, and pads Gnd connected to the ground. Each resonator corresponds to each resonator in FIG. 48. The other structures of the seventh embodiment are the same as those of the fifth embodiment. In the seventh embodiment, each of the series resonators closest to the antenna terminal Tant is divided into two. The resonance frequencies of the series resonators S11a1, S11b1, S11a2 and S11b2 are set considerably higher than the reception band Brx. Each of the multimode filters is divided into two. It is thus possible to improve the non-linearity.

As in the case of the seventh embodiment, the multimode filter is divided into two resonators connected in series with each other or more. The multimode filter may be included in at least one of the reception filter 10 and the transmission filter 20.

In the first through seventh embodiments, the multimode filter may be multimode filters cascaded. In the first through seventh embodiments, at least one of the reception filter 10 and the transmission filter 20 may be a ladder type filter, and both of the filters 10 and 20 may be ladder type filters.

The aforementioned first through seventh embodiments are duplexers suitable for the North America PCS in which the transmission band Btx is 1850 MHz to 1910 MHz, and the reception band Brx is 1930 MHz to 1990 MHz. Even in a case where the frequency ranges of the transmission band Btx and the reception band Brx change, the frequencies are merely changed analogously and the triple-beat value hardly changes. Therefore, the first through seventh embodiments may be suitably applied to a duplexer having different frequency ranges of the transmission band Btx and the reception band Brx. For example, the first through seventh embodiments may be applied to a duplexer for a cellular system having a transmission band of 824 MHz to 849 MHz and a reception band of 869 MHz to 894 MHz. The above embodiments may be applied to UMTS having a transmission band of 1850.48 to 1909.52 MHz and a reception band of 1930.48 to 1989.52 MHz, CDMA having a transmission band of 1850.625 to 1909.375 MHz and a reception band of 1930.48 to 1989.52 MHz, or Band25 having a transmission band of 1850 to 1915 MHz and a reception band of 1930 to 1995 MHz.

In the first through seventh embodiments, the resonator closest to the antenna terminal Tant in the reception filter 10 is not limited to the series resonator but may be a parallel resonator. In order to obtain the advantages of the first embodiment more effectively, it is preferable that the resonator closest to the antenna terminal Tant in the reception filter 10 is the series resonator. Similarly, the resonator closest to the antenna terminal Tant in the transmission filter 20 is not limited to the series resonator but may be a parallel resonator. In order to obtain the advantages of the second embodiment more effectively, it is preferable that the resonator closes to the antenna terminal Tant in the transmission filter 20 is the series resonator.

In the first through seventh embodiments, the resonators are not limited to the surface acoustic wave resonators, but may be Love-wave resonators, boundary acoustic wave resonators or piezoelectric thin-film resonators. Even when the resonators are of any type, the non-linearity can be improved.

The present invention is not limited to the specifically described embodiments, but may include other embodiments and variations without departing from the scope of the claimed invention.

What is claimed is:

1. A duplexer comprising:
a reception filter that is connected between a reception terminal and an antenna terminal and includes one or a plurality of series resonators that are acoustic wave resonators; and
a transmission filter that is connected between a transmission terminal and the antenna terminal and includes one or a plurality of acoustic wave resonators,
a resonance frequency of a first series resonator that is one of the one or the plurality of series resonators and is closest to the antenna terminal in the reception filter being higher than an upper limit frequency of a reception band of the reception filter,
wherein the first series resonator closest to the antenna terminal in the reception filter is divided into at least two resonators connected in series with each other, and an average resonance frequency of the at least two resonators is higher than 103% of the upper limit frequency of the reception band.

2. The duplexer according to claim 1, wherein at least one of the reception filter and the transmission filter includes a multimode acoustic wave filter.

3. The duplexer according to claim 1, wherein the reception filter includes one or a plurality of parallel resonators that are acoustic wave resonators, and a resonance frequency of a first parallel resonator that is one of the one or the plurality of parallel resonators and is closest to the antenna terminal in the reception filter and that includes a parasitic ground inductance is equal to or higher than 99.8% of an upper limit frequency of a transmission band of the transmission filter.

4. The duplexer according to claim 3, wherein the resonance frequency of the first parallel resonator that is closest to the antenna terminal and includes the parasitic ground inductance is equal to or higher than the upper limit frequency of the transmission band.

5. The duplexer according to claim 1, wherein the reception filter includes one or a plurality of parallel resonators that are acoustic wave resonators, and a first parallel resonator that is one of the one or the plurality of parallel resonators and is closest to the antenna terminal in the reception filter is divided into at least two resonators in series, a resonance frequency of at least one of the at least two resonators being equal to or higher than an upper limit frequency of a transmission band of the transmission filter.

6. The duplexer according to claim 1, wherein the reception filter includes one or a plurality of parallel resonators that are acoustic wave resonators, and a first parallel resonator that is one of the one or the plurality of parallel resonators and is closest to the antenna terminal in the reception filter is divided into at least two resonators in series, an average resonance frequency of the at least two resonators that include a parasitic ground inductance being equal to or higher than 99.8% of an upper limit frequency of a transmission band of the transmission filter.

7. The duplexer according to claim 1, wherein the average resonance frequency of the at least two resonators that include a parasitic ground inductance is equal to or higher than the upper limit frequency of the transmission band of the transmission filter.

8. The duplexer according to claim 1, wherein the reception filter includes a plurality of parallel resonators that are acoustic wave resonators, and one of the plurality of parallel resonators that is closest to the antenna terminal in the reception filter is divided into at least two resonators in series, a resonance frequency of at least one of the at least two resonators in series being the highest among the plurality of parallel resonators in the reception filter.

9. The duplexer according to claim 1, wherein the reception filter includes a plurality of parallel resonators that are acoustic wave resonators, and one of the plurality of parallel resonators that is closest to the reception terminal in the reception filter is not divided, a resonance frequency of the one of the plurality of parallel resonators that is closest to the reception terminal and includes a parasitic ground inductance being the lowest among the plurality of parallel resonators in the reception filter.

10. The duplexer according to claim 1, wherein the transmission filter includes one or a plurality of series resonators, and a first series resonator that is one of the one or the plurality of series resonators and is closest to the antenna terminal is divided into at least two resonators in series, and an anti-resonance frequency of at least one of the at least two resonators in series being equal to or higher than 100.1% of a lower limit frequency of the reception band and being equal to or lower than 100.4% thereof.

11. The duplexer according to claim 1, wherein the transmission filter includes a plurality of series resonators, and a first series resonator that is one of the plurality of series resonators and is closest to the antenna terminal is divided into at least two resonators in series, and an anti-resonance frequency of at least one of the at least two resonators in series being the lowest among the plurality of series resonators.

12. The duplexer according to claim 1, wherein the transmission filter includes a plurality of series resonators, and a first series resonator that is one of the plurality of series resonators and is closest to the antenna terminal is divided into at least two resonators in series, and an anti-resonance frequency of at least one of the at least two resonators in series being in the reception band of the reception filter.

13. The duplexer according to claim 1, wherein the transmission filter includes a plurality of series resonators, and a second series resonator that is one of the plurality of series resonators and is next to a first series resonator that is another one of the plurality of series resonators and is closest to the antenna terminal is divided into at least two resonators in series, and an anti-resonance frequency of at least one of the at least two resonators in series is equal to or lower than 102.1% of a lower limit frequency of the reception band.

14. A duplexer, comprising:
a reception filter that is connected between a reception terminal and an antenna terminal and includes one or a plurality of series resonators that are acoustic wave resonators; and
a transmission filter that is connected between a transmission terminal and the antenna terminal and includes one or a plurality of acoustic wave resonators,
a resonance frequency of a first series resonator that is one of the one or the plurality of series resonators and is closest to the antenna terminal in the reception filter being higher than an upper limit frequency of a reception band of the reception filter,
wherein the first series resonator closest to the antenna terminal in the reception filter is divided into at least two resonators connected in series with each other, and an average resonance frequency of the at least two resonators is higher than the upper limit frequency of the reception band, and
wherein the transmission filter includes a plurality of series resonators, and a first series resonator that is one of the plurality of series resonators and is closest to the antenna terminal is divided into at least two resonators in series, and an anti-resonance frequency of at least one of the at least two resonators in series being not the highest among the plurality of series resonators.

15. A duplexer comprising:
a reception filter that is connected between a reception terminal and an antenna terminal and includes one or a plurality of series resonators that are acoustic wave resonators; and
a transmission filter that is connected between a transmission terminal and the antenna terminal and includes one or a plurality of acoustic wave resonators,
a resonance frequency of a first series resonator that is one of the one or the plurality of series resonators and is closest to the antenna terminal in the reception filter being higher than an upper limit frequency of a reception band of the reception filter,
wherein the first series resonator closest to the antenna terminal in the reception filter is divided into at least two resonators connected in series with each other, and an average resonance frequency of the at least two resonators is higher than the upper limit frequency of the reception band, and
wherein the transmission filter includes a plurality of series resonators, and a first series resonator that is one of the plurality of series resonators and is closest to the antenna terminal is divided into at least two resonators in series, and an anti-resonance frequency of at least one of the at least two resonators in series being not the lowest among the plurality of series resonators.

* * * * *